United States Patent
Nakasaka et al.

(10) Patent No.: US 8,582,291 B2
(45) Date of Patent: Nov. 12, 2013

(54) POWER CONVERSION APPARATUS

(75) Inventors: Akira Nakasaka, Anjo (JP); Kenichi Oohama, Ichinomiya (JP)

(73) Assignee: Denso Corporation, Kariya (JP)

(*) Notice: Subject to any disclaimer, the term of this patent is extended or adjusted under 35 U.S.C. 154(b) by 69 days.

(21) Appl. No.: 13/021,926

(22) Filed: Feb. 7, 2011

(65) Prior Publication Data
US 2011/0194247 A1   Aug. 11, 2011

(30) Foreign Application Priority Data

Feb. 5, 2010   (JP) .................................. 2010-024557
Oct. 29, 2010   (JP) .................................. 2010-244596

(51) Int. Cl.
*H05K 7/20*   (2006.01)

(52) U.S. Cl.
USPC ...... 361/679.47; 361/677; 361/689; 257/707; 257/714; 257/721; 363/141

(58) Field of Classification Search
USPC ............. 361/679.46–679.47, 679.52–679.54, 361/688–690, 698–704, 707, 715–718, 725, 361/728, 763–764, 821, 829–832
See application file for complete search history.

(56) References Cited

U.S. PATENT DOCUMENTS

| | | | |
|---|---|---|---|
| 5,258,888 A | 11/1993 | Korinsky | |
| 5,497,289 A | 3/1996 | Sugishima et al. | |
| 5,631,821 A | 5/1997 | Muso | |
| 6,166,937 A | 12/2000 | Yamamura et al. | |
| 7,248,478 B2 | 7/2007 | Inoue | |
| 7,542,318 B2 | 6/2009 | Otsuka et al. | |
| 7,663,886 B2 | 2/2010 | Aoki et al. | |
| 8,149,577 B2 | 4/2012 | Tang et al. | |
| 8,189,324 B2 | 5/2012 | Folts | |
| 8,213,179 B2 * | 7/2012 | Yoshida et al. | ............... 361/699 |
| 2003/0133319 A1 | 7/2003 | Radosevich et al. | |

(Continued)

FOREIGN PATENT DOCUMENTS

| | | |
|---|---|---|
| CN | 1906840 | 1/2007 |
| JP | 2002-043782 | 2/2002 |

(Continued)

OTHER PUBLICATIONS

Japanese Office Action dated Jan. 10, 2012, issued in corresponding Japanese Application No. 2010-244594, with English translation.

(Continued)

*Primary Examiner* — Courtney Smith
(74) *Attorney, Agent, or Firm* — Nixon & Vanderhye P.C.

(57) ABSTRACT

In a power conversion apparatus, electronic components and a cooler are integrated in a frame as an internal unit. The internal unit is fixed within a case through the frame. The frame has such a shape that the electronic components are surrounded by the frame, and includes a first wall section, and second and third wall sections extending from both sides of the first wall section. The cooler includes a coolant introduction tube and a coolant discharge tube. The coolant introduction tube and the coolant discharge tube project outward from to the frame. The first to third wall sections include a support wall section supporting at least one of the coolant introduction tube and the coolant discharge tube, and a frame wall section not supporting the coolant introduction tube and the coolant discharge tube. The thickness of the support wall section is larger than the thickness of the frame wall section.

23 Claims, 35 Drawing Sheets

(56) References Cited

U.S. PATENT DOCUMENTS

| | | | |
|---|---|---|---|
| 2006/0096299 A1* | 5/2006 | Mamitsu et al. | 62/3.2 |
| 2006/0232939 A1* | 10/2006 | Inoue | 361/704 |
| 2006/0243422 A1* | 11/2006 | Sakai et al. | 165/80.4 |
| 2007/0002594 A1 | 1/2007 | Otsuka et al. | |
| 2007/0076355 A1* | 4/2007 | Oohama | 361/676 |
| 2007/0165376 A1 | 7/2007 | Bones et al. | |
| 2007/0215316 A1* | 9/2007 | Saito et al. | 165/41 |
| 2007/0295715 A1 | 12/2007 | Saka et al. | |
| 2008/0158824 A1 | 7/2008 | Aoki et al. | |
| 2008/0205107 A1 | 8/2008 | Hattori et al. | |
| 2009/0040724 A1 | 2/2009 | Nishikimi et al. | |
| 2009/0241575 A1* | 10/2009 | Jadric et al. | 62/259.1 |
| 2009/0251859 A1* | 10/2009 | Harada et al. | 361/689 |
| 2010/0091464 A1 | 4/2010 | Ohnishi et al. | |
| 2011/0194246 A1 | 8/2011 | Nakasaka et al. | |
| 2011/0194248 A1 | 8/2011 | Nakasaka et al. | |
| 2011/0194249 A1 | 8/2011 | Nakasaka et al. | |
| 2011/0194322 A1 | 8/2011 | Nakasaka et al. | |
| 2012/0039039 A1 | 2/2012 | Nishikimi et al. | |
| 2012/0170217 A1 | 7/2012 | Nishikimi et al. | |

FOREIGN PATENT DOCUMENTS

| | | |
|---|---|---|
| JP | P2002-095268 A | 3/2002 |
| JP | 2005-516570 | 6/2005 |
| JP | P2005-333008 A | 12/2005 |
| JP | P2006-174572 A | 6/2006 |
| JP | P2007-014085 A | 1/2007 |
| JP | P2007-036214 A | 2/2007 |
| JP | P2008-166358 A | 7/2008 |
| JP | 2008-215089 | 9/2008 |
| JP | 4225310 | 12/2008 |
| JP | 2009-044891 | 2/2009 |
| JP | P2009-130964 A | 6/2009 |
| JP | 2009-159767 | 7/2009 |
| JP | 2009-261125 | 11/2009 |
| JP | P2009-266986 A | 11/2009 |
| JP | P2010-010505 A | 1/2010 |

OTHER PUBLICATIONS

Nakasaka et al, U.S. Appl. No. 13/021,931, filed Feb. 7, 2011.
Nakasaka et al, U.S. Appl. No. 13/021,934, filed Feb. 7, 2011.
Nakasaka et al, U.S. Appl. No. 13/021,937, filed Feb. 7, 2011.
Nakasaka et al, U.S. Appl. No. 13/021,948, filed Feb. 7, 2011.
Official Action dated Aug. 6, 2012, issued in copending U.S. Appl. No. 13/021,934 of Nakasaka, filed Feb. 7, 2011.
Official Action dated Aug. 1, 2012, issued in copending U.S. Appl. No. 13/021,948 of Nakasaka, filed Feb. 7, 2011.
Japanese Office Action dated Jun. 26, 2012, issued in corresponding Japanese Application No. 2010-244592, with English translation.
Japanese Office Action dated Jun. 26, 2012, issued in corresponding Japanese Application No. 2010-244595, with English translation.
Office Action (2 pages) dated Jan. 8, 2013 issued in corresponding Japanese Application No. 2010-244592 and English translation (2 pages).
Official Action dated (13 pages) Jan. 31, 2013, issued in copending U.S. Appl. No. 13/021,931 of Nakasaka, filed Feb. 7. 2011.
Official Action dated (7 pages) Feb. 8, 2013, issued in copending U.S. Appl. No. 13/021,934 of Nakasaka, filed Feb. 7, 2011.
Official Action dated (7 pages) Feb. 7, 2013, issued in copending U.S. Appl. No. 13/021,948 of Nakasaka, filed Feb. 7, 2011.
Office Action issued in Chinese Patent Appl. 201110036400.4 on Mar. 18, 2013 along with English Language Translation.
Office Action issued in Japanese Patent Appl. No. 2010-244595 on Jan. 8, 2013, with an English Language Translation.
Office Action dated Mar. 28, 2013, issued in co-pending U.S. Appl. No. 13/021,937.
Office Action issued in U.S. Appl 13/021,934 on May 23, 2013.
Office Action issued in U.S. Appl 13/021,948 on May 23, 2013.
Office Action issued in Japanese Patent Appl 2010-244595 dated Jul. 9, 2013 with English Language Translation of thereof.

* cited by examiner

POWER CONVERSION APPARATUS

CROSS-REFERENCE TO RELATED APPLICATION

This application is based on and claims the benefit of priority from earlier Japanese Patent Applications No. 2010-24557 filed Feb. 5, 2010, and No. 2010-244596 filed Oct. 29, 2010, the descriptions of which are incorporated herein by reference.

BACKGROUND

1. Technical Field

The present invention relates to a power conversion apparatus in which electronic components configuring a power conversion circuit and a cooler for cooling at least part of the electronic components are housed in its case.

2. Related Art

An electric vehicle or a hybrid vehicle is equipped with a power conversion apparatus such as an inverter or a converter to convert source power into driving power for a drive motor. As shown in FIG. 41, such a power conversion apparatus 9 includes various electronic components including semiconductor modules 921 each incorporating therein switching elements, and a capacitor 922. The electronic components constitute a power conversion circuit. For example, refer to Japanese patent Application Laid-Open No. 2009-159767. To prevent the temperature of the semiconductor modules 921 from increasing excessively, a cooler 93 is disposed in contact with the semiconductor modules 921.

The power conversion apparatus 9 further includes a control circuit board 96 on which a control circuit for controlling the semiconductor modules 921 is formed.

The electronic components including the semiconductor modules 921, the cooler 93 and the control circuit board 96 are fixed to a case 94, and sealed within the case 94.

Accordingly, if the case 94 is not rigid enough, the electronic components fixed to the case 94 may vibrate considerably, causing wire breakage, or failure in the electronic components due to external force applied thereto.

When the power conversion apparatus 9 is located in an engine compartment of a vehicle, the case 94 may expand or contract considerably due to abrupt temperature change. In this case, since the components are fixed directly to the case 94, they may fail due to thermal stress applied to them.

The case 94 of the power conversion apparatus 9 is constituted of a case body 940, and bottom and top lids 941 and 942. Accordingly, the case 94 has two large sealing surfaces required to be water-tight. Accordingly, since the case 94 has to be provided with many sealing members, the power conversion apparatus 9 is disadvantageous in manufacturing cost.

In addition, the maintainability of the power conversion apparatus 9 is not good enough in this case, because both the bottom lid 941 and the top lid 942 have to be removed for maintenance work.

It might be possible that the case 94 has only one sealing surface, if the case 94 is constituted of a bottomed case body and a top lid. However, in this case, the maintainability and rigidity of the case 94 may become worse.

Further, since vibration of the electronic components, such as capacitor 922, directly fixed to the case 94 can transmit to a vehicle body through the case 94, unpleasant vibration noise may occur in the vehicle cabin. Conversely, since vibration of the engine can transmit to the electronic components through the case 94, wire breakage or fault may occur.

Incidentally, to mount the power conversion apparatus on a vehicle, it is necessary to change its external shape on a vehicle type to vehicle type basis, because the position of connecting means of the power conversion apparatus for connection with external devices has to be adjusted depending on the shape and structure of a space (engine compartment, for example) in which the power conversion apparatus is disposed. Accordingly, the power conversion apparatus of the type in which the electronic components and the cooler are directly assembled to the case needs to be changed in its internal layout. This makes it difficult to improve the productivity, and to prevent reducing the manufacturing cost.

The cooler 93 includes a coolant introduction tube introducing coolant into the cooler 93 and a coolant discharge tube discharging the coolant (not shown). The coolant introduction tube and the coolant discharge tube are required to project from the power conversion apparatus 9 and to be connected to coolant pipes installed in an engine compartment or the like (mounting portion) of a vehicle. Hence, positioning of the power conversion apparatus 9 to the mounting portion is required to be accurately performed. However, when the positions or the projecting directions of the coolant introduction tube and the coolant discharge tube are displaced with reference to the power conversion apparatus 9 (case 94), the coolant introduction tube and the coolant discharge tube are difficult to connect to the coolant pipes in the engine compartment regardless of the accurate positioning of the power conversion apparatus 9 to the mounting portion. In addition, when forcedly connecting the coolant introduction tube and the coolant discharge tube to the coolant pipes, the coolant introduction tube and the coolant discharge tube interfere with the components around the coolant pipes, which makes it difficult to mount the power conversion apparatus 9.

SUMMARY

An embodiment provides a power conversion apparatus which is capable of reducing an external force applied to its electronic components while improving the rigidity of its case, and which is excellent in maintainability, can be effectively mounted, and can be manufactured at low cost.

As an aspect of the embodiment, a power conversion apparatus includes: electronic components configuring a power conversion circuit; a cooler for cooling at least part of the electronic components; and a case housing the electronic components and the cooler; wherein the at least part of the electronic components and the cooler are fixed to and integrated in a frame as an internal unit, the internal unit is fixed within the case through the frame, the frame has such a shape that the at least part of the electronic components configuring the internal unit is surrounded by the frame, and includes a first wall section, and a second wall section and a third wall section which extend from both sides of the first wall section, the cooler includes a coolant introduction tube introducing coolant into the cooler and a coolant discharge tube discharging the coolant from the cooler, the coolant introduction tube and the coolant discharge tube projecting outward from the frame, the first to third wall sections include a support wall section which supports at least one of the coolant introduction tube and the coolant discharge tube, and a frame wall section which does not support the coolant introduction tube and the coolant discharge tube, and the thickness of the support wall section is larger than the thickness of the frame wall section.

DETAILED DESCRIPTION OF THE PREFERRED EMBODIMENTS

With reference to the accompanying drawings, hereinafter is described an embodiment. Throughout the drawings, components identical with or similar to each other are given the same numerals for the sake of omitting unnecessary explanation.

(First Embodiment)

A power conversion apparatus according to the first embodiment is described with reference to FIGS. 1 to 19.

Figure 1:
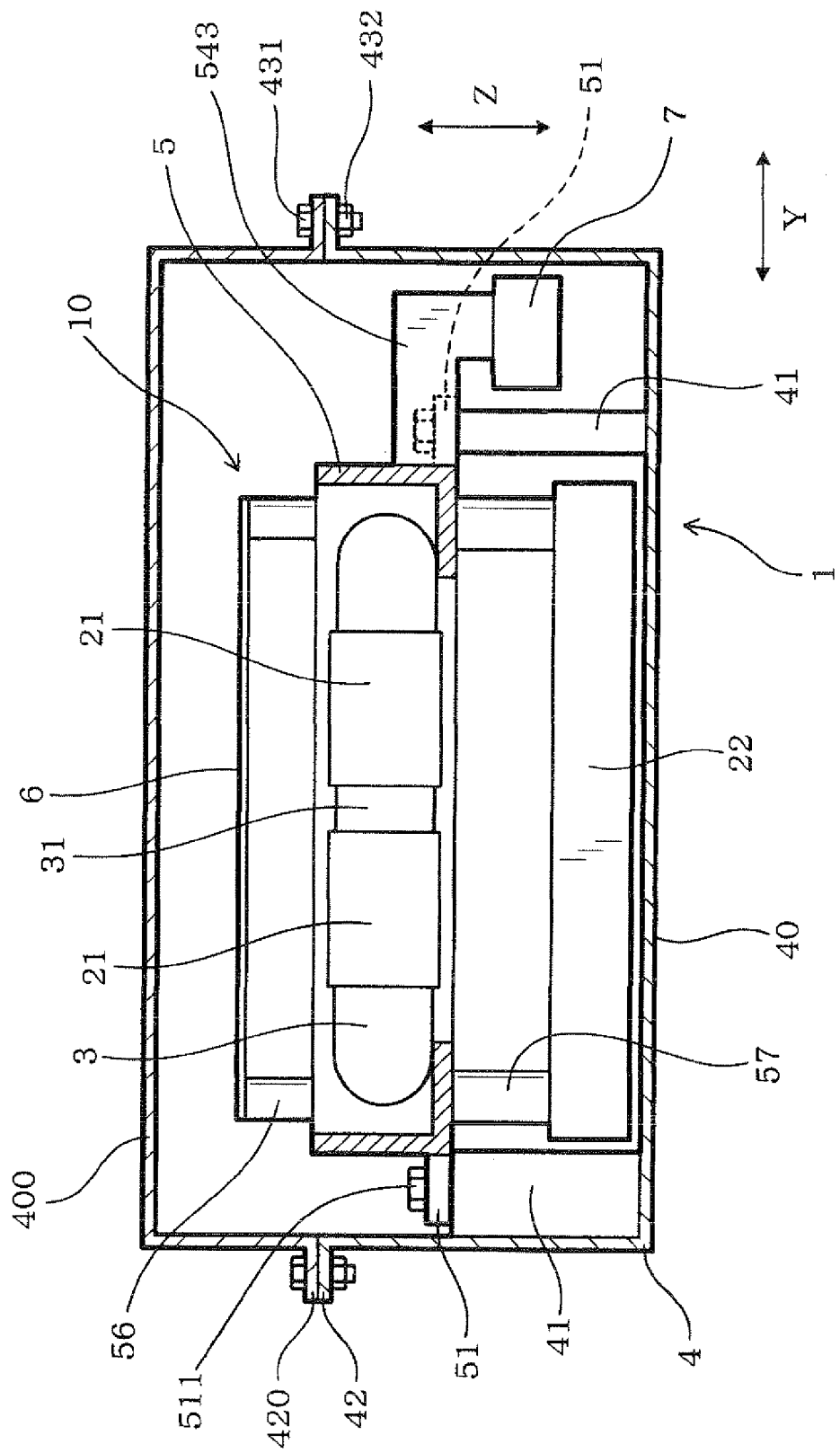
FIG. 1 is a schematic explanatory sectional view of a power conversion apparatus according to a first embodiment.

As shown in FIG. 1, a power conversion apparatus 1 of this embodiment is constituted of electronic components (semiconductor modules 21, a capacitor 22 and the like) which constitute a power conversion circuit, a cooler 3 for cooling at least part of the electronic components (the semiconductor modules 21 in this embodiment), and a case 4 housing the electronic components and the cooler 3.

The semiconductor modules 21 and the cooler 3 are fixed to and integrated with a frame 5 to constitute an internal unit 10. The internal unit 10 is fixed to the case 4, and sealed within the case 4.

Figure 16:
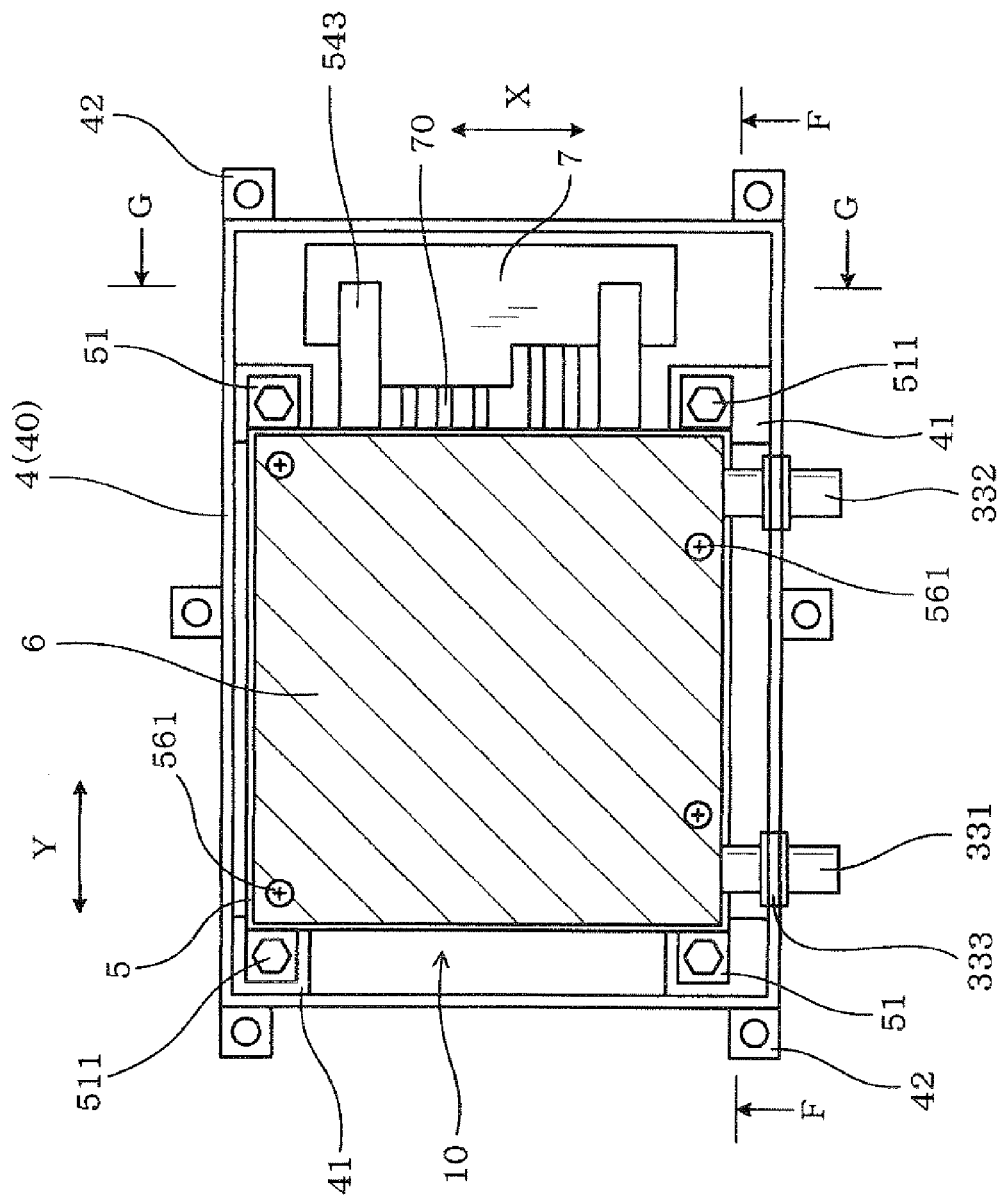
FIG. 16 is a plan view of the internal unit housed in a case of the first embodiment.
Figure 17:
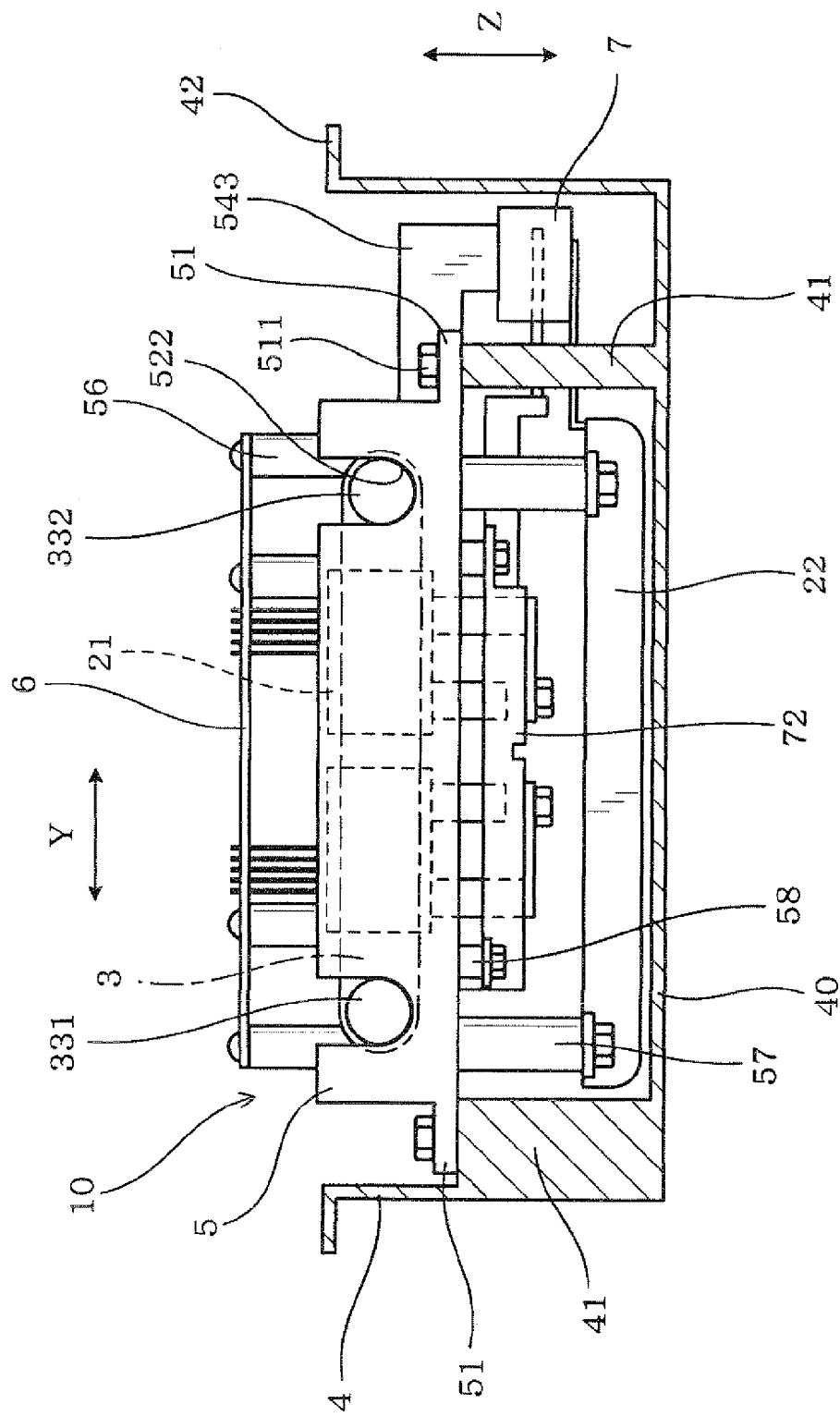
FIG. 17 is a cross-sectional view of FIG. 16 along the line F-F.
Figure 18:
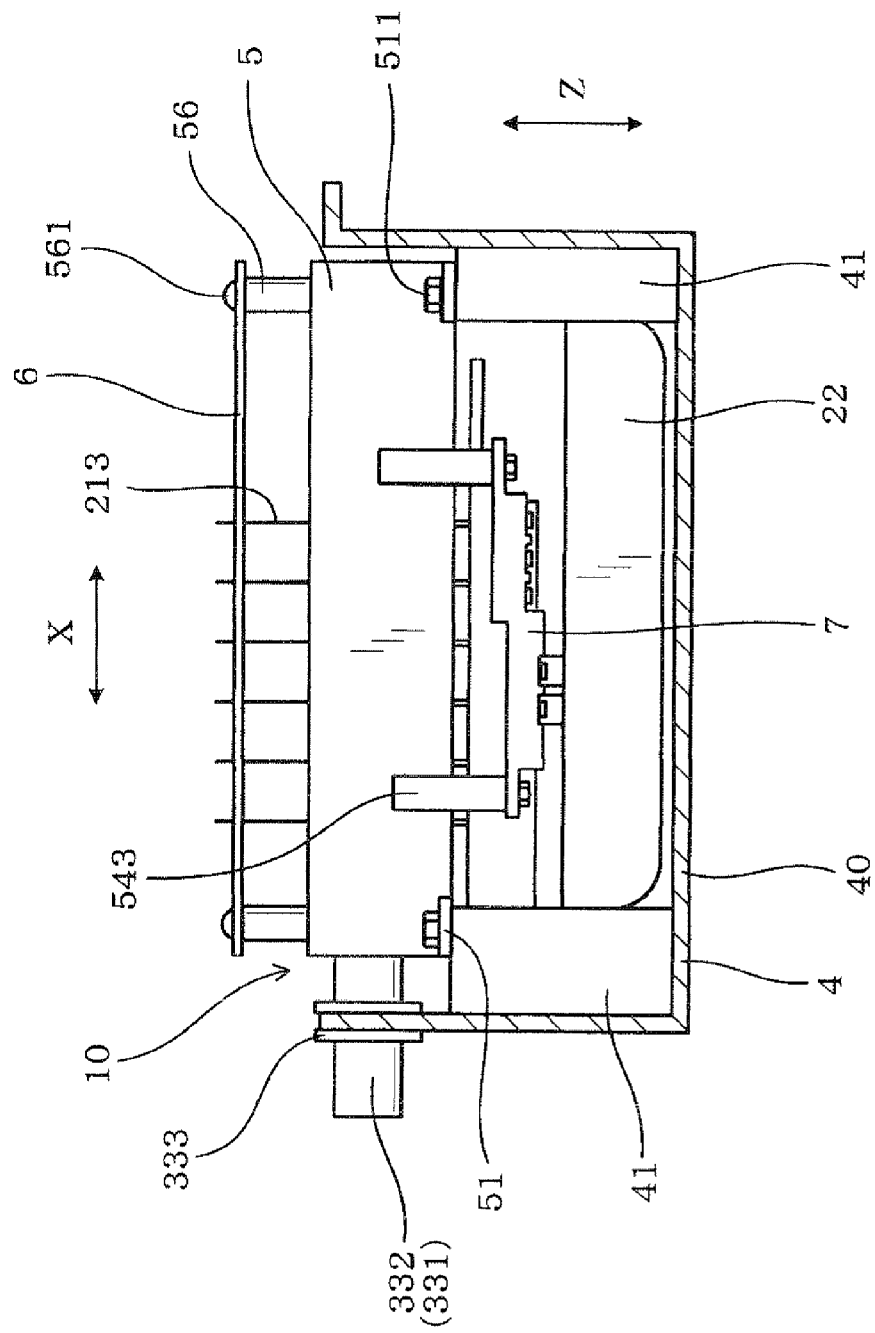
FIG. 18 is a cross-sectional view of FIG. 16 along the line G-G.

As shown in FIGS. 16 to 18, the internal unit 10 is fixed to the case 4 through the frame 5. The frame 5 is made of conductive material, and formed in a shape to surround the semiconductor modules 21 constituting the internal unit 10 from all four sides. The frame 5 may be a shaped body of metal such as aluminum or steel, or alloy. Also, the case 4 may be a shaped body of metal such as aluminum or steel or alloy.

Each of the semiconductor modules 21 incorporates therein switching elements such as IGBTs (Insulated Gate Bipolar Transistor) or MOSFETs (Metal-Oxide Semiconductor Field-Effect Transistor). The semiconductor modules 21 are each constituted of a main body section 211 in which the switching elements are resin-molded, main electrode terminals 212 and control terminals 213. The main electrode terminals 212 and the control terminals 213 extend from the main body section 211 in the opposite directions. Controlled electric power is inputted to or outputted from each of the semiconductor modules 21 through the main electrode terminals 212. A control current for controlling the switching elements is inputted to each of the semiconductor modules 212 through the control terminals 213.

Figure 7:
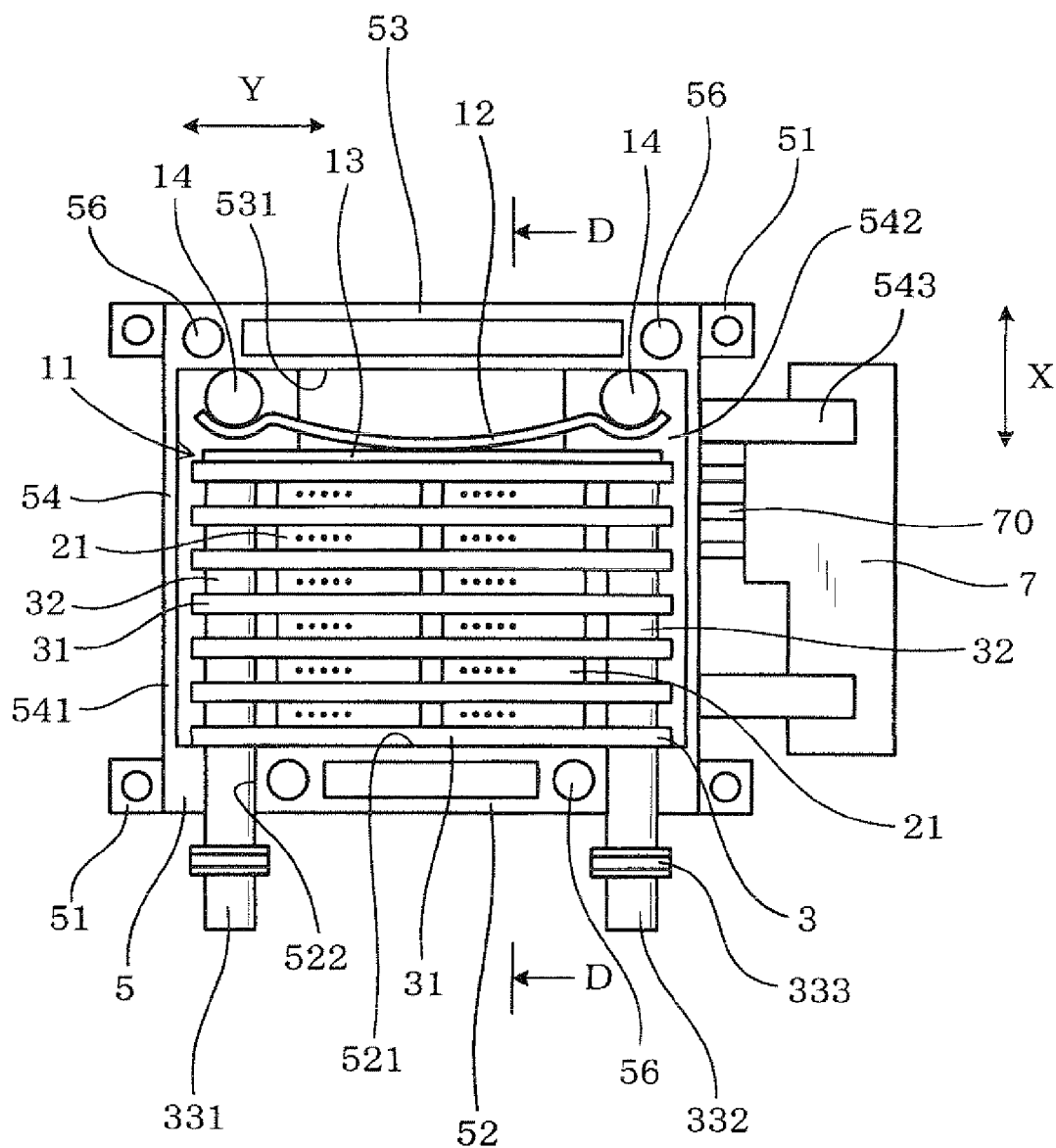
FIG. 7 is a plan view of the frame of the first embodiment, on which a stacked body, a terminal block and the like are assembled.
Figure 10:
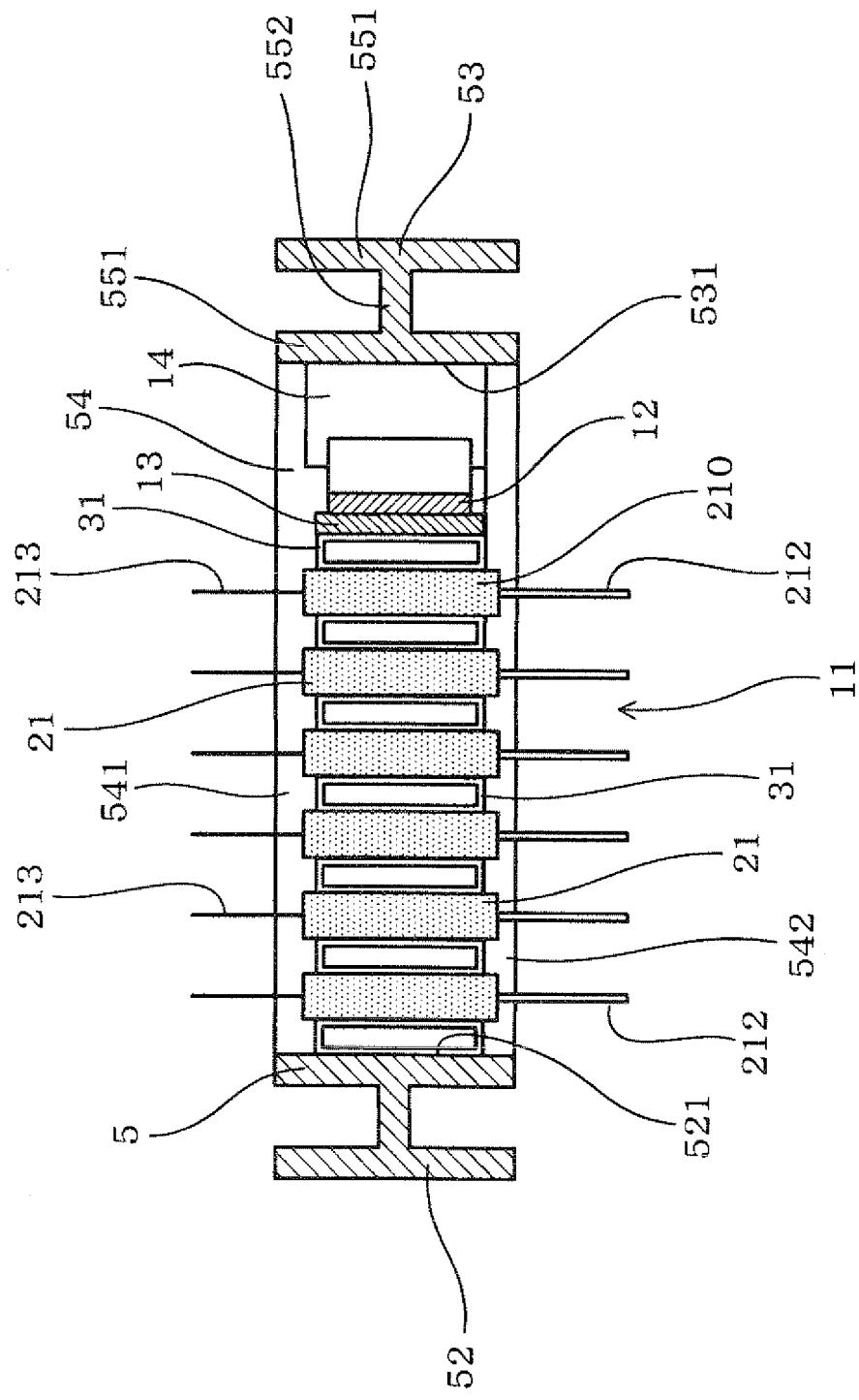
FIG. 10 is a cross-sectional view of FIG. 7 along the line D-D.

As shown in FIGS. 7 and 10, the cooler 3 includes cooling tubes 31 each having therein a coolant passage. The internal unit 10 incorporates therein a stacked body 11 in which the cooling tubes 31 and the semiconductor modules 21 are stacked alternately. Each of the semiconductor modules 21 is held between the cooling tubes 31 at both major surfaces thereof. Between each adjacent two of the cooling tubes 31, two semiconductor modules 21 are disposed.

As shown in FIG. 7, the cooling tubes 31 extend in their longitudinal direction (may be referred to as "the lateral direction Y") perpendicular to the stacking direction X. Each adjacent two of the cooling tubes 31 are joined through a deformable joint tube 32 at their both ends. The cooler 3 includes a coolant introduction tube 331 and a coolant discharge tube 332 respectively connected to both ends in the lateral direction Y of the cooling tube 31 located at one end in the stacking direction X of the stacked body 11.

Accordingly, the coolant introduced from the coolant introduction tube 331 spreads in the longitudinal direction (lateral direction Y), while passing the joint tubes 32 to be distributed to the respective cooling tubes 31. The coolant exchanges heat with the semiconductor modules 21 while flowing through the respective cooling tubes 31. The coolant having a temperature increased by the heat exchange passes the joint tubes 32 on the downstream side, and is discharged from the is coolant discharge tube 332.

As the coolant, there may be used a natural coolant such as water and ammonia, or water mixed with antifreeze such as ethylene glycol, or a fluorocarbon coolant such as fluorinert, or a chlorofluorocarbon coolant such as HCFC123 and HFC134a, or an alcoholic coolant such as methanol and alcohol, or a ketone coolant such as acetone.

The internal unit 10 includes a pressure member 12 for pressing the stacked body 11 in the stacking direction X. The pressure member 12 is interposed between an inner part of the frame 5 and one end of the stacked body 11 (this one end being referred to as "rear end" hereinafter) in the stacking direction X. The stacked body 11 is supported by another inner part of the frame 5 at the other end thereof (referred to as "front end" hereinafter) in the stacking direction X.

The pressure member 12 is constituted of a leaf spring which bents convexly toward the stacked body 11. Between the pressure member 12 and the stacked body 11, a flat reinforcing plate 13 is interposed to prevent the pressing force of the pressure member 12 from being locally applied to the cooling tube 31 located at the rear end to thereby prevent this cooling tube 31 from being deformed. A support pin 14 is held between each of both ends of the pressure member 12 in the longitudinal direction (lateral direction Y) and the frame 5. The pressure member 12 is supported by the pair of support pins 14 at its rear side.

The frame 5 includes a front wall section (first wall section) 52 and a rear wall section (fourth wall section) 53 located on both sides in the stacking direction X of the stacked body 11, and a pair of side wall sections (second and third wall sections) 54 joining the front and rear wall sections 52 and 53 at both ends thereof. Hence, as shown in FIGS. 2 and 3, the frame 5 has a substantially rectangular shape when viewed from the direction perpendicular to both the stacking direction X and the lateral direction Y (referred to as "height direction Z" hereinafter).

As show in FIGS. 1 to 3 and 19, the frame 5 includes unit fixing sections 51 for fixing the internal unit 10 to the case 4. At least one unit fixing section 51 is located on the outside of each of a pair of support sections (the inner surface 521 of the front wall section 52 and the inner surface 531 of the rear wall section 53) in the stacking direction X at which the frame 5 is applied with the reaction force toward the outside in the stacking direction X applied from the stacked body 11 and the pressure member 11. In this embodiment, two unit fixing sections 51 are located on the outside of the inner surface 521, and another two unit fixing sections 51 are located on the outside of the inner surface 531.

Each unit fixing section 51 is shaped to project outward from the frame 5 and is formed with a through hole. By inserting a bolt 511 into the through hole, and screwing the bolt 511 into a threaded hole formed in a corresponding one of unit support sections 41 formed inside the case 4 for each of the unit fixing sections 41, the frame 5 can be fixed to the case 4 to thereby fix the internal unit 10 to the case 4.

Figure 2:
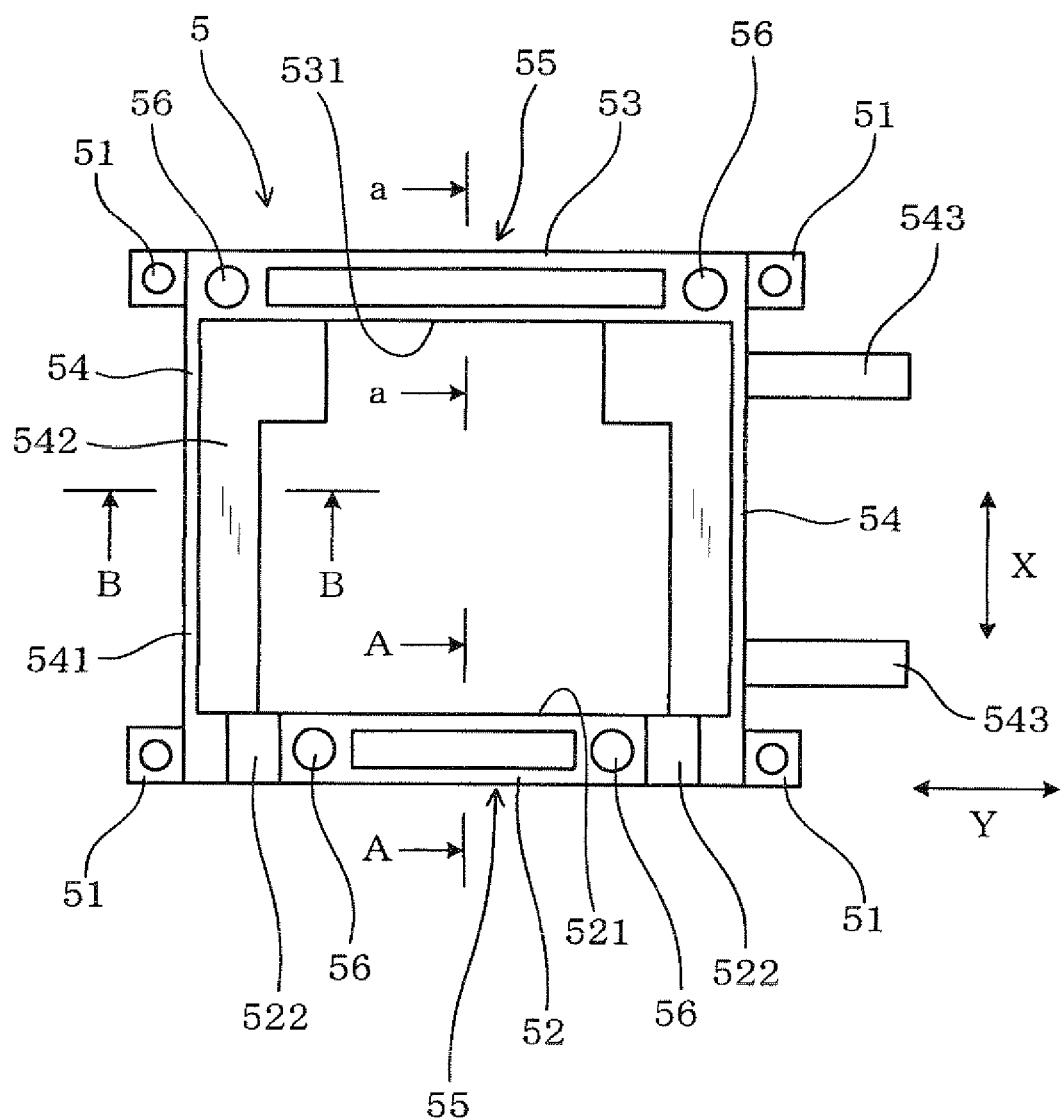
FIG. 2 is a plan view of a frame of the power conversion apparatus according to the first embodiment.
Figure 3:
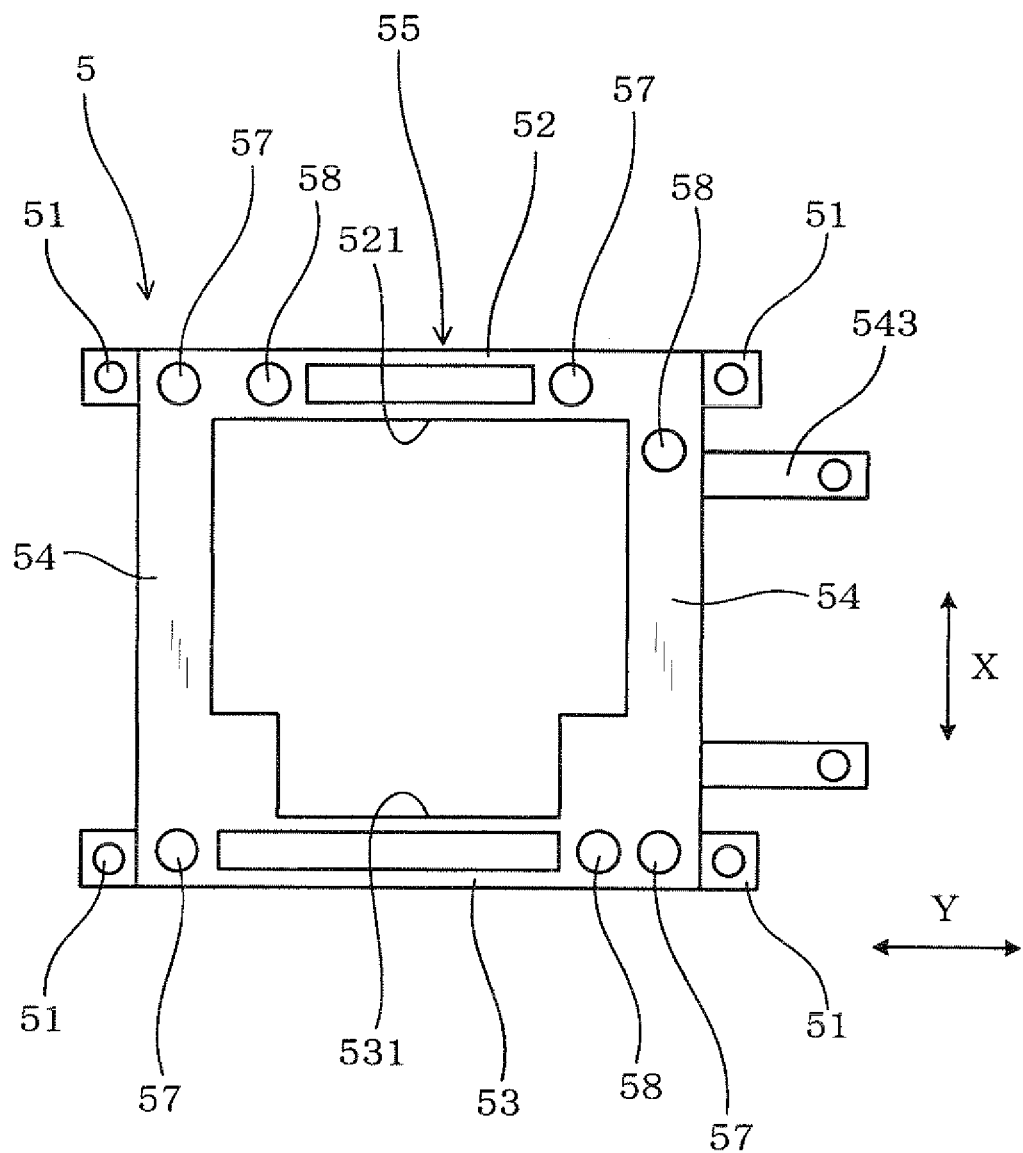
FIG. 3 is a bottom view of the frame of the power conversion apparatus according to the first embodiment.
Figure 4:
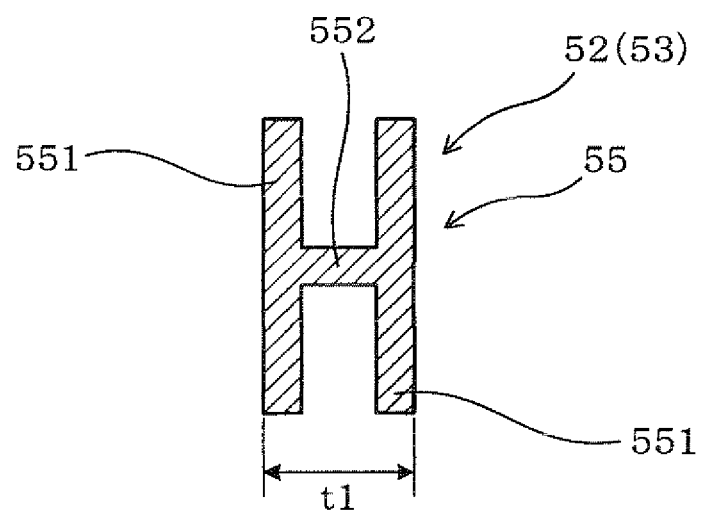
FIG. 4 is a cross-sectional view of FIG. 2 along the line A-A (or a-a)
Figure 5:
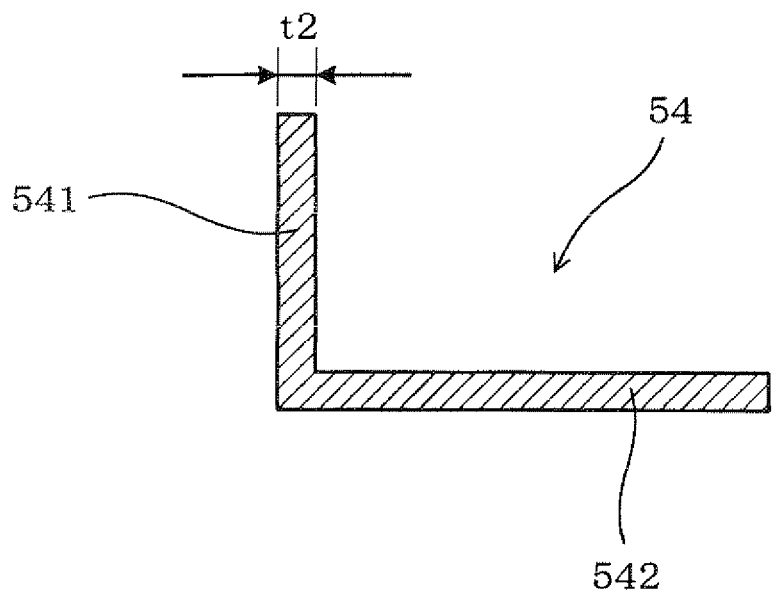
FIG. 5 is a cross-sectional view of FIG. 2 along the line B-B.
Figure 6:
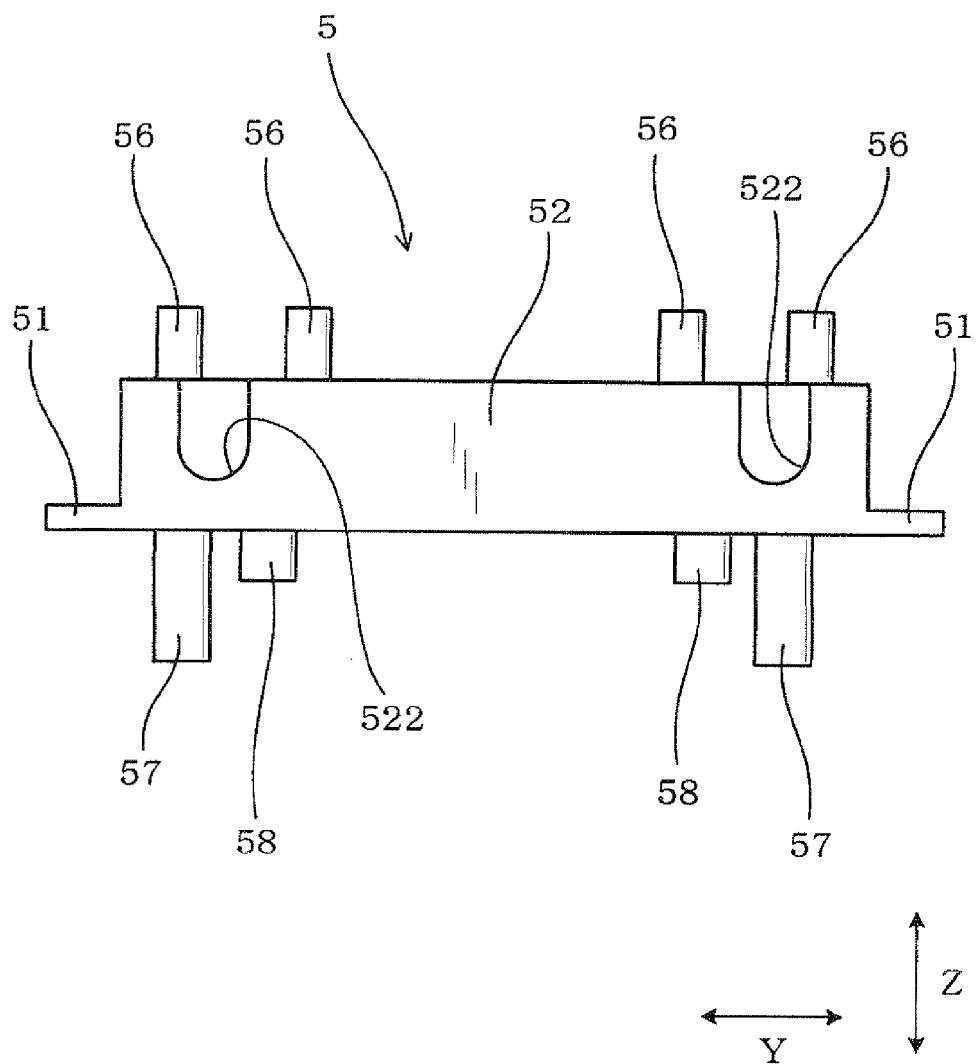
FIG. 6 is a front view of the frame of the first embodiment.

As shown in FIGS. 2, 4 and 5, the wall thickness t1 of the front wall section 52 and the rear wall section 53 is larger than the wall thickness t2 of the side wall section 54. Here, the wall thicknesses t1 and t2 are dimensions in the stacking direction X or lateral direction Y at portions to which the cooling tubes 31 are projected in the stacking direction X or lateral direction Y.

As shown in FIGS. 4 and 10, at least a part of each of the front wall section 52 and the rear wall section 53 form an H-shaped wall section 55 having a substantially H-shaped cross section. The H-shaped wall section 55 is constituted of a pair of longitudinal plate sections 551 perpendicular to the stacking direction X, and a connecting section 552 connecting these longitudinal plate sections 551 together at the center is of the longitudinal plate sections 551.

As shown in FIGS. 2 and 3, at least a part of each of the side wall sections 54 forms an L-shaped wall section having a substantially L-shaped cross section. As show in FIG. 5, the L-shaped wall section (side wall sections 54) is constituted of a main wall portion 541 having a major surface facing the inner surface of the frame 5, and an inward portion 542 projecting toward the inner side of the frame 5 from one end of the main wall portion 541 in the direction perpendicular to the stacking direction X. In this embodiment, the L-shaped wall section is formed by the whole of the side wall section 54.

As shown in FIGS. 2 and 7, the inward portion 542 of the side wall section 54 projects more inward in the vicinity of the support pin 14 than the other portions.

Figure 9:
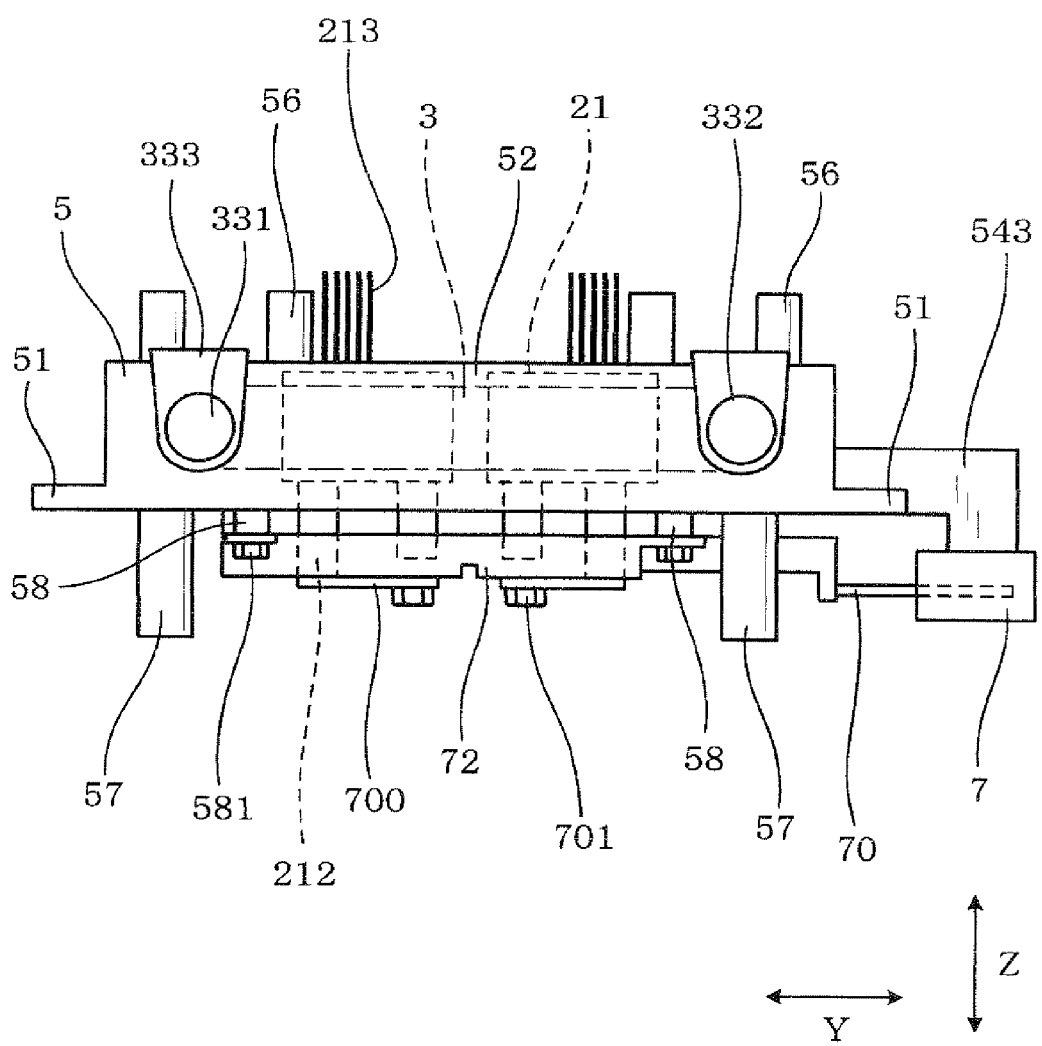
FIG. 9 is a view of the frame as viewed from the direction of the arrow C of FIG. 8.

The frame 5 is open at both sides in the height direction Z. The frame 5 is penetrated in the height direction Z. As shown in FIGS. 9 and 10, the main electrode terminals 212 and the control terminals 213 of each semiconductor module 21 respectively project to one side (bottom side) of the height direction Z and the other side (top side) of the height direction Z. In the present application, the description is made assuming that the bottom side of the height direction Z corresponds to the direction of projection of the main electrode terminals 212, and the top side of the height direction Z corresponds to the direction of projection of the control terminals 213. However, this assumption is just for explanation. Likewise, the words "front", "rear", "lateral" are also just for explanation.

Figure 13:
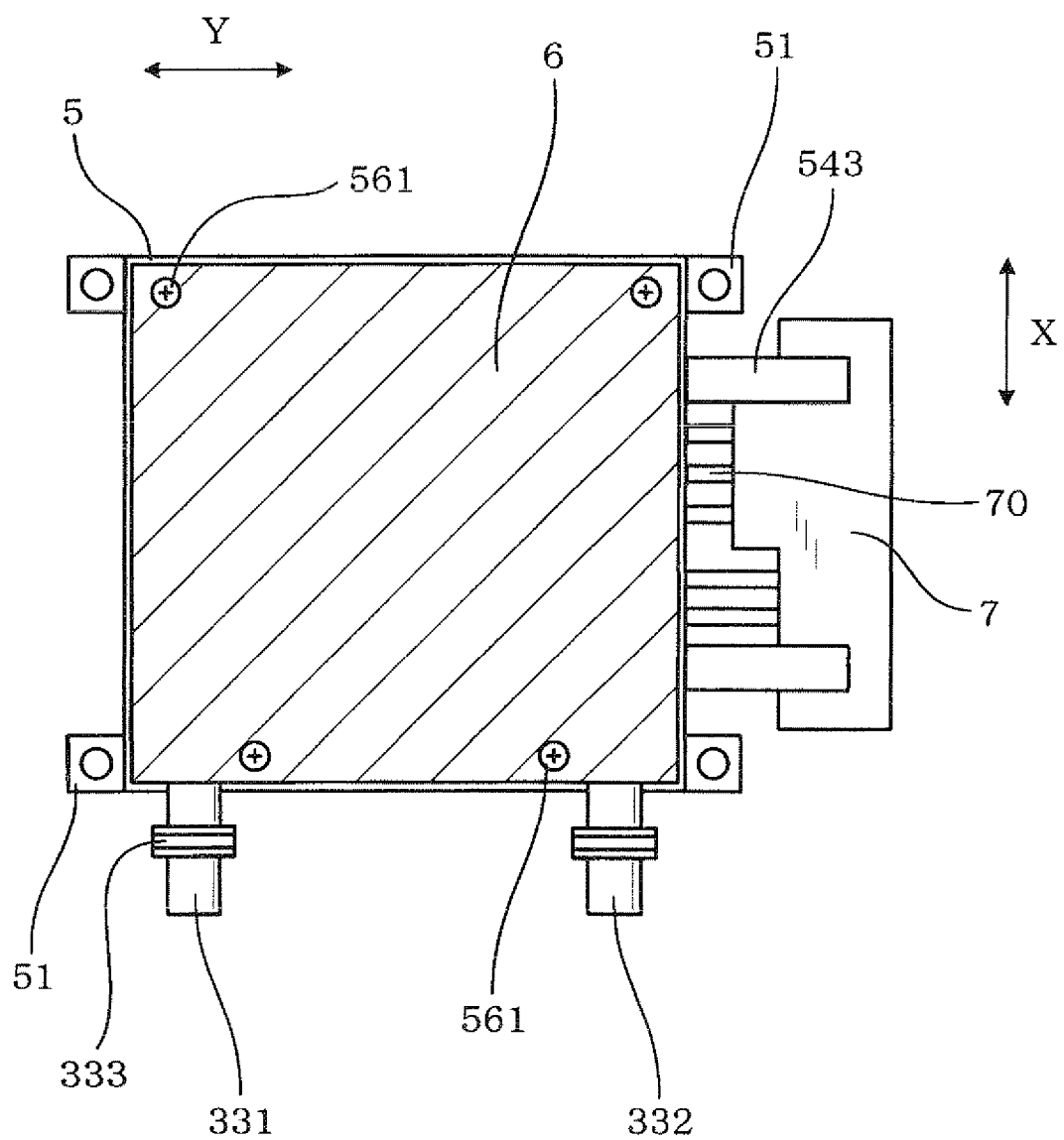
FIG. 13 is a plan view of the frame of the first embodiment, on which a control circuit board is further assembled, that is, a plan view of an internal unit of the first embodiment.
Figure 14:
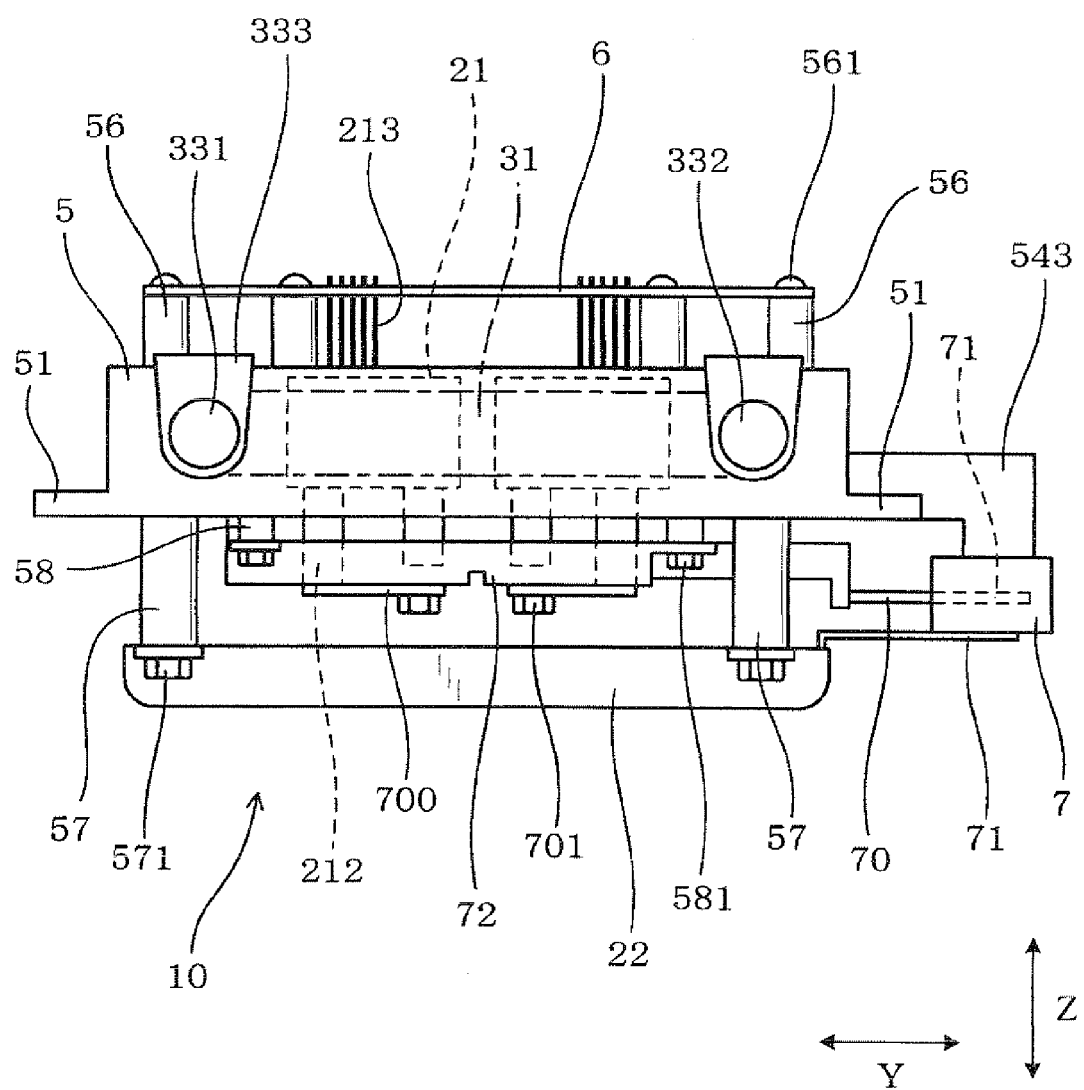
FIG. 14 is a front view of the internal unit of the first embodiment.

As shown in FIGS. 1 and 13 to 19, the internal unit 10 includes a control circuit board 6 on which a control circuit for controlling the switching elements included in the semiconductor modules 21 is formed. The control terminals 213 of the semiconductor module 21 are connected to the control circuit board 6. As shown in FIGS. 13 and 14, the unit fixing sections 51 of the frame 5 are located more outward than the outer edge of the control circuit board 6.

Figure 15:
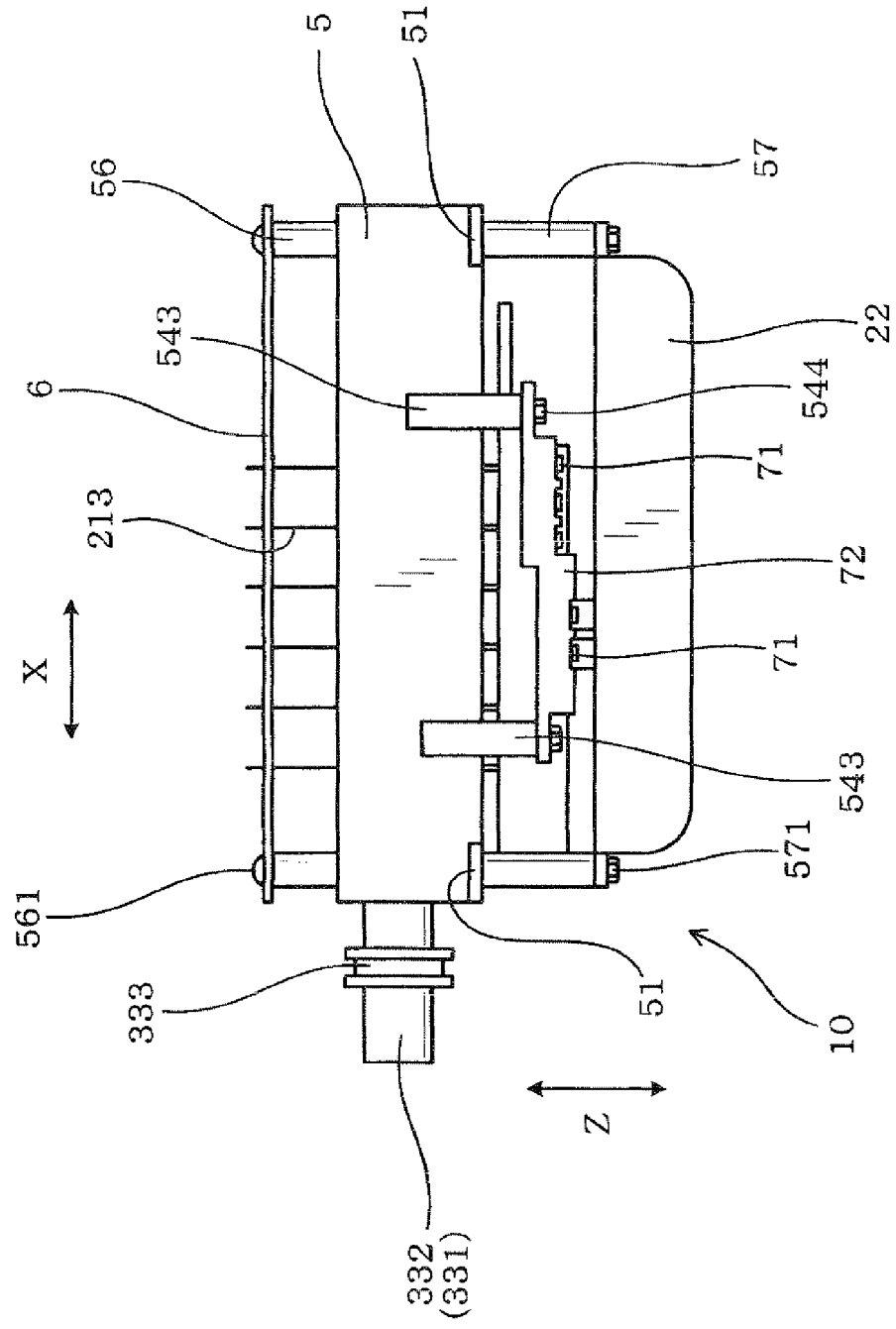
FIG. 15 is a side view of the internal unit of the first embodiment.

As shown in FIGS. 2, 14 and 15, the frame 5 is provided with four board fixing sections 56 for fixing the control circuit board 6 to the internal unit 10, which are located more inward than the unit fixing sections 51.

The board fixing sections 56 are constituted of two bosses formed in each of the front wall section 52 and the rear wall section 53 so as to project upward in the height direction Z. As shown in FIGS. 13 to 15, each of the board fixing sections 56 is formed with a threaded hole in which a screw 561 is inserted to secure the control circuit board 6 to the frame 5 in four positions.

Figure 11:
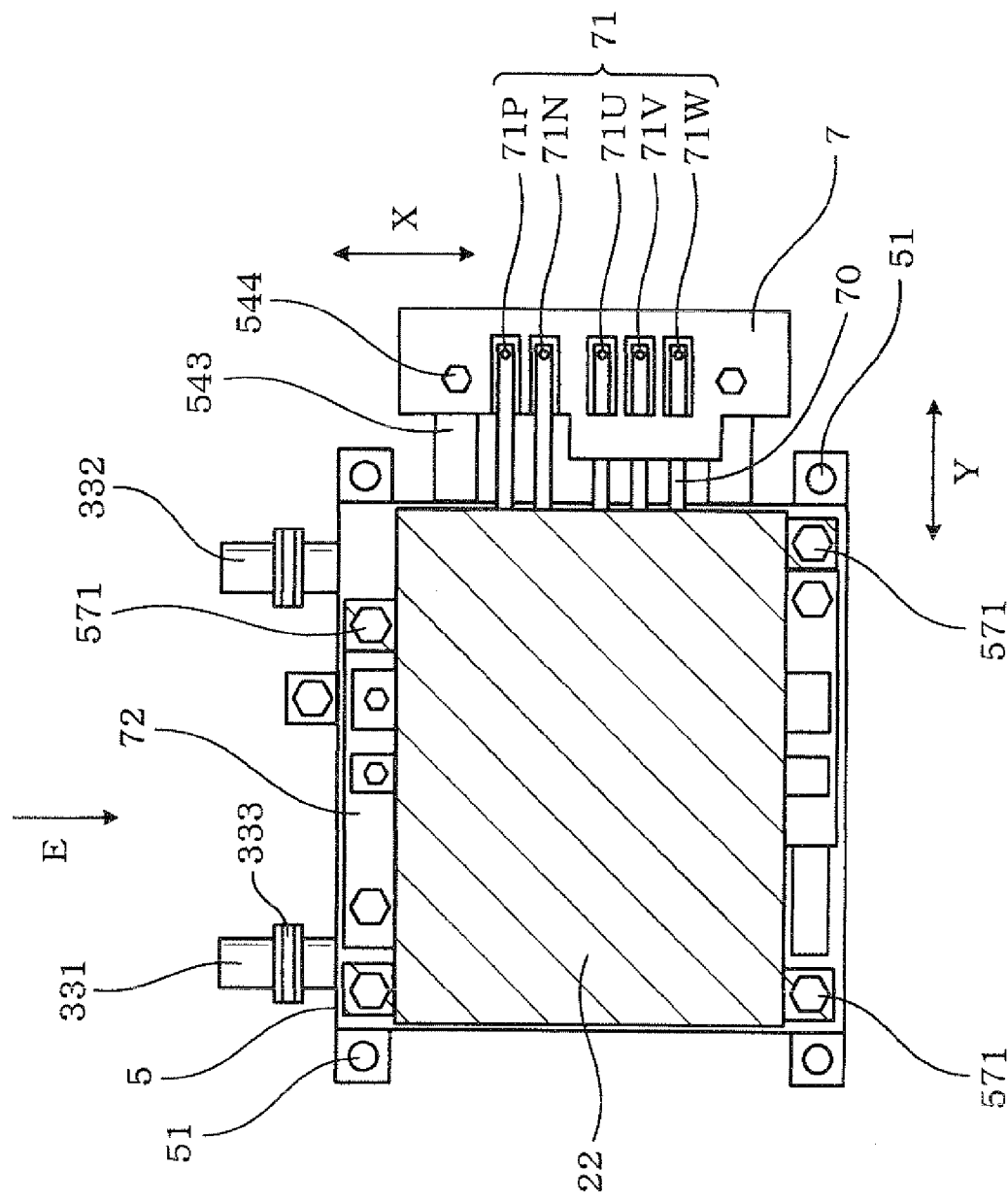
FIG. 11 is a plan view of the frame of the first embodiment, on which a capacitor is further assembled.

As shown in FIGS. 14 and 15, the internal unit 10 includes a capacitor 22. The frame 5 includes four capacitor fixing sections 57 for fixing the capacitor 22 to the internal unit 10. As shown in FIGS. 3, 11 and 14, the capacitor fixing sections 57 are located more inward than the unit fixing sections 51.

The capacitor fixing sections 57 are constituted of two bosses formed in each of the front wall section 52 and the rear wall section 53 so as to project to the opposite side of the board fixing sections 56, that is, downward in the height direction Z. Each of the capacitor fixing sections 57 is formed with a threaded hole in which a bolt 571 is inserted to secure the capacitor 22 to the frame 5 in four positions.

As shown in FIGS. 11 to 15, the internal unit 10 includes a terminal block 7 on which input/output terminals 71 for input and output of controlled electric power are mounted for making connection between the input/output terminals 71 and terminals of external devices such as a DC battery and an electric rotating machine.

The terminal block 7 is fixed to two support arms 543 by bolts 544, the support arms 543 being formed in one of the side wall sections 54 so as to project outward.

The input/output terminals 71 include a pair of capacitor terminals 71P and 71N electrically connected to a pair of electrodes of the capacitor 22, and three output terminals 71U, 71V and 71W electrically connected to the main electrode terminals 212 of the semiconductor modules 21 and to be respectively connected to the electrodes of the U-phase, V-phase and W-phase of the three-phase electric rotating machine.

The input/output terminals 71 are respectively formed at one ends of bus bars which are connected to the capacitor 22 or semiconductor modules 21 at the other ends thereof.

Of these bus bars, the ones 70 respectively formed with the output terminals 71U, 71V and 71W are partially molded with resin to form an integrated bus bar assembly 72.

As shown in FIGS. 3, 14 and 15, the frame 5 includes bus bar fixing sections 58 for fixing the bus bar assembly 72. In this embodiment, the bus bar fixing sections 58 are formed in three positions. Two of the three bus bar fixing sections 58 are located at positions closer to the terminal block 7 than to the center of the frame 5.

The internal unit 10 includes all the electronic components constituting the power conversion circuit. That is, all the electronic components of the power conversion apparatus 1 belong to the internal unit 10, and none of the electronic components is directly fixed to the case 4.

As shown in FIG. 1, the case 4 is constituted of a case body 40 which is open upward, and a lid body 400 closing the opening of the case body 40. The unit support sections 41 are formed integrally with the case body 40.

The case body 40 is provided with a flange section 42 around the outer periphery of the opening. Also, the lid body 400 is provided with a flange section 420 around the outer periphery thereof. The case body 40 and the lid body 400 are joined together with a seal member (not shown) interposed between their flange sections 42 and 420 by bolts 431 and nuts 432. Accordingly, the internal unit 10 is sealed in the case 4.

Figure 19:
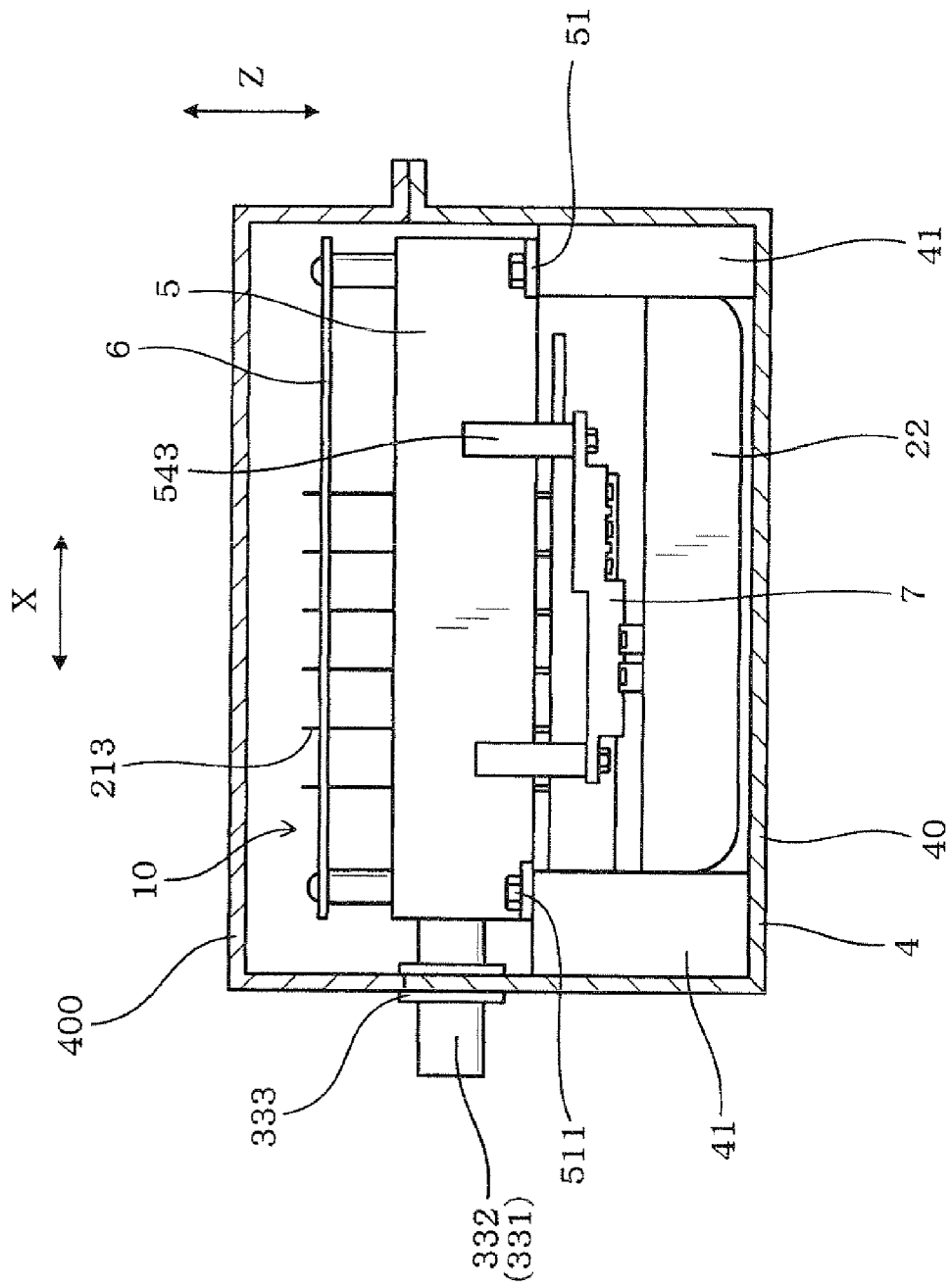
FIG. 19 is a cross-sectional view of the power conversion apparatus according to the first embodiment as viewed along the line G-G of FIG. 16.

As shown in FIGS. 16 and 19, each of the coolant introduction tube 331 and the coolant discharge tube 332 is connected to the stacked body 11 (see FIG. 7) so as to partially protrude from the case 4. Each of the coolant introduction tube 331 and the coolant discharge tube 332 is provided with an annular packing 333 at its outer periphery. As shown in FIG. 16, the case body 40 is formed with two recesses (not shown) through which the coolant introduction tube 331 and the coolant discharge tube 332 pass, respectively. Each of the annular packings 333 is held between the case body 40 and the lid body 400 in the state of being fitted to the coolant introduction tube 331 or coolant discharge tube 332 at one of the recesses. Accordingly, the case 4 can be hermetically sealed allowing the coolant introduction tube 331 and the coolant discharge tube 332 to protrude outward from the case 4, The case 4 is further formed with through holes as passages of electric wires and spaces for installing connectors for connection of the electronic components and the control circuit board 6 with external devices. These through holes are provided with seal members to ensure water tightness of the case 4.

To assemble the power conversion apparatus 1 having the above-described structure, the internal unit 10 is assembled first as shown in FIGS. 13 to 15. Next, the internal unit 10 is accommodated and fixed in the case body 40 as shown in FIGS. 16 to 18. Finally, the internal unit 10 is sealed in the case 4 by joining the lid body 400 to the case body 40 as shown in FIGS. 1 and 19.

To assemble the internal unit 10, the frame 5 shown in FIGS. 2 to 6 is prepared.

Next, the stacked body 11 in which the semiconductor modules 21 and the cooling tubes 31 are stacked alternately is disposed inside the frame 5 as shown in FIGS. 7 and 10. Incidentally, the cooling tubes 31 are coupled together through the joint tubes 32, and the cooler 3 including the coolant introduction tube 331 and the coolant discharge tube 332 connected thereto is assembled before the above step. When the stacked body 11 is disposed inside the frame 5, the coolant introduction tube 331 and the coolant discharge tube 332 are respectively placed on concave portions 522 formed in the frame (see FIGS. 2 and 6).

The pressure member 12 is disposed between the rear end of the stacked body 11 and the rear wall section 53.

Subsequently, the pressure member 12 is pushed forward at around both ends thereof by a pressure jig while being elastically deformed in the stacking direction X in order to compress the stacked body 11. When the pressure member 12 is deformed by a predetermined amount, the column-shaped support pins 14 are inserted between the rear wall section 53 of the frame 5 and each end of the pressure member 12. Thereafter, the pressure jig is pulled away from the pressure member 12 while being moved backward in order to bring the pair of support pins 14 to the state of being held between the pressure member 12 and the rear wall section 53. This state is also a state in which the stacked body 11 is compressed in the stacking direction by a predetermined pressure due to an urging force applied from the pressure member 12.

Figure 8:
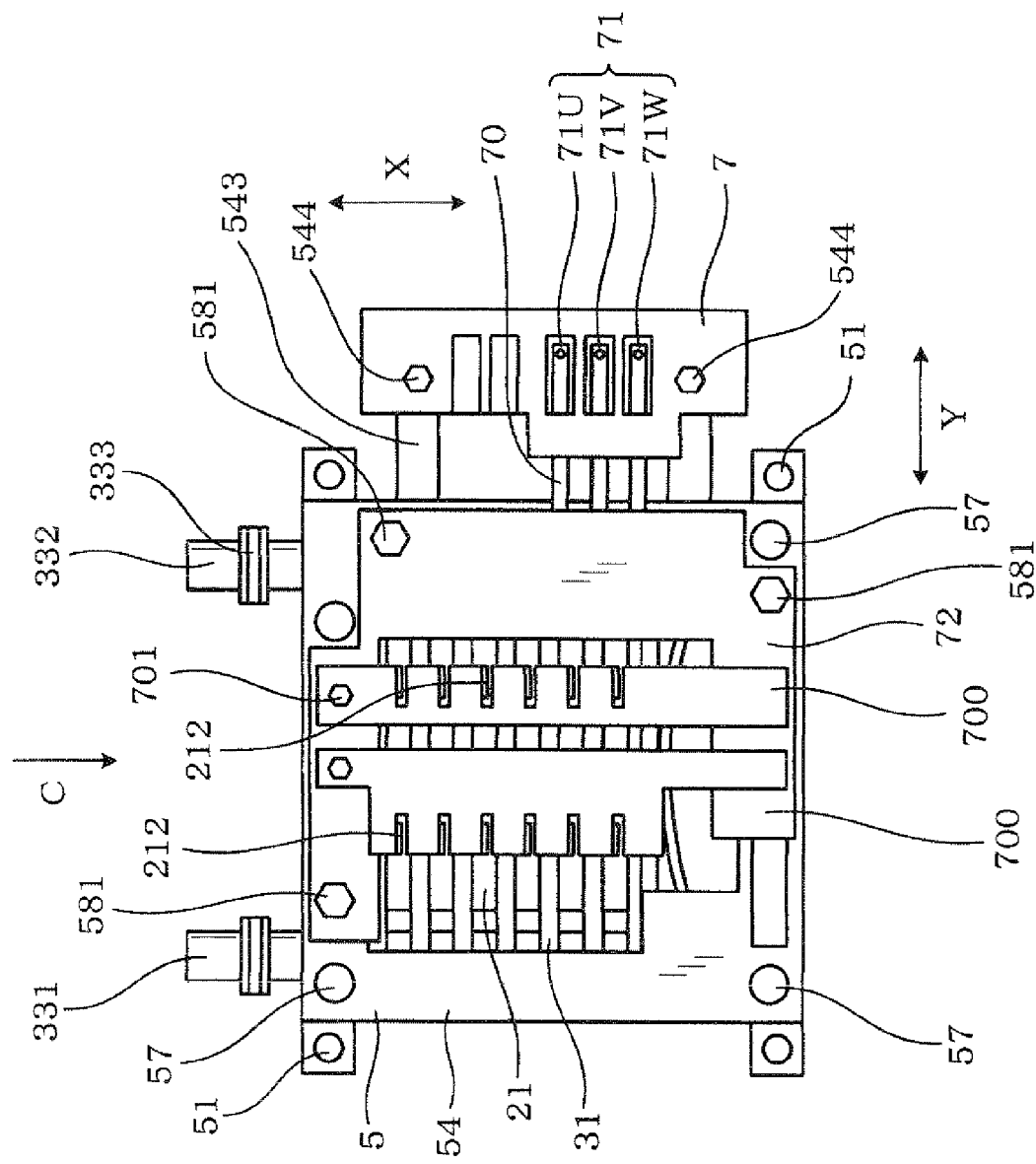
FIG. 8 is a plan view of the frame of the first embodiment, on which a bus bar assembly is further assembled.

Next, the terminal block 7 is fixed to the support arms 543 of the frame 5 by the bolts 544 as shown in FIGS. 7 to 9.

Next, the resin-molded bus bar assembly 72 is fixed to the frame 5, and the bus bars 70 are welded to the main electrode terminals 212 of the semiconductor modules 21. Further, the input/output terminals 71U, 71V and 71W formed in the bus bars 70 are placed on the terminal block 7. The bus bar assembly 72 is fixed to bus bar fixing sections 58 formed at three positions in the frame 5 by bolts 581.

Thereafter, bus bars 700 for connection between the semiconductor modules 21 and the capacitor 22 are welded to the main electrode terminals 212 of the semiconductor modules 21, and fixed to the bus bar assembly 72 by bolts 701.

Figure 12:
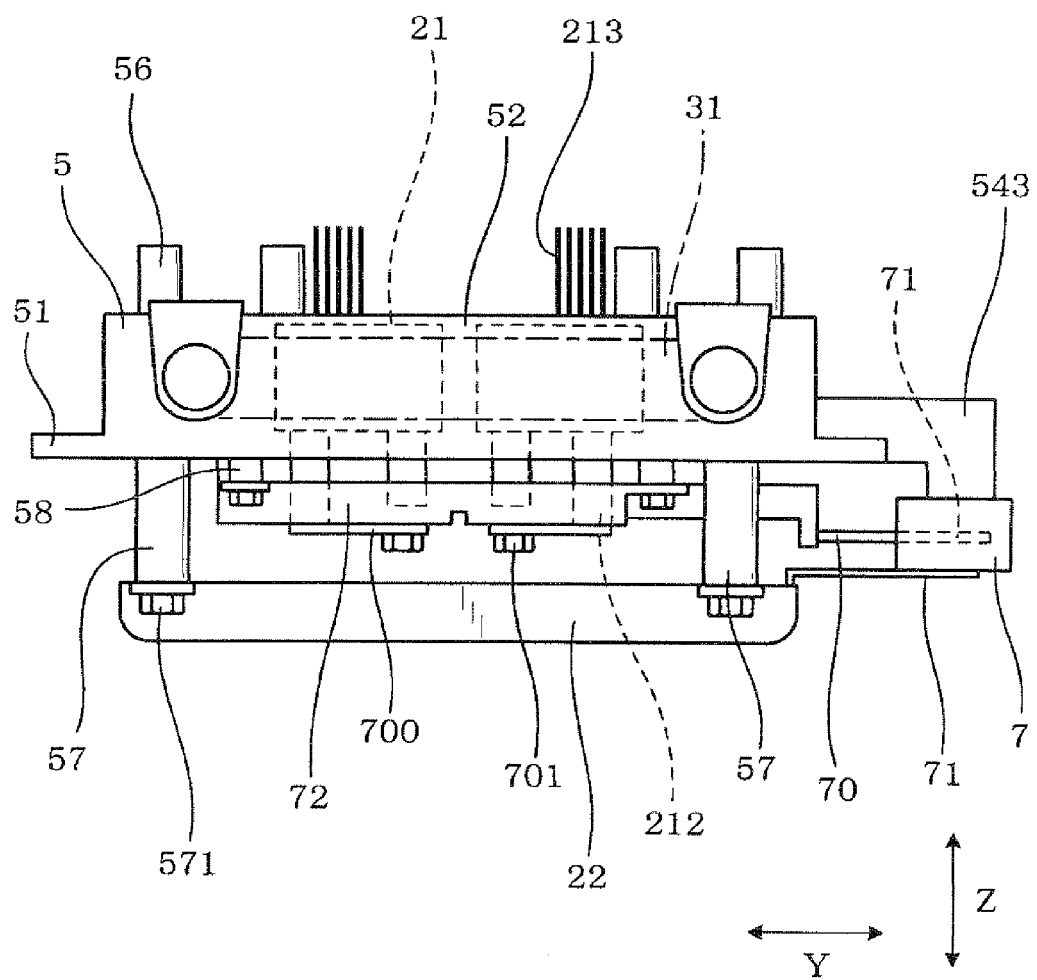
FIG. 12 is a view of the frame as viewed from the direction of the arrow E of FIG. 11.

Next, as shown in FIGS. 11 and 12, the capacitor 22 is fixed to the lower side of the frame 5. More precisely, the capacitor 22 is secured to the capacitor fixing sections 57 provided in the frame 5 by the bolts 571, and the pair of capacitor terminals 71P and 71N are disposed on the terminal block 7.

Next, as shown in FIGS. 13 to 15, the control circuit board 6 is disposed above the frame 5, and the control terminals 213 of the semiconductor modules 21 are inserted and connected into the through holes formed in the control circuit board 6. Subsequently, the circuit board 6 is fixed to the board fixing sections 56 of the frame 5 by the screws 561.

This completes assembly of the internal unit 10.

Thereafter, as shown in FIGS. 16 to 18, the internal unit 10 is fixed to the case body 40.

More precisely, the unit fixing sections 51 of the frame 5 which serves as an outer shell of the internal unit 10 are placed on the upper surfaces of the unit support sections 41 formed in the case body 40. At this time, the annular packings 333 attached to the coolant introduction tube 331 and the coolant discharge tube 332 are respectively fitted into the concave portions 44 formed in the case body 40.

In this state, the bolts 511 are inserted into the thorough holes formed in the unit fixing sections 51, and screwed into the threaded holes formed in the unit support sections 41 in order to fix the internal unit 10 to the case body 40.

Subsequently, as shown in FIGS. 1 and 19, the lid body 400 is placed on the opening of the case body 40 with the seal member being interposed therebetween, and the lid body 400 and the case body 40 are joined together at their flange sections 42 and 420 by the bolts 431 and the nuts 432. As a result, the internal unit 10 is sealed in the case 4.

This completes assembly of the power conversion apparatus 1.

Note that the pressure member 12 may be disposed between the front end of the stacked body 11 and the front wall section 52.

In the following, the effects and advantages of this embodiment are explained.

The power conversion apparatus 1 has the structure in which the electronic components (the semiconductor modules 21, capacitor 22 and so on) and the cooler 3 are fixed to the frame 5, so that the electronic components, the cooler 3 and the frame 5 are integrated as the internal unit 10. The internal unit 10 is fixed within the case 4. Accordingly, since the internal unit 10 serves as a beam of the case 4, the rigidity of the case 4 can be improved.

That is, since the case 4 can have a sufficient rigidity without being increased in the wall thickness, or being provided with reinforcing ribs, it is possible to reduce the material cost and the manufacturing cost of the case 4, and also to reduce the weight of the case 4.

Fixing the internal unit 10 to the case 4 makes it possible to suppress external force applied to the respective electronic components and the cooler 3 included in the internal unit 10 through the case 4. This makes it possible to suppress the electronic components and the cooler 3 included in the internal unit 10 from being affected by external vibration and thermal stress.

The electronic components and other members are not directly fixed to the case 4. The electronic components and the like are fixed to the frame 5, and the internal unit 10 is assembled. Thereafter, the internal unit 10 is fixed to the case 4, whereby the power conversion apparatus 1 can be obtained. Accordingly, assembling work of the power conversion apparatus 1 becomes easy.

Also, maintenance of the power conversion apparatus 1 becomes easy, because the whole internal unit 10 can be removed from the case 4 for maintenance work.

Since assembly and maintenance of the power conversion apparatus 1 can be carried out outside the case 4, the case 4 does not have to be provided with two or more lids. Accordingly, the sealing surface between the case body 40 and the lid body 400 can be one in number. This makes it possible to improve the water tightness of the case 4, and to reduce the sealing material of the case 4, to thereby reduce the material cost and man-hour cost for application of the sealing material to the case 4.

The internal unit 10 is sealed in the case 4. That is, since the whole internal unit 10 including the frame 5 is sealed in the case 4, the sealing surface can be one in number.

Since the internal unit 10 is fixed to the frame 5 within the case 4, and the frame 5 serves as a beam of the case 4 as described above, the rigidity of the case 4 can be further improved.

Since the frame 5 is made of a conductive material, and is shaped to surround the semiconductor modules 21 from all four sides, it can to shield electromagnetic noise emitted from the semiconductor modules 21. The case 4 is also made of a conductive material, and accordingly electromagnetic noise emitted from the semiconductor modules 21 can be shielded doubly by the frame 5 and the case 4. Since the frame 5 is shaped to surround the semiconductor modules 21 from the four sides, electromagnetic noise leaking from the power conversion apparatus 1 to the four sides can be suppressed.

In addition, in the power conversion apparatus 1, the internal unit 10, in which the electronic components (the semiconductor modules 21, capacitor 22 and so on) and the cooler 3 are fixed to the frame 5, is fixed to the frame 5 within the case 4. Accordingly, when the unified fixing section (unit support section 41) is provided, and the outer shape of the case 4 is changed depending on a mounting portion (engine compartment or the like) for the power conversion apparatus 1, layout inside the case 4 is not required to be changed depending on the vehicle type. Consequently, the power conversion apparatus can be applied to a variety of vehicle types without changing the structure of the internal unit 10 but by changing the layout of the case 4. Therefore the conversion apparatus 1 having high productivity can be obtained with low manufacturing cost.

However, in the above conversion apparatus 1 in which the case 4 and the frame 5 are combined, positional accuracy of the coolant introduction tube 331 and the coolant discharge tube 332 projecting from the case 4 can be lowered by dimensional tolerance and combinational tolerance of the frame 5 generated when combining the frame 5 with the case 4.

To solve the above problem, in the power conversion apparatus 1, the thickness of the front wall section 52 is larger than those of the side wall sections 54. Accordingly, accuracy of positioning the coolant introduction tube 331 and the coolant discharge tube 332 can be increased without increasing the frame 5 in size and weight, whereby the power conversion apparatus 1 can be effectively mounted on a mounting portion. That is, when mounting the power conversion apparatus 1 on the mounting portion such as an engine compartment of a vehicle, the coolant introduction tube 331 and the coolant discharge is tube 332 are required to be connected to coolant pipes disposed around the mounting portion. Therefore, in order to effectively mount the power conversion apparatus 1, the accuracy of positioning the coolant introduction tube 331 and the coolant discharge tube 332 to the case 4 is required to be high. To meet this requirement, the thickness of the front wall section 52 supporting the coolant introduction tube 331 and the coolant discharge tube 332 is made large. Thereby, the direction in which the coolant introduction tube 331 and the coolant discharge tube 332 project is accurately determined, which enables the accuracy of positioning to be high. In this case, if the wall thickness of all the portions of the frame 5 is made large, the frame 5 increases in size and weight. However, the wall thickness of the side wall sections 54, which does not directly concern the positioning of the coolant introduction tube 331 and the coolant discharge tube 332, may be relatively small. Consequently, by making the wall thickness of the front wall section 52 larger than those of the side wall sections 54, accuracy of positioning the coolant introduction tube 331 and the coolant discharge tube 332 can be increased without increasing the frame 5 in size and weight, whereby the power conversion apparatus 1 can be effectively mounted on a mounting portion.

As shown in FIGS. 7 and 10, the stacked body 11 in which the cooling tubes 31 and the semiconductor modules 21 are stacked alternately is included in the internal unit 10. Since this makes it possible to assemble the stacked body 11 outside the case 4, the power conversion apparatus 1 can be assembled more easily.

Since the stacked body 11 is constituted of the cooling tubes 31 and the semiconductor modules 21 stacked alternately, the semiconductor modules 21 can be cooled efficiently, and the stacked body 11 can be made compact in size.

The internal unit 10 includes the pressure member 12. The pressure member 12 is interposed between the rear wall section 53 of the frame 5 and the rear end of the stacked body 11 whose front end is supported by the front wall section 52 of the frame 5. Accordingly, the reaction force of the pressure member 12 can be supported by the frame 5. Accordingly, the case 4 is not required to have rigidity large enough to bear the reaction force of the pressure member 12, to increase the thickness thereof, or to include ribs. This makes it possible to make the case 4 light in weight and less expensive.

The frame 5 includes the four unit fixing sections 51, two of them being disposed on one side of the stacking direction X, the other two of them being disposed on the other side of the stacking direction X. These four unit fixing sections 51 are located more outward in the stacking direction X than the pair of support portions of the frame 5 (the inner surface 521 of the front wall section 52 and the inner surface 531 of the rear wall section 531) applied with the reaction force toward outside in the stacking direction X from the stacked body 11 and the pressure member 12. Accordingly, the frame 5 can resist the reaction force of the stacked body 11 and the pressure member 12 with the aid of the case 4. This is because the case 4 reinforces the frame 5, to thereby prevent the frame 5 from being deformed.

The frame 5 includes the front wall section 52, the rear wall section 53 and the pair of side wall sections 54. Accordingly, the stacked body 11 can be held stably within the frame 5.

The wall thicknesses of the front and rear wall sections 52 and 53 are larger than those of the side wall sections 54. That is, as shown in FIGS. 4 and 5, the wall thickness t1 is larger than the wall thickness t2. Accordingly, it is possible to improve the rigidities of the front and rear wall sections 52 and 53 receiving the reaction force of the pressure member 12, while reducing the weight of the side wall sections 54 not directly receiving the reaction force of the pressure member 12. This makes it possible to make the frame 5 light in weight effectively, while ensuring the frame 5 to have rigidity large enough to resist the reaction force of the pressure member 12.

As shown in FIG. 4, part of each of the front and rear wall sections 52 and 53 is constituted as the substantially H-shaped wall section 55. Accordingly, the frame 5 can be made light in weight, while ensuring the high rigidity of the front and rear wall sections 52 and 53.

As shown in FIG. 5, since each of the side wall sections 54 is constituted as the substantially L-shaped wall section, it is possible to reduce the weight of the side wall sections 54 and the material cost, while ensuring them to have sufficient rigidity.

As shown in FIG. 10, the semiconductor modules 21 stacked together with cooling tubes 31 have the structure in which the main electrode terminals 212 and the control terminals 213 project toward the opposite sides in the height direction Z, and the frame 5 is open to both sides in the height direction Z. Accordingly, as shown in FIGS. 8 and 13 to 15, the bus bars 70 and 700 and the control circuit board 6 can be easily fixed to the semiconductor modules 21.

The internal unit 10 includes also the control circuit board 6. Accordingly, since it is not necessary to fix the control circuit board 6 directly to the case 4, the assembling work of the control circuit board 6 can be facilitated, and external force applied to the control circuit boar 6 can be reduced.

As shown in FIG. 2, the unit fixing sections 51 provided in the frame 5 are located outward of the outer edge of the control circuit board 6. Accordingly, the internal unit 10 can be easily fixed to the case 4. This is because if the unit fixing sections 51 are located inward of the outer edge of the control circuit board 6, the internal unit 10 assembled with the control circuit board 6 cannot be easily fixed to the case 4.

In this case, to fix the internal unit 10 to the case 4, it is necessary to drill holes penetrating the wall of the case 4 through which bolts or the like are inserted in, for example. However, in this case, not only the workability is lowered, but also more sealing members have to be used to ensure the water tightness of the case 4.

By locating the unit fixing sections 51 outward of the outer edge of the control circuit board 6, such a problem can be removed.

The board fixing sections 56 of the frame 5 are located more inward than the unit fixing sections 51. This facilitates connecting the control circuit board 6 to the frame 5, and connecting the internal unit 10 to the case 4.

The internal unit 10 includes also the capacitor 22. Accordingly, it is possible to reduce external force applied to the capacitor 22. Further, it is possible to suppress vibration of the capacitor 22 being transmitted to the outside through the case 4. This makes it possible to suppress unpleasant vibration noise from occurring in the vehicle cabin incorporating the power conversion apparatus 1 due to vibration of the capacitor 22.

As shown in FIG. 3, the capacitor fixing sections 57 provided in the frame 5 are located more inward than the unit fixing sections 51. Accordingly, the capacitor 22 can be easily fixed to the frame 5, and the internal unit 10 can be easily fixed to the case 4.

The internal unit 10 includes also the terminal block 7. Accordingly, since the terminal block 7 can be fixed to the internal unit 10 outside the case 4, the assembling work of the terminal block 7 can be facilitated.

The frame 5 includes the plurality of the bus bar fixing sections 58 for fixing the bus bars 70 and the bus bar assembly 72. Accordingly, the bus bars 70 and the bus bar assembly 72 can be stably fixed to the frame 5.

As shown in FIGS. 3 and 8, two of the bus bar fixing sections 58 are located at the position closer to the terminal block 7 than to the center of the frame 5. Accordingly, the bus bar assembly 72 can be stably fixed to the frame 5, and the input/output terminals 71 can be stably disposed on the terminal block 7. As a result, a stable connection between the input/output terminals 71 and external terminals can be ensured.

The internal unit 10 includes all the electronic components constituting the power conversion circuit. Accordingly, all the electronic components constituting the power conversion circuit can be protected from an external force, and the power conversion apparatus easy to manufacture and excellent in maintainability can be provided.

As described above, according to the first embodiment, a power conversion apparatus can be provided which is capable of reducing an external force applied to its electronic components while improving the rigidity of its case, and which is excellent in maintainability, can be effectively mounted, and can be manufactured at low cost.

(Second Embodiment)

Next, the second embodiment is described with reference to FIGS. 20 to 26. In the second embodiment, a wire holding section 59 for holding a conductive wire 15 is additionally provided in the frame 5 of the power conversion apparatus 1.

At least one end of the conductive wire 15 is disposed within the case 4. In this embodiment, the conductive wire 15 connects the capacitor 22 with the control circuit board 6 within the case 4, so that the voltage across the capacitor 22 can be sent to the control circuit board 6 through the conductive wire 15 as a voltage signal indicative of the input voltage of the power conversion apparatus 1.

The conductive wire 15 is covered with resin except both ends thereof, and has flexibility. The conductive wire 15 is laid outside the is frame 5 to make a connection between the control circuit board 6 and the capacitor 22.

Figure 20:
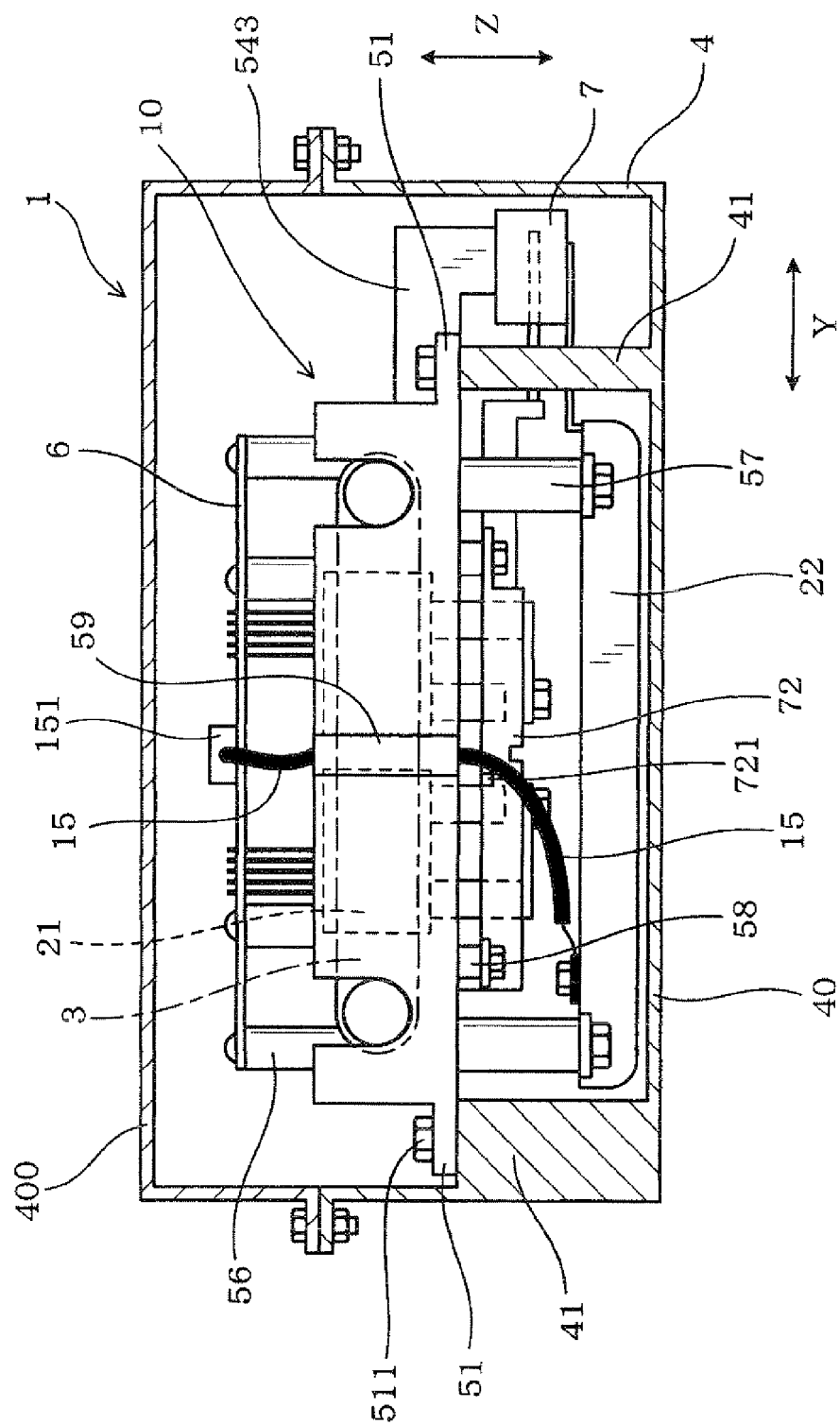
FIG. 20 is a cross-sectional view of a power conversion apparatus according to a second embodiment.
Figure 21:
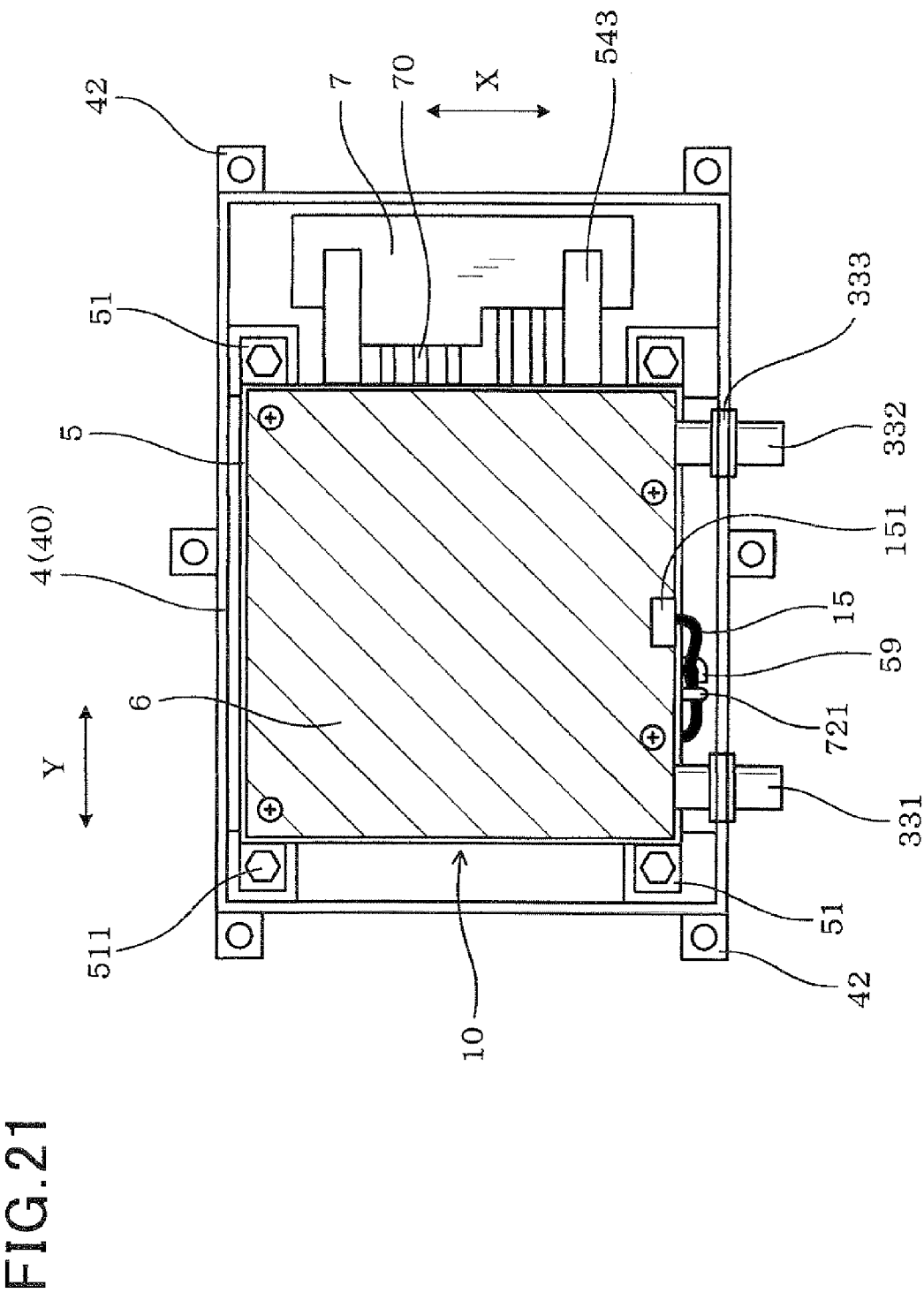
FIG. 21 is a plan view of the power conversion apparatus according to the second embodiment before a lid body is assembled.
Figure 22:
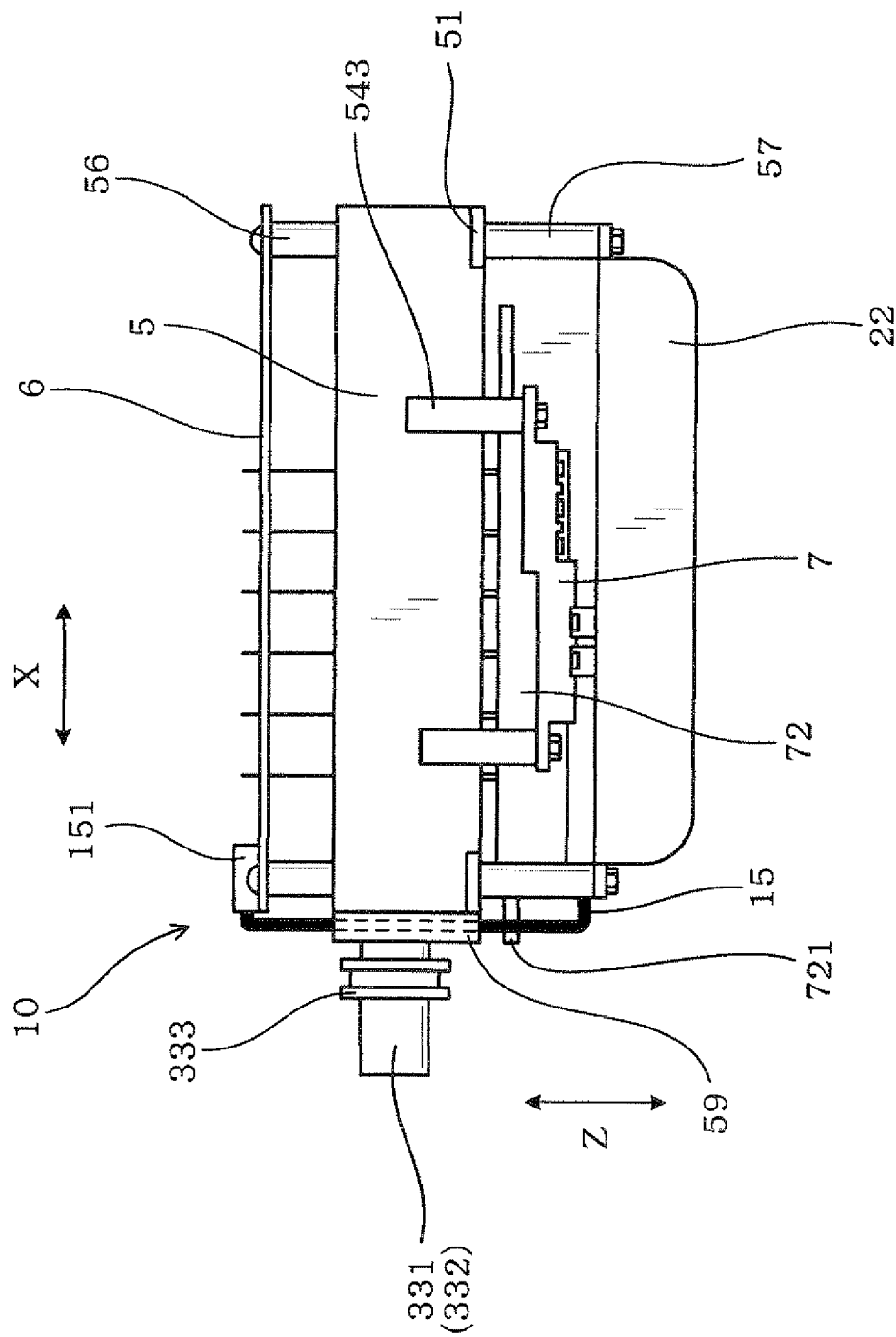
FIG. 22 is a side view of an internal unit of the power conversion apparatus according to the second embodiment.
Figure 23:
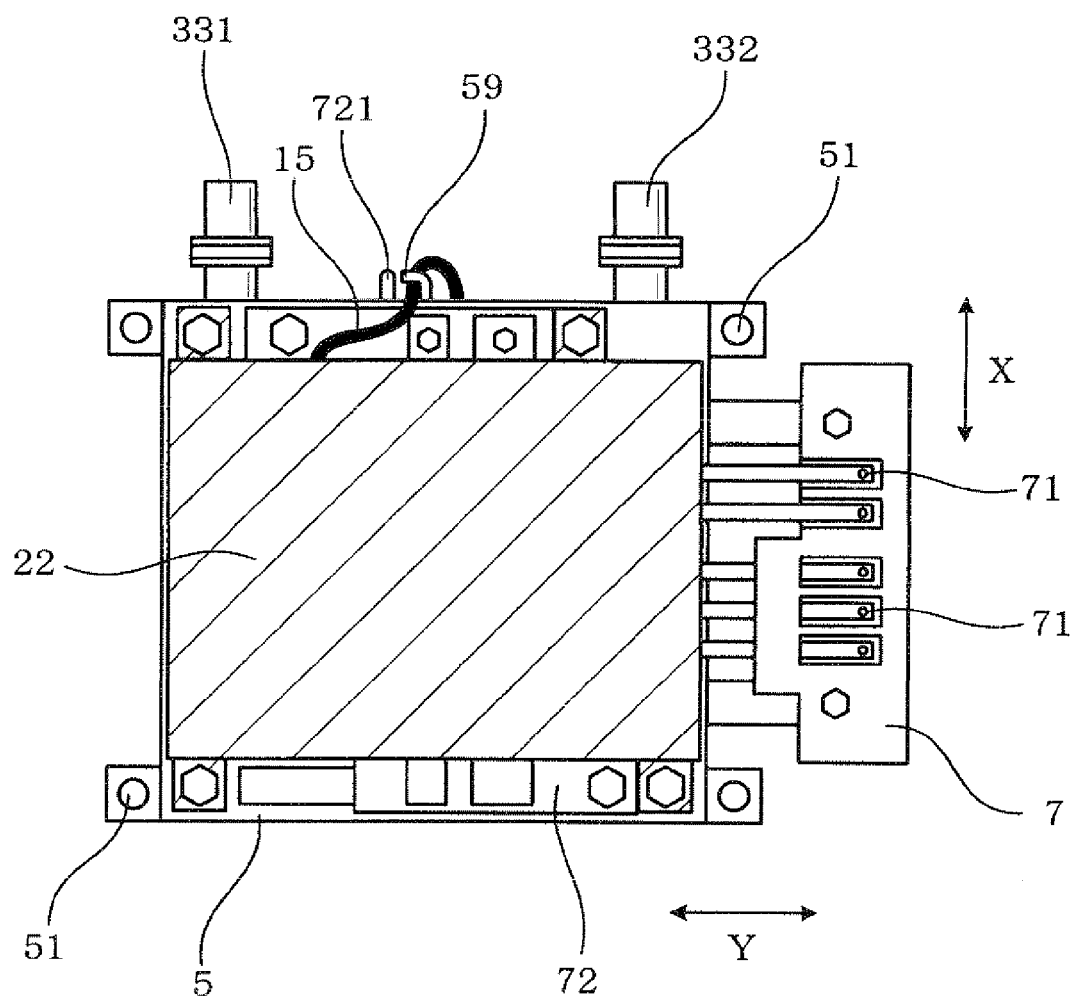
FIG. 23 is a bottom view of the internal unit of the second embodiment.
Figure 24:
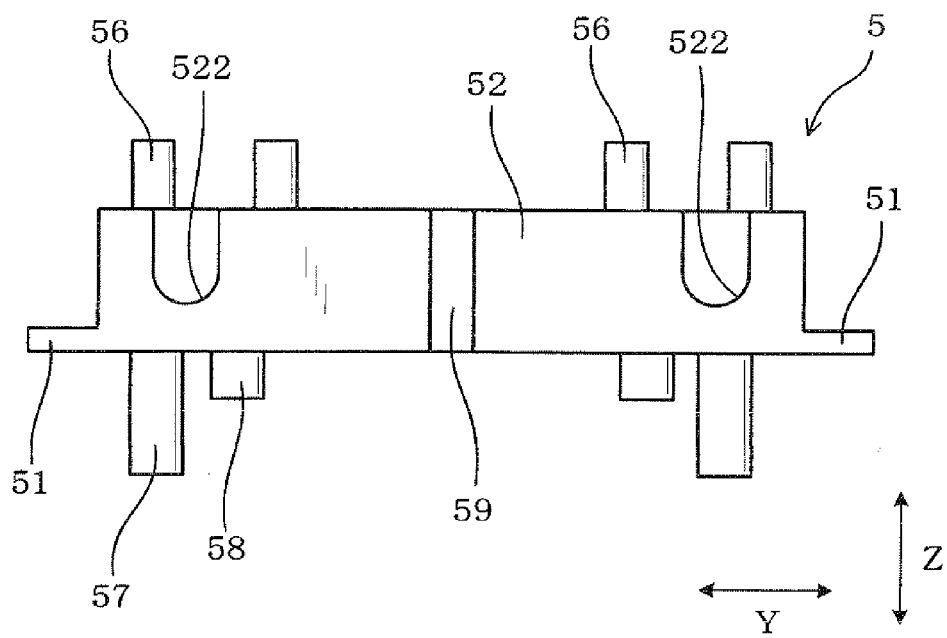
FIG. 24 is a front view of a frame of the power conversion apparatus according to the second embodiment.
Figure 25:
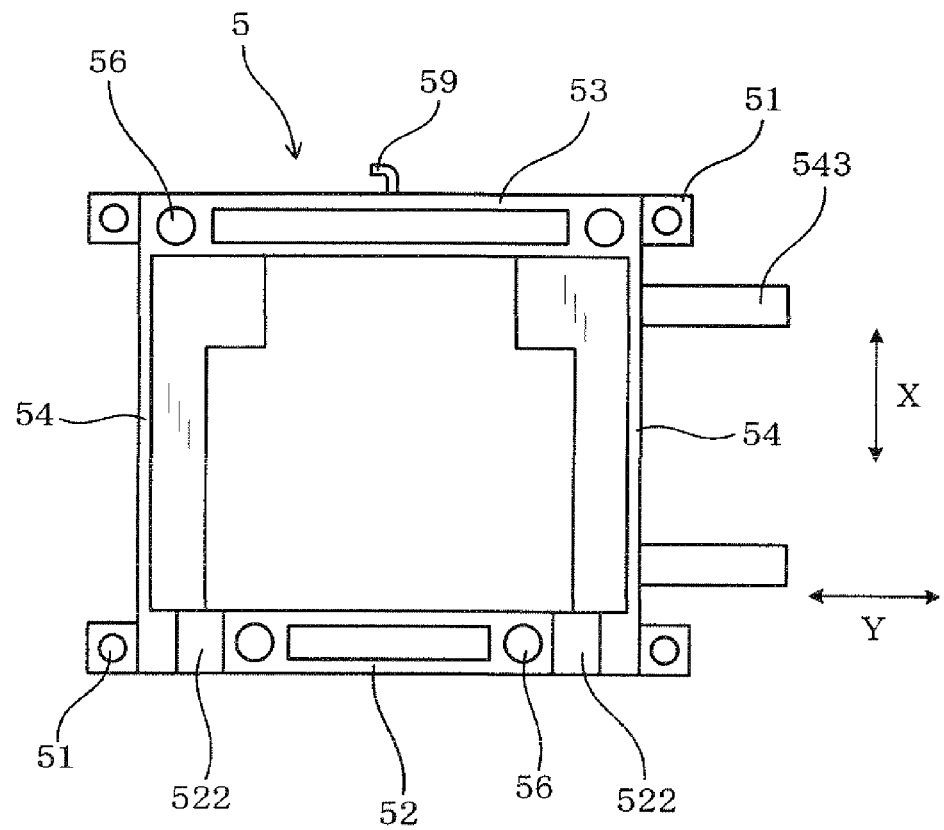
FIG. 25 is a plan view of the frame of the second embodiment.
Figure 26:
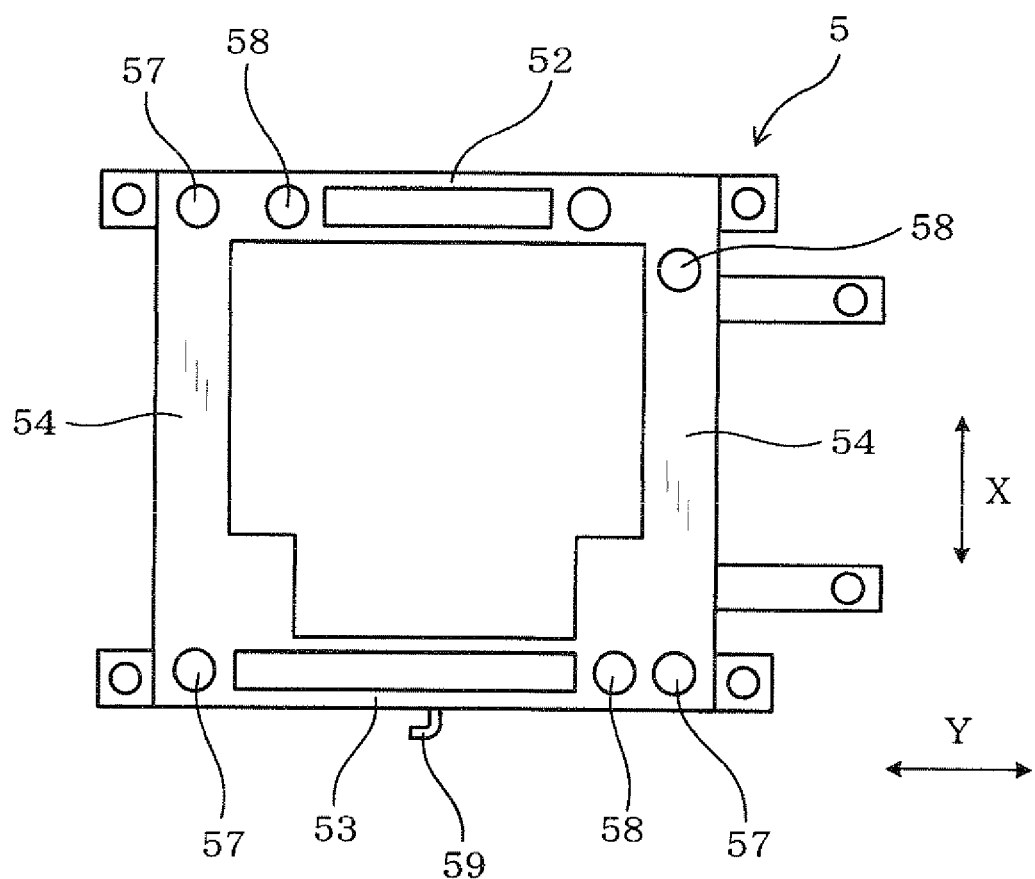
FIG. 26 is a bottom view of the frame of the second embodiment.

The wire holding section 59 has a hook-like shape when viewed from the height direction Z as shown in FIGS. 21, 23, 25 and 26, and extends in the height direction Z as shown in FIGS. 20, 22 and 24. The wire holding section 59 is formed in the front wall section 52 of the frame 5 so as to project outward therefrom. As shown in FIGS. 21 and 23, a part of the conductive wire 15 is fitted in the space between the wire holding section 59 and the front wall section 52.

As shown in FIGS. 20 to 23, the bus bar assembly 72 is formed with a forward projecting section 721 projecting forward in the stacking direction X. The forward projecting section 721 is located in a position opposite to the open side of the wire holding section 59 when viewed from the height direction Z. The forward projecting section 721 serves to prevent the conductive wire 15 from coming off the wire holding section 59.

The wire holding section 59 is located at substantially the same position in the lateral direction Y as a connector section 151 of the conductive wire 15 for connection with the control circuit board 6.

The components of this embodiment are the same as those of the first embodiment except for the above.

In the second embodiment, the conductive wire 15 can be laid along the frame 5. Accordingly, the internal unit 10 can be prevented from being caught by the conductive wire 15 when it is put in or taken out of the case 4.

Other than the above, the second embodiment provides the same advantages as those provided by the first embodiment.

It is possible that the wire holding section 59 holds a wire different from the conductive wire 15 provided for making a connection between the capacitor 22 and the control circuit board 6. The wire is holding section 59 may be formed in a shape and a position different from those described above, so that the conductive wire 15 can be laid along the lateral direction Y. The wire holding section 59 may be formed in two or more positions in the frame 5.

(Third Embodiment)

Next, the third embodiment is described with reference to FIGS. 27 to 33. In the third embodiment, an electronic component 20 is disposed inside the frame 5 together with the semiconductor modules 21.

The electronic component 20 is an electronic component other than the semiconductor modules 21, and may be a reactor, capacitor or the like.

Figure 27:
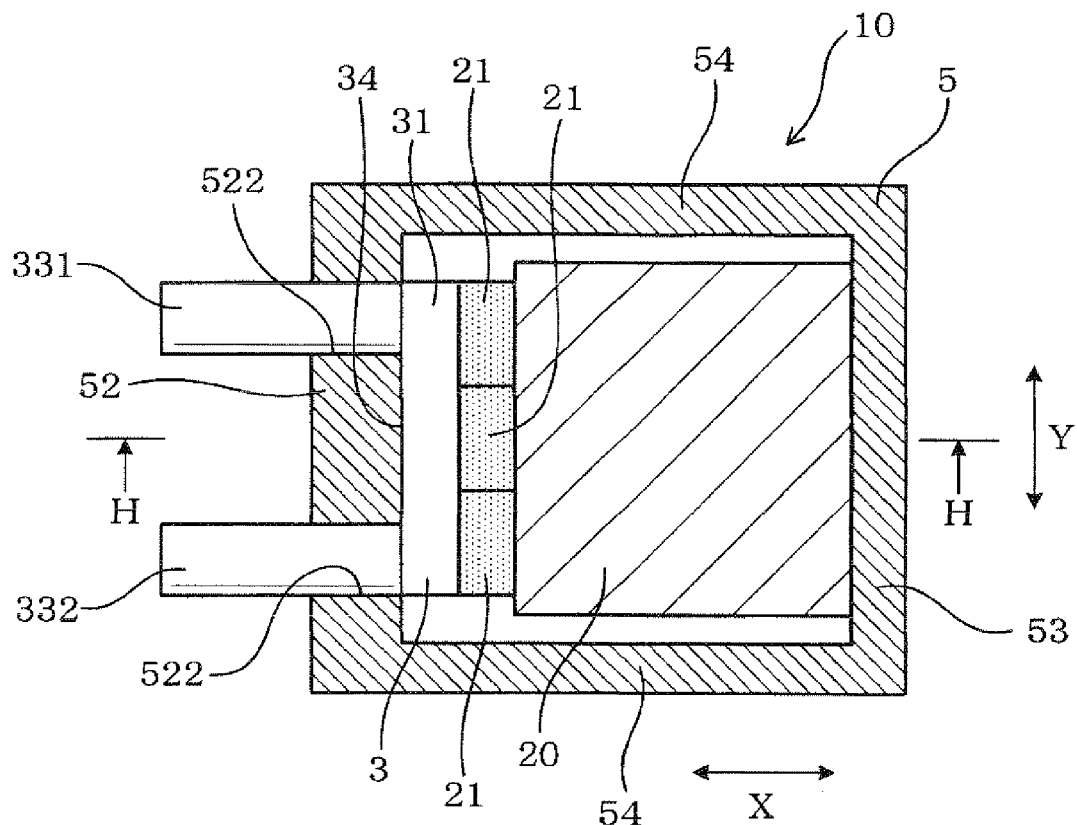
FIG. 27 is a plan view of an internal unit of a power conversion apparatus according to a third embodiment.
Figure 28:
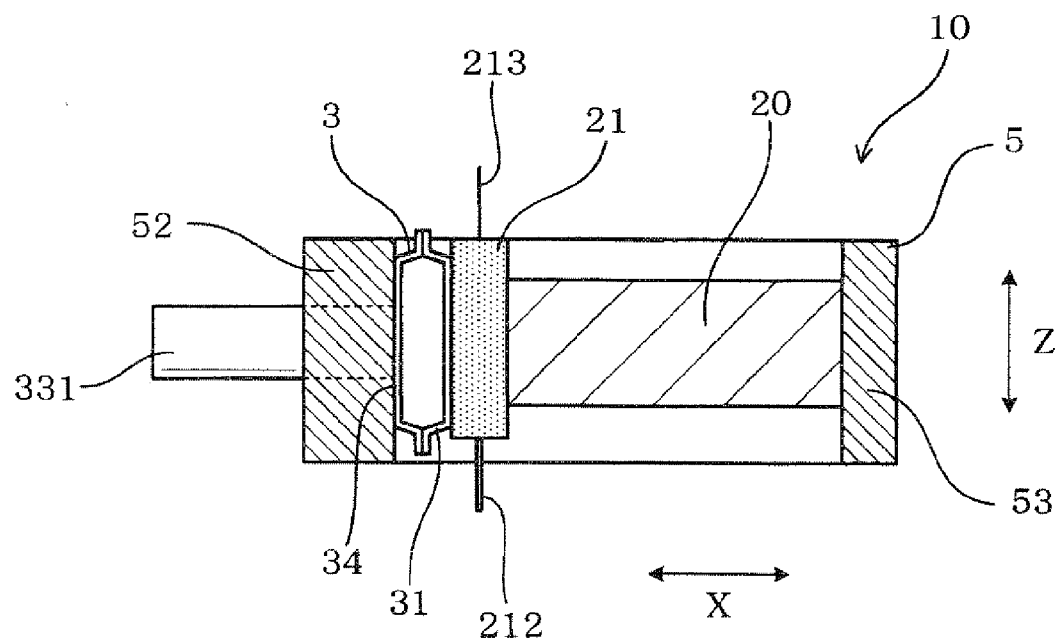
FIG. 28 is a cross-sectional view of FIG. 27 along the line H-H.

In addition, as shown in FIGS. 27 and 28, the cooler 3 is also disposed inside the frame 5. The power conversion apparatus 1 of this embodiment has a structure in which the semiconductor modules 21 are cooled from one surface thereof by the cooler 3. One surface of the cooling tube 31 constituting the cooler 3 contacts the inner surface 521 of the front wall section 52 of the frame 5. The other surface of the cooling tube 31 contacts the three semiconductor modules 21. The electronic component 20 is disposed between the semiconductor modules 21 and the rear wall section 53 of the frame 5.

The cooler 3 is formed so that the coolant introduction tube 331 and the coolant discharge tube 332 are supported by the front wall section 52 and projects outward from the front wall section 52. The wall thickness of the front wall section 52 is larger than that of the side to wall section 54.

Figure 29:
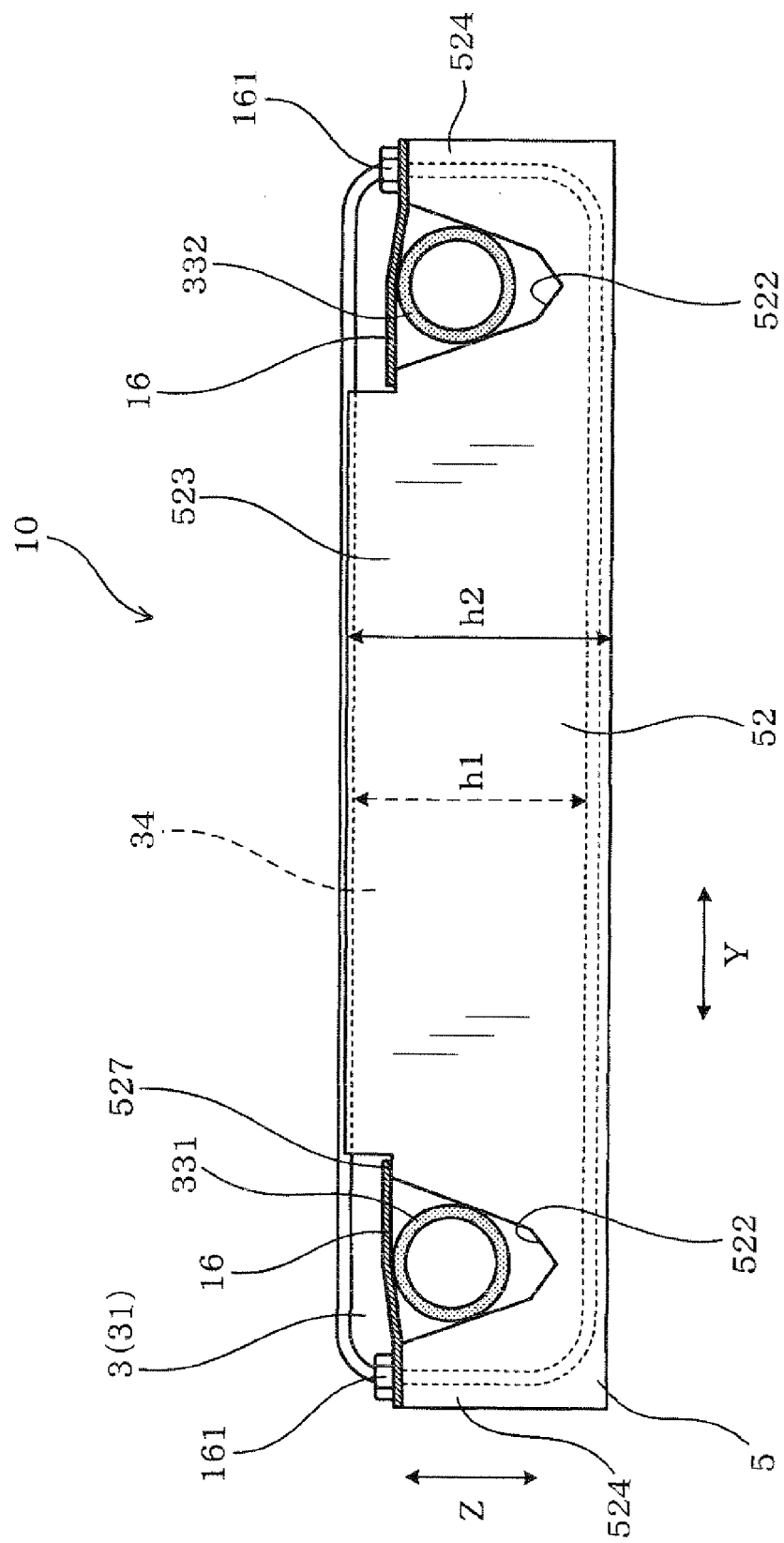
FIG. 29 is a front view of the internal unit of the third embodiment.
Figure 30:
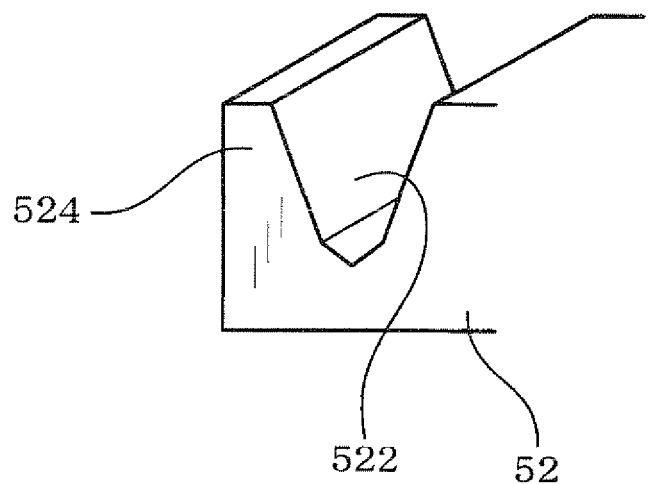
FIG. 30 is a perspective view of a concave portion for a tube having a V-shaped recess according to the third embodiment.
Figure 31:
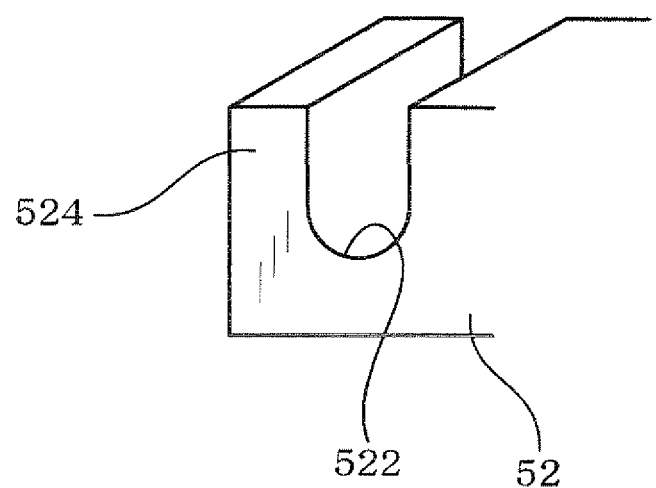
FIG. 31 is a perspective view of a concave portion for a tube having a U-shaped recess according to the third embodiment.

As shown in FIG. 29, the front wall section 52 is provided with a pair of concave portions 522 in which the coolant introduction tube 331 and the coolant discharge tube 332 are respectively disposed. Each of the concave portions 522 may be, as shown in FIG. 30, a V-shaped recess whose width becomes large toward its open side. Each of the concave portions 522 may be, as shown in FIG. 31, a U-shaped recess having side surfaces substantially parallel to each other.

The front wall section 52 contacts a front surface 34 of the cooler 3 at a central portion 523 between the pair of concave portions 522. As shown in FIGS. 28 and 29, a forming area h1 of the front surface 34 of the cooler 3 falls within a forming area h2 of the central portion 523 in the height direction Z which is perpendicular to the direction in which the concave portions 522 are arranged and the direction in which the coolant introduction tube 331 and the coolant discharge tube 332 project.

The coolant introduction tube 331 and the coolant discharge tube 332 are held by clamping members 16 with respect to the front wall section 52. The front wall section 52 has lateral adjacent portions 524 at positions adjacent to the concave portions 522 and at the sides of the side wall sections 54. End faces (upper surfaces) of the lateral adjacent portions 524 closer to the opening sides of the concave portions 522 are recessed with respect to the central portion 523. That is, the lateral adjacent portions 524 are smaller than the central portion 523 in height in the height direction Z.

Figure 32:
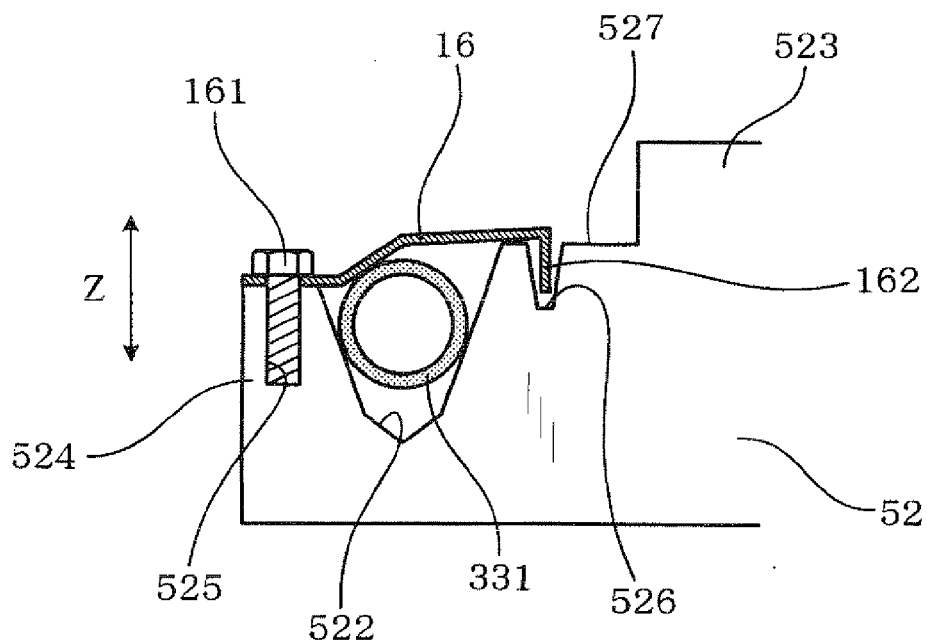
FIG. 32 is a cross-sectional view showing a state in which a coolant introduction tube is held by a clamping member according to the third embodiment.
Figure 33:
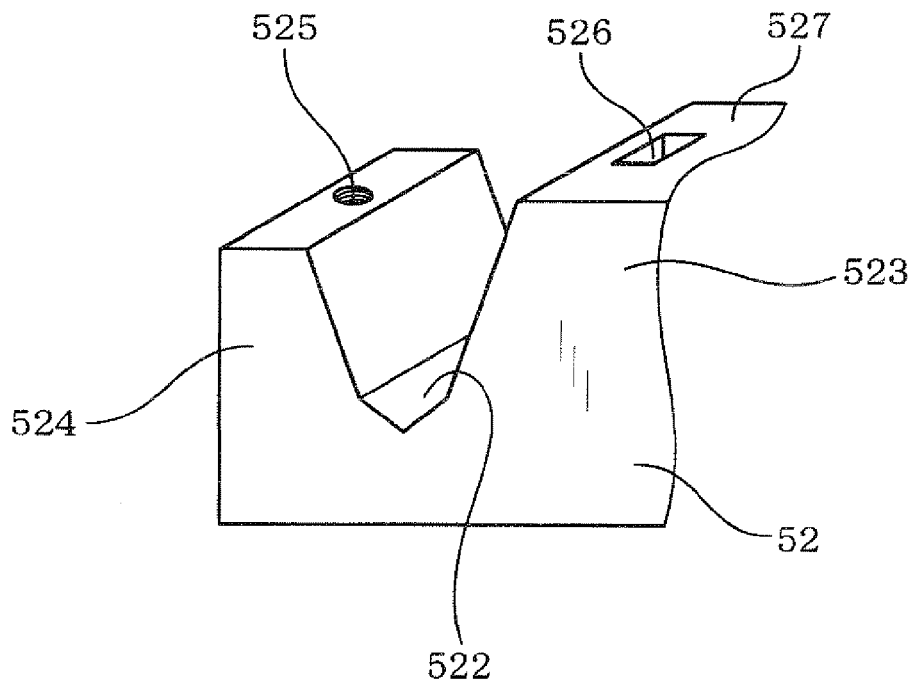
FIG. 33 is a perspective view of the concave portion, and a threaded hole and an engaged portion provided near the concave portion according to the third embodiment.

As shown in FIGS. 32 and 33, the front wall section 52 includes threaded holes 525, into which fixing screws 161 for fixing the clamping members 16 are respectively screwed, and engaged portions 526 in which engaging portions 162 for stopping turning of the clamping members 16 are respectively engaged. The threaded holes 525 are to respectively formed in the upper surfaces of the lateral adjacent portions 524. The engaged portions 526 are respectively bored in the upper surfaces of stage portions 527 formed between the concave portions 522 and the central portion 523.

The components of this embodiment are the same as those of the first embodiment except for the above.

In this embodiment, the thickness of the front wall section 52 is larger than those of the side wall sections 54. Accordingly, accuracy of positioning the coolant introduction tube 331 and the coolant discharge tube 332 can be increased without increasing the frame 5 in size and weight, whereby the power conversion apparatus 1 can be effectively mounted on a mounting portion. That is, when mounting the power conversion apparatus 1 on the mounting portion such as an engine compartment of a vehicle, the coolant introduction tube 331 and the coolant discharge tube 332 are required to be respectively connected to coolant pipes disposed around the mounting portion. Therefore, in order to effectively mount the power conversion apparatus 1, the accuracy of positioning the coolant introduction tube 331 and the coolant discharge tube 332 to the case 4 is required to be high. To meet this requirement, the thickness of the front wall section 52 supporting the coolant introduction tube 331 and the coolant discharge tube 332 is made large. Thereby, the directions in which the coolant introduction tube 331 and the coolant discharge tube 332 project are accurately determined, which enables the accuracy of positioning to be high. In this case, if the wall thicknesses of all the portions of the frame 5 are made large, the frame 5 increases in size and weight. However, the wall thickness of the side wall sections 54, which does not directly concern the positioning of the coolant introduction tube 331 and the coolant discharge tube 332, may be relatively small. Consequently, by making the wall thickness of the front wall section 52 larger than those of the side wall sections 54, accuracy of positioning the coolant introduction tube 331 and the coolant discharge tube 332 can be increased without increasing the frame 5 in size and weight, whereby the power conversion apparatus 1 can be effectively mounted on a mounting portion.

In addition, since the front wall section 52 is provided with a pair of concave portions 522, accuracy of positioning the coolant introduction tube 331 and the coolant discharge tube 332 can be further improved.

The front wall section 52 contacts the front surface 34 of the cooler 3 at a central portion 523 between the pair of concave portions 522. The forming area hi of the front surface 34 of the cooler 3 falls within the forming area h2 of the central portion 523 in the height direction Z (FIGS. 28 and 29). Hence, the front surface 34 of the cooler 3 can contact the front wall section 52 in a state where the front surface 34 does not protrude over the central portion 523 of the front wall section 52 in the height direction Z. Accordingly, deformation of the cooler 3 can be prevented, thereby ensuring cooling efficiency of the semiconductor modules 21 by the cooler 3. That is, if the front surface 34 of the cooler 3 protrudes over the central portion 523 of the front wall section 52 in the height direction, the cooler 3 can be deformed at the end of the front wall section 52 positioned in the height direction Z. To solve this problem, by making the forming area h1 of the front surface 34 of the cooler 3 fall within the forming area h2 of the central portion 523, deformation of the cooler 3 can be prevented, thereby preventing the cooling efficiency of the semiconductor modules 21 from being lowered.

In addition, the coolant introduction tube 331 and the coolant discharge tube 332 are held by the clamping members 16 with respect to the front wall section 52. The front wall section 52 has lateral adjacent portions 524 at positions adjacent to the concave portions 522 and at the sides of the side wall sections 54. End faces (upper surfaces) of the lateral adjacent portions 524 closer to the opening sides of the concave portions 522 are recessed with respect to central portion 523. Hence, by fixing the clamping members 16 to the lateral adjacent portions 524, the amount of protrusion of the clamping members 16 from the front wall section 52 in the height direction Z can be restricted. Consequently, the clamping members 16 are prevented from interfering with other components (for example, control circuit board), thereby facilitating miniaturization of the power conversion apparatus 1.

In addition, the front wall section 52 includes threaded holes 525, into which fixing screws 161 for fixing the clamping members 16 are respectively screwed, and engaged portions 526 in which engaging portions 162 for stopping turn of the clamping members 16 are respectively engaged. Hence, the coolant introduction tube 331 and the coolant discharge tube 332 can be stably fastened to the front wall section 52. Consequently, when the internal unit 10 is installed in the case 4, displacement of the coolant introduction tube 331 and the coolant discharge tube 332 from the frame 5 can be prevented.

Other than the above, the third embodiment provides the same advantages as those provided by the first embodiment.

(Fourth Embodiment)

Figure 34:
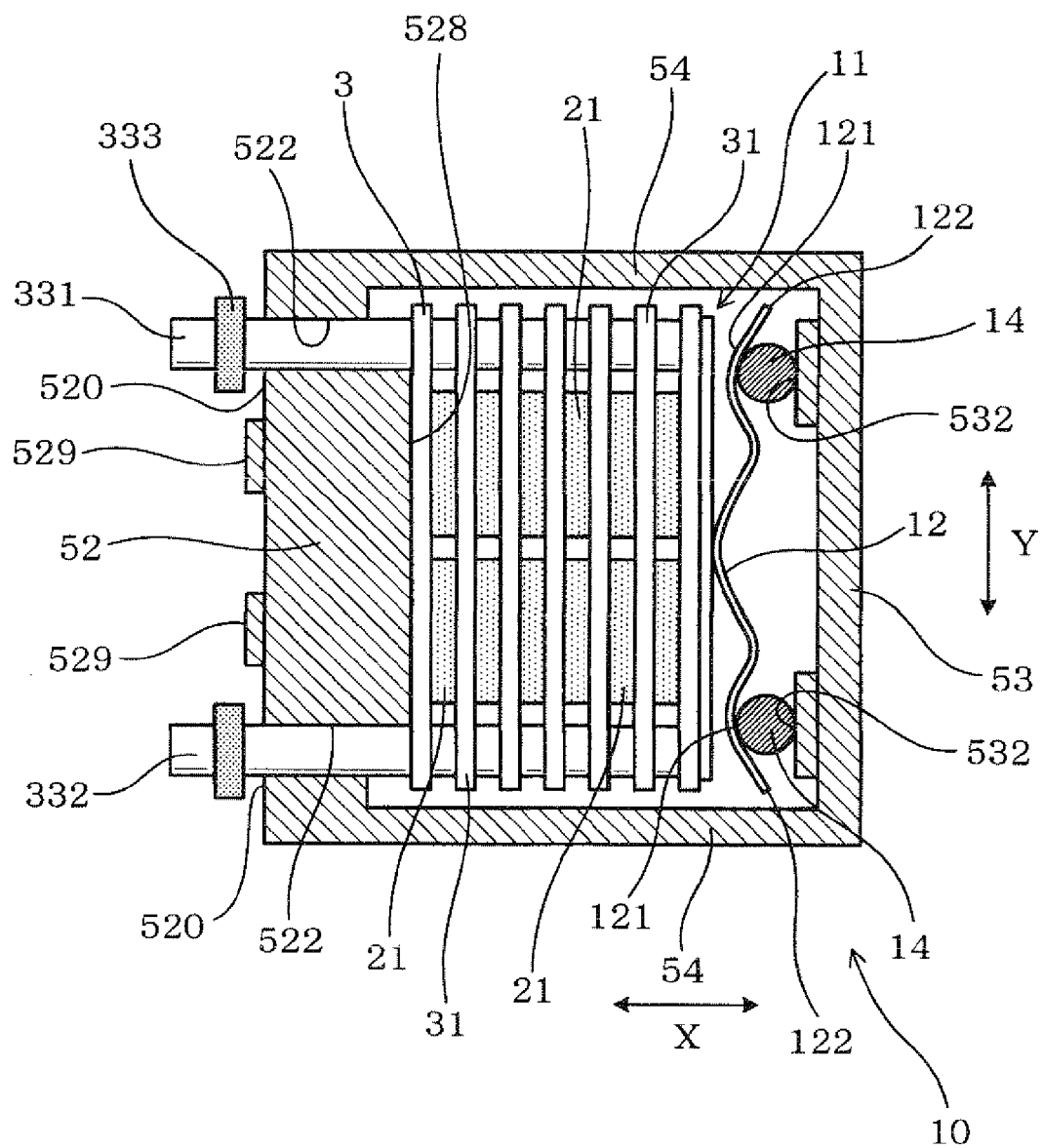
FIG. 34 is a plan view of an internal unit according to a fourth embodiment.
Figure 35:
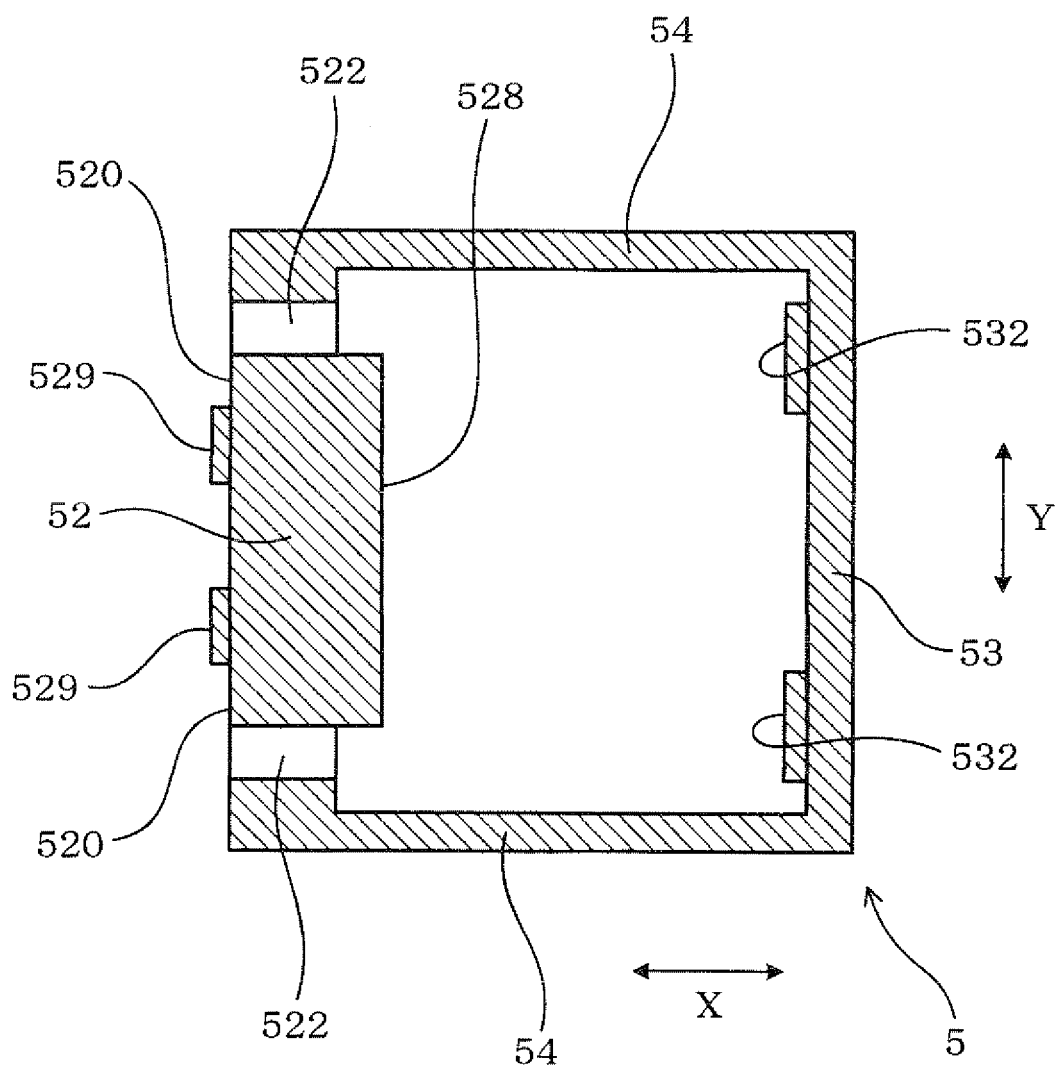
FIG. 35 is a plan view of a frame of the fourth embodiment.

Next, the fourth embodiment is described with reference to FIGS. 34 and 35. As shown in FIGS. 34 and 35, in the internal unit 10, the stacked body 11, in which the cooling tubes 31 and the semiconductor modules 21 are stacked alternately, is provided inside the frame 5.

As shown in FIG. 34, the internal unit 10 includes the pressure member 12 for pressing the stacked body 11 in the stacking direction X. The pressure member 12 is interposed between the rear wall section 53 of the frame 5 and the rear end of the stacked body 11 in the stacking direction X. The stacked body 11 is supported by the front wall section 52 at the front end thereof in the stacking direction X.

As shown FIG. 35, the rear wall section 53 includes rear contact surfaces 532 having flat surfaces which the pressure member 12 contacts. The front wall section 52 includes a front contact surface 528 having a flat surface which the front end of the stacked body 11 in the stacking direction X contacts. In addition, the rear contact surfaces 532 and the front contact surface 528 are parallel to each other. That is, the rear contact surfaces 532 and the front contact surface 528 are flatter than other surfaces due to a grinding process, polishing process or the like. The rear contact surfaces 532 and the front contact surface 528 have parallelism therebetween higher than that between other surfaces.

The front contact surface 528 projects from the inner surface of the front wall section 52 around thereof to the stacked body 11. The rear contact surfaces 532 also project from the inner surface of the rear wall section 53 around thereof toward the stacked body 11.

The front wall section 52 includes front outer side surfaces 529 parallel to the front contact surface 528 at an outer side surface thereof. As in the case of the rear contact surfaces 532 and the front contact surface 528, the front outer side surfaces 529 are flatter than other surfaces due to a grinding process, polishing process or the like. The front outer side surfaces 529 have high parallelism with respect to the rear contact surfaces 532 and the front contact surface 528.

The front outer side surfaces 529 are formed at two positions side by side in the lateral direction Y. The two front outer side surfaces 529 are formed on the same plane. The rear contact surfaces 532 also are formed at two positions side by side in the lateral direction Y. The two rear contact surfaces 532 are formed on the same plane.

The coolant introduction tube 331 and the coolant discharge tube 332 are provided so as to project from the case 4 (see FIGS. 19 and 21). One annular packing 333 seals a clearance between the coolant introduction tube 331 and the case 4. The other annular packing 333 seals a clearance between the coolant discharge tube 332 and the case 4. As shown in FIG. 34, the outer side surface of the front wall section 52 has recessed surfaces 520, which are recessed backward, at positions opposed to the annular packing 333.

That is, the recessed surfaces 520 are recessed from the front outer side surfaces 529 which are not opposed to the annular packing 333.

When fixing the stacked body 11 to the frame 5 constituted as described above, the stacked body 11 is disposed inside the frame 5 so that the front surface of the stacked body 11, that is, the front surface 34 of the cooler 3, is opposed to the front contact surface 528 of the front wall section 52 of the frame 5. Next, the pressure member 12 is disposed between the rear end of the stacked body 11 and the rear wall section 53. Next, both edges 122 of the pressure member 12 are pressed forward. Thereby, the front surface 34 of the cooler 3 is pressed against the front contact surface 528, and the stacked body 11 is compressed in the stacking direction X. At the same time, the pressure member 12 is elastically deformed. In this case, the frame 5 is supported at the front outer side surfaces 529 of the front wall section 52 by a support jig (not shown).

Next, when the pressure member 12 is elastically deformed by a predetermined amount, a pair of support pins 14 is interposed between both ends 121 of the pressure member 12 and the rear wall section 53. The support pins 14 are respectively in contact with the rear contact surfaces 532 of the rear wall section 53. Next, by applying the restoring force of the pressure member 12 between the rear end of the stacked body 11 and the rear wall section 53, as shown FIG. 34, the stacked body 11 can be fixed to the frame 5 in a state where the stacked body 11 is pressed in the stacking direction X.

The components of this embodiment are the same as those of the third embodiment except for the above.

In this embodiment, the reaction force of the pressure member 12 can be supported by the frame 5. Accordingly, the case 4 is not required to have rigidity large enough to bear the reaction force of the pressure member 12, to increase the thickness thereof, or to include ribs. This makes it possible to make the case 4 light in weight and less expensive.

In addition, the rear wall section 53 includes the rear contact surfaces 532, and the front wall section 52 includes the front contact surface 528. The rear contact surfaces 532 and the front contact surface 528 are parallel to each other. Hence, since the stacked body can be pressed straight in the stacking direction X, the semiconductor modules 21 and the cooling tubes 31 contact each other with pressure in a state where the surfaces thereof contact each other with high parallelism. Thereby, cooling efficiency of the semiconductor modules 21 can be improved.

The front contact surface 528 projects from the inner surface of the front wall section 52 around thereof to the stacked body 11. Hence, the frame 5 and the stacked body 11 can be prevented from being interfering with each other at portions other than a portion at which the stacked body 11 and the front wall section 52 contact each other.

The front wall section 52 includes the front outer side surfaces 529 at its outer side surface. Hence, when the pressure member 12 is incorporated while the stacked body 11 in the frame 5 is pressed to the front wall section 52, the front outer side surfaces 529 can be utilized as surfaces for supporting the frame 5 from the side opposed to the direction in which the stacked body 11 is pressed. Since the front outer side surfaces 529 are parallel to the front contact surface 528, the front outer side surfaces 529 can receive the pressing force directly.

The outer side surface of the front wall section 52 has recessed surfaces 520 at the positions opposed to the annular packing 333. Hence, durability of the annular packing 333 can be increased, while the annular packing 333 can be accurately and easily disposed at desired positions. That is, from the viewpoint of the miniaturization of the power conversion apparatus 1, it is preferable that the clearance between the case 4 and the frame 5 in the stacking direction X is as small as possible. In this case, when the annular packing 333 is fixed to the coolant introduction tube 331 and the coolant discharge tube 332, the annular packing 333 is pushed to the positions in the vicinity of the frame 5. However, if the annular packing 333 is brought into contact with the frame 5, the annular packing 333 is easily worn due to the interference with the frame 5. In addition, if the annular packing 333 is brought into contact with the frame 5, the positions of the annular packing 333 can be displaced due to the elastic force of the annular packing 333. The above problems can be solved by providing the recessed surfaces 520 at the outer side surface of the front wall section 52.

Other than the above, the fourth embodiment provides the same advantages as those provided by the third embodiment.

(Fifth Embodiment)

Figure 36:
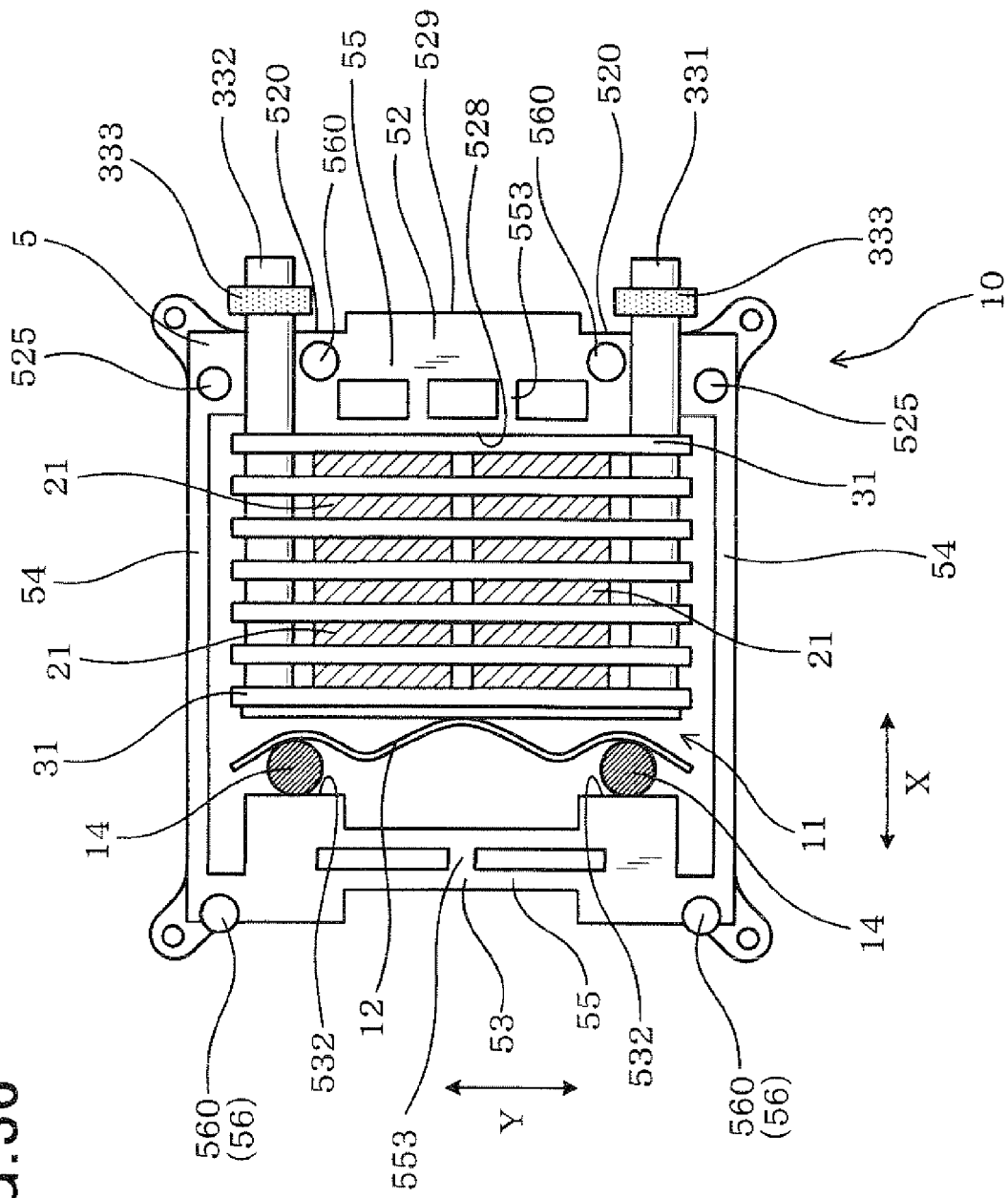
FIG. 36 is a plan view of an internal unit according to a fifth embodiment.
Figure 37:
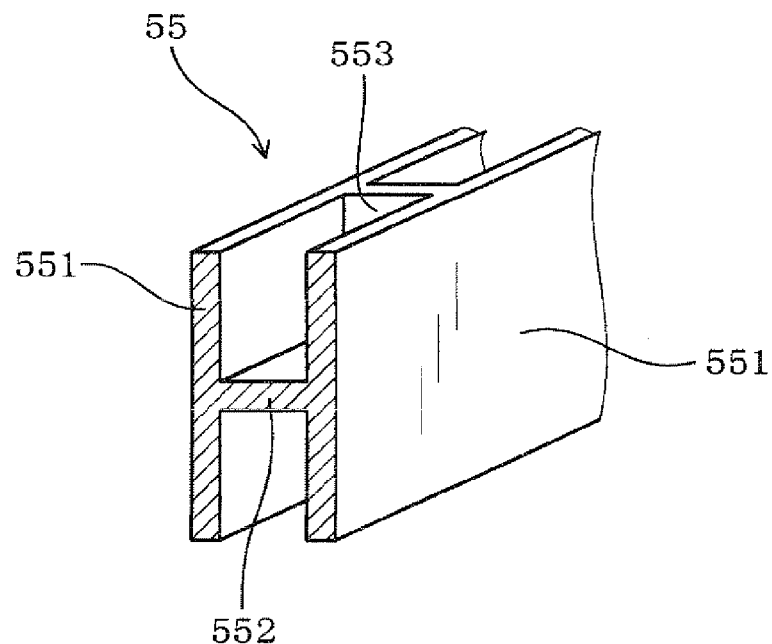
FIG. 37 is a perspective view of an H-shaped wall section having a rib according to the fifth embodiment.
Figure 38:
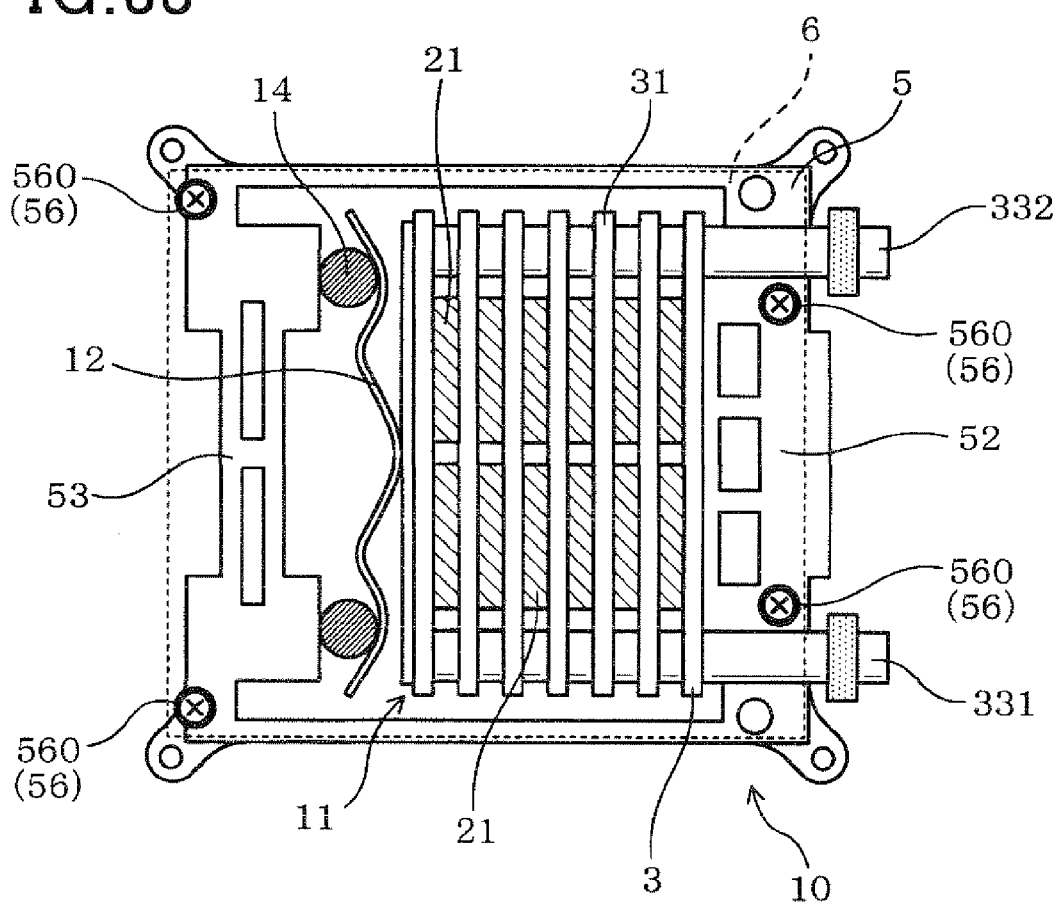
FIG. 38 is a plan view of an internal unit in which a control circuit board is fixed according to the fifth embodiment.

Next, the fifth embodiment is described with reference to FIGS. 36 to 38. As shown in FIGS. 36 to 38, a part of the front wall section 52 forms an H-shaped wall section 55 having a substantially H-shaped cross section. Furthermore, the H-shaped wall section 55 has ribs 553.

That is, as shown in FIG. 37, the front wall section 52 is constituted of a pair of longitudinal plate sections 551 perpendicular to the stacking direction X, and a connecting section 552 connecting these longitudinal plate sections 551 together at the center of the longitudinal plate sections 551. Furthermore, the ribs 553, which are orthogonal to the longitudinal plate sections 551 and the connecting section 552, are partially provided between the pair of longitudinal plate sections 551 and the connecting section 552.

A part of the rear wall section 53 also forms the H-shaped wall section 55 having a substantially H-shaped cross section. Furthermore, the H-shaped wall section 55 is provided with the rib 553. The H-shaped wall section 55 of the rear wall section 53 is provided with the rib 553 at the center position of the rear wall section 53 in the longitudinal direction of the rear wall section 53 (lateral direction Y).

In addition, the H-shaped wall section 55 of the front wall section 52 is provided with the ribs 553 at two positions of the front wall section 52 in the longitudinal direction of the front wall section 52 (lateral direction Y).

The frame 5 includes component fixing sections 560 (board fixing sections 56, capacitor fixing sections 57, bus bar fixing sections 58) for respectively fixing the electronic components (control circuit board 6, capacitor 22, bus bar assembly 72) constituting the power conversion circuit at both sides of the frame 5 with reference to (with respect to) the height direction Z (see FIGS. 2, 3, 14 and 15). At least one component fixing section 560 is disposed at both the sides of the front wall section 52 and rear wall section 53 with reference to (with respect to) the height direction Z.

In this embodiment, as in the case of the fourth embodiment, the frame 5 is formed with the rear contact surfaces 532, the front contact surface 528, and the front outer side surface 529. Note that, in this embodiment, only one front outer side surface 529 is formed.

The components of this embodiment are the same as those of the fourth embodiment except for the above. Note that, in FIGS. 36 and 38, the damping member 16 is not shown.

In this embodiment, at least part of the front wall section 52 forms an H-shaped wall section 55. The H-shaped wall section 55 is partially provided with the ribs 553. This makes it possible to make the frame 5 light in weight, while ensuring the front wall section 52 to have high rigidity.

The frame 5 is provided with the component fixing sections 560 at both sides thereof with reference to the height directions Z. At least one component fixing section 560 is disposed at both sides of the front wall section 52 with reference to the height direction Z. Hence, more electronic components can be incorporated into the internal unit 10 without protruding over the frame 5 in the stacking direction X or the lateral direction Y. In addition, since the component fixing sections 560 are disposed at both sides of the thick front wall section 52 with reference to the height direction Z, providing the component fixing sections 560 can prevent the frame 5 from increasing in size.

At least one component fixing section 560 is also disposed at both sides of the rear wall section 53 with reference to the height direction Z. Hence, the electronic components can be fixed to the frame 5 within the area defined by the component fixing sections 560 disposed on the front wall section 52 and the component fixing sections 560 disposed on the rear wall section 53. Thereby, the rigidity of the frame 5 can be improved with respect to the load in the stacking direction X, and the frame 5 can be prevented from being deformed. For example, as shown in FIG. 38, the rigidity of the frame 5 in the stacking direction X can be improved by fixing the control circuit board 6 to the frame 5 within the area defined by the component fixing sections 56 disposed on the front wall section 52 and the component fixing sections 56 disposed on the rear wall section 53. The rigidity of the frame 5 in the stacking direction X can be further improved by fixing the capacitor 22 to the capacitor fixing sections 57 provided on the front wall section 52 and the rear wall section 53 or by fixing the bus bar assembly 72 to the bus bar fixing sections 58 provided on the front wall section 52 and the rear wall section 53.

Other than the above, the fifth embodiment provides the same advantages as those provided by the fourth embodiment.

(Sixth Embodiment)

Figure 39:
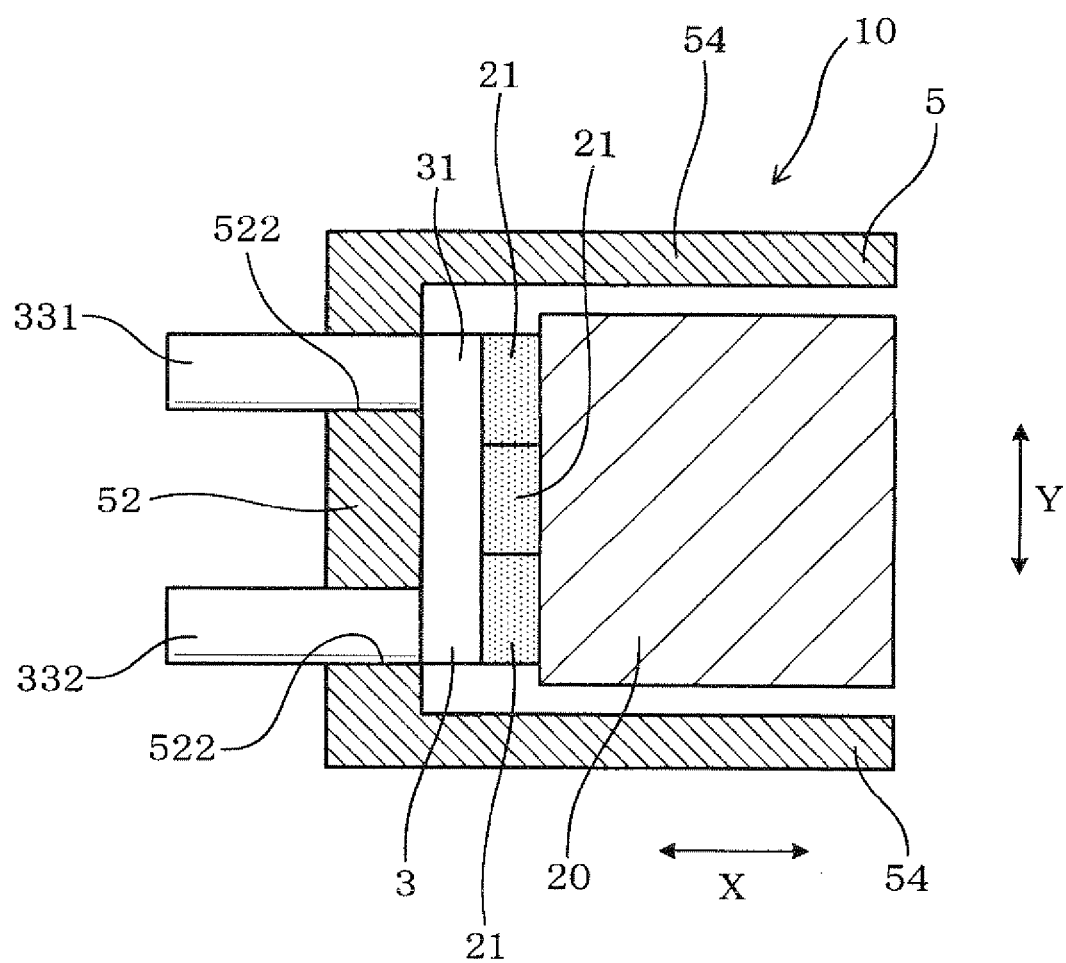
FIG. 39 is a plan view of an internal unit according to a sixth embodiment.

Next, the sixth embodiment is described with reference to FIG. 39. In the sixth embodiment, the frame 5 is constituted of the front wall section 52 and the pair of side wall sections 54, and is formed in a shape to surround the electronic components (semiconductor modules 21 and electronic component 20) constituting the internal unit 10 from three sides.

That is, the frame 5 of this embodiment does not have the rear wall section 53 which the frame 5 of the power conversion apparatus 1 (FIG. 27) described in the third embodiment has. Hence, the frame 5 has a substantially U-shape turned sideways when viewed from the height direction Z.

In this case, both the coolant introduction tube 331 and the coolant discharge tube 332 may be supported by any one of the front wall section 52 and the side wall sections 54. Alternatively, the coolant introduction tube 331 and the coolant discharge tube 332 may be separately supported by any two of the front wall section 52 and the side wall sections 54. For example, the coolant introduction tube 331 is supported by the front wall section 52, while the coolant discharge tube 332 is supported by one of the side wall sections 54. Alternatively, the coolant introduction tube 331 is supported by one of the side wall sections 54, while the coolant discharge tube 332 is supported by the other of the side wall sections 54.

The components of this embodiment are the same as those of the third embodiment except for the above.

This embodiment makes it possible to make the frame 5 light in weight and compact in size.

Other than the above, the sixth embodiment provides the same advantages as those provided by the fourth embodiment.

(Seventh Embodiment)

Figure 40:
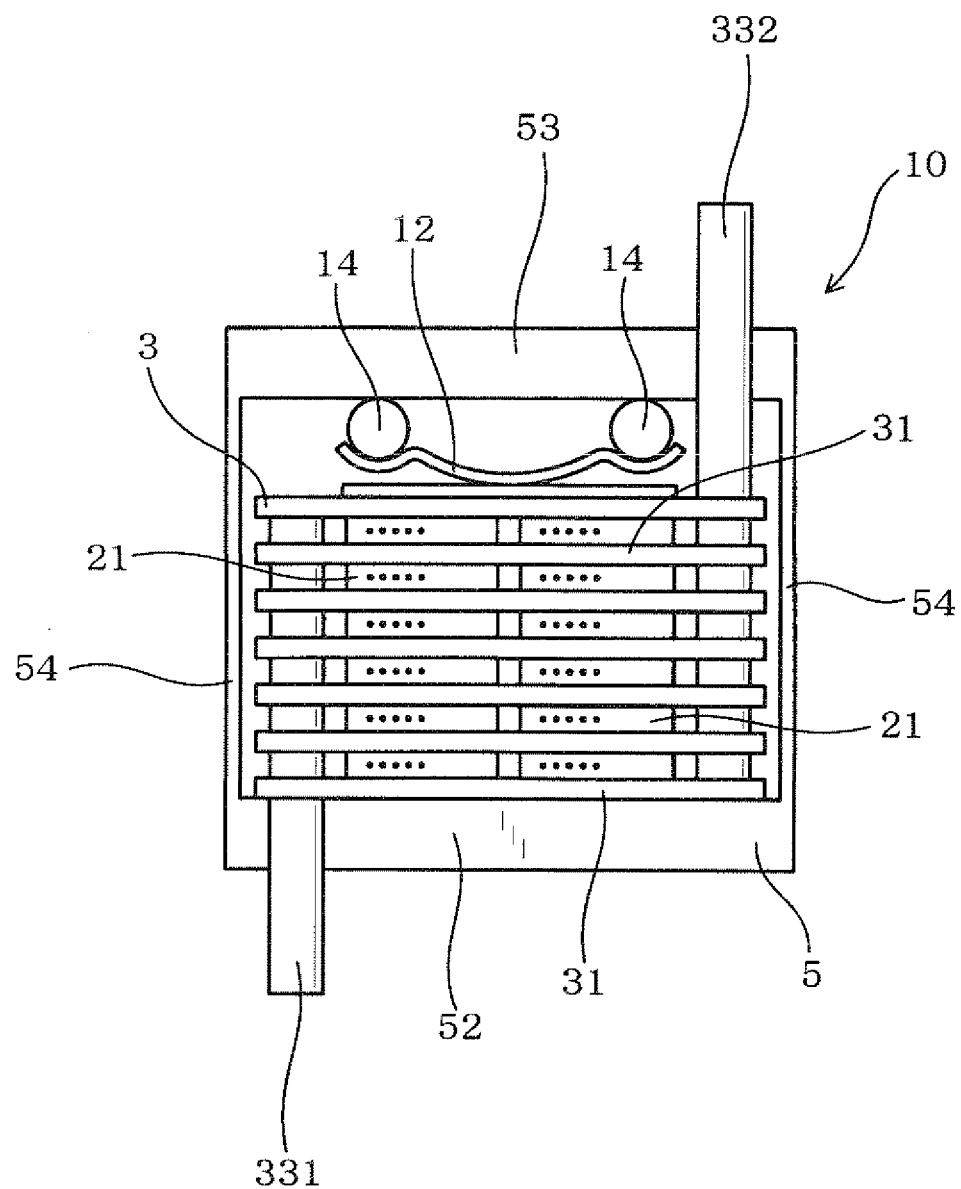
FIG. 40 is a plan view of an internal unit according to a seventh embodiment.
Figure 41:
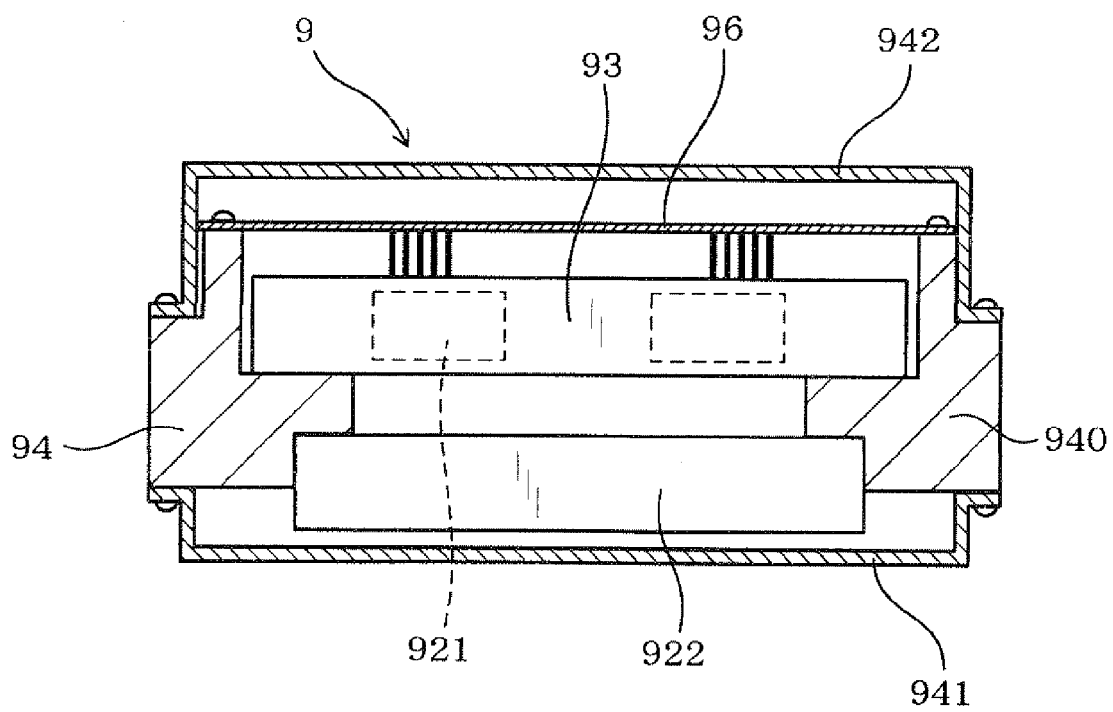
FIG. 41 is a cross-sectional view of a power conversion apparatus according to a conventional art.

Next, the seventh embodiment is described with reference to FIG. 40. In the seventh embodiment, the coolant introduction tube 331 and the coolant discharge tube 332 project in the respective directions opposite to each other.

That is, in the cooler 3 in which the cooling tubes 31 are stacked, the coolant introduction tube 331 projects forward from the front end of the cooler 3, and the coolant discharge tube 332 projects backward from the rear end of the cooler 3. The coolant introduction tube 331 is supported by the front wall section 52 and projects outward from the front wall section 52 of the frame 5. The coolant discharge tube 332 is supported by the rear wall section 53 and projects outward from the rear wall section 53 of the frame 5.

Thicknesses of the front wall section 52 and the rear wall section 53 are larger than those of the side wall sections 54.

The components of this embodiment are the same as those of the first embodiment except for the above.

According to this embodiment, when the coolant introduction tube 331 and the coolant discharge tube 332 project in the opposite directions, positional accuracy of the coolant introduction tube 331 and the coolant discharge tube 332 can be ensured.

Other than the above, the seventh embodiment provides the same advantages as those provided by the first embodiment Conversely, the coolant introduction tube 331 may be supported by the rear wall section 53 and may project backward. The coolant discharge tube 332 may be supported by the front wall section 52 and may project forward. This case can provide the same advantages as those provided by the seventh embodiment.

In the above embodiments, the cooler is constituted as the stacked body of the cooling tubes and the semiconductor modules. However, the present invention is also applicable to a power conversion apparatus including a cooling structure in which a semiconductor element, a metal body thermally coupled to this semiconductor element and a sealing member are integrated as a sealed semiconductor-integrated cooling structure having a coolant channel allowing coolant to flow toward the metal body, and a plurality of such sealed semiconductor-integrated cooling structures are stacked such that the sealed semiconductor-integrated cooling structures and coolant passages alternate in the stacking direction.

In the above embodiments, the pressure member is disposed between the real wall section and the rear end of the stacked body. However, the pressure member may be disposed between the front wall section and the front end of the stacked body. In this case, when the coolant introduction tube and the coolant discharge tube are disposed side by side, the pressure member may be disposed between the front wall section and the front end of the stacked body so as to be located between the coolant introduction tube and the coolant discharge tube.

Hereinafter, aspects of the above-described embodiments will be summarized.

As a first aspect of the embodiment, a power conversion apparatus includes: electronic components configuring a power conversion circuit; a cooler for cooling at least part of the electronic components; and a case housing the electronic components and the cooler; wherein the at least part of the electronic components and the cooler are fixed to and integrated in a frame as an internal unit, the internal unit is fixed within the case through the frame, the frame has such a shape that the at least part of the electronic components configuring the internal unit is surrounded by the frame, and includes a first wall section, and a second wall section and a third wall section is which extend from both sides of the first wall section, the cooler includes a coolant introduction tube introducing coolant into the cooler and a coolant discharge tube discharging the coolant from the cooler, the coolant introduction tube and the coolant discharge tube projecting outward from the frame, the first to third wall sections include a support wall section which supports at least one of the coolant introduction tube and the coolant discharge tube, and a frame wall section which does not support the coolant introduction tube and the coolant discharge tube, and the thickness of the support wall section is larger than the thickness of the frame wall section.

As a second aspect of the embodiment, a power conversion apparatus includes: electronic components configuring a power conversion circuit; a cooler for cooling at least part of the electronic components; and a case housing the electronic components and the cooler; wherein the at least part of the electronic components and the cooler are fixed to and integrated in a frame as an internal unit, the internal unit is fixed within the case through the frame, the frame has such a shape that the at least part of the electronic components configuring the internal unit is surrounded by the frame, and includes a front wall section and a pair of side wall sections extending backward from both sides of the front wall section, the cooler is formed so that a coolant introduction tube and a coolant discharge tube are supported by the front wall section and projects outward from the front wall section, the coolant introduction tube introducing coolant into the cooler, and the coolant discharge tube discharging the coolant from the cooler, and the thickness of the front wall section is larger than the thicknesses of the side wail sections.

The power conversion apparatus has the structure in which at least part of the electronic components and the cooler are fixed to the frame, so that the electronic components, the cooler and the frame are integrated as the internal unit. The internal unit is fixed within the case. Accordingly, since the internal unit serves as a beam of the case, the rigidity of the case can be improved.

That is, since the case can have a sufficient rigidity without being increased in the wall thickness, or being provided with reinforcing ribs, it is possible to reduce the material cost and the manufacturing cost of the case, and also to reduce the weight of the case.

Fixing the internal unit to the case makes it possible to suppress external force applied to the respective electronic components and the cooler included in the internal unit through the case. This makes it possible to suppress the electronic components and the cooler included in the internal unit from being affected by external vibration and thermal stress.

The electronic components and other members are not directly fixed to the case. The electronic components and the like are fixed to the frame, and the internal unit is assembled. Thereafter, the internal unit is fixed to the case, whereby the power conversion apparatus can be obtained. Accordingly, assembling work of the power conversion apparatus 1 becomes easy.

Also, maintenance of the power conversion apparatus becomes easy, because the whole internal unit can be removed from the case for maintenance work.

Since assembly and maintenance of the power conversion apparatus can be carried out outside the case, the case does not have to be provided with two or more lids. Accordingly, the sealing surface between the case body and the lid body can be one in number. This makes it possible to improve the water tightness of the case, and to reduce the sealing material of the case, to thereby reduce the material cost and man-hour cost for application of the sealing material to the case.

The internal unit is sealed in the case. That is, since the whole internal unit including the frame is sealed in the case, the sealing surface can be one in number.

Since the internal unit is fixed to the frame within the case, and the frame serves as a beam of the case as described above, the rigidity of the case can be further improved.

The frame has such a shape that at least part of the electronic components configuring the internal unit is surrounded by the frame from four sides. Hence, when the frame is made of a conductive material, it can shield electromagnetic noise emitted from the semiconductor modules. The case is often made of a conductive material, and accordingly electromagnetic noise emitted from the semiconductor modules can be shielded doubly by the frame and the case. In addition, the frame has such a shape that the at least part of the electronic components configuring the internal unit is surrounded by the frame. Hence, when the frame surrounds the electronic components, such as the semiconductor modules, which are liable to emit electromagnetic noise, and the frame is a conductor, electromagnetic noise leaking to at least the four sides surrounded by the frame can be suppressed.

In addition, in the power conversion apparatus, the internal unit, in which the electronic components and the cooler are fixed to the frame, is fixed to the frame within the case. Accordingly, when the unified fixing section is provided, and the outer shape of the case is changed depending on a mounting portion (engine compartment or the like) for the power conversion apparatus, layout inside the case is not required to be changed depending on the vehicle type. Consequently, the power conversion apparatus can be applied to a variety of vehicle types without changing the structure of the internal unit but by changing the layout of the case. Therefore the conversion apparatus having high productivity can be obtained with low manufacturing cost.

However, in the above conversion apparatus in which the case and the frame are combined, positional accuracy of the coolant introduction tube and the coolant discharge tube projecting from the case can be lowered by dimensional tolerance and combinational tolerance of the frame generated when combining the frame with the case.

To solve the above problem, in the power conversion apparatus, the thickness of the front wall section is larger than those of the side wall sections. Accordingly, accuracy of positioning the coolant introduction tube and the coolant discharge tube can be increased without increasing the frame in size and weight, whereby the power conversion apparatus can be effectively mounted on a mounting portion. That is, when mounting the power conversion apparatus on the mounting portion such as an engine compartment of a vehicle, the coolant introduction tube and the coolant discharge tube are required to be connected to coolant pipes disposed around the mounting portion. Therefore, in order to effectively mount the power conversion apparatus, the accuracy of positioning the coolant introduction tube and the coolant discharge tube to the case is required to be high. To meet this requirement, the thickness of the front wall section supporting the coolant introduction tube and the coolant discharge tube is made large. Thereby, the direction in which the coolant introduction tube and the coolant discharge tube project is accurately determined, which enables the accuracy of positioning to be high. In this case, if the wall thickness of all the portions of the frame is made large, the frame increases in size and weight. However, the wall thickness of the side wall sections, which does not directly concern the positioning of the coolant introduction tube and the coolant discharge tube, may be relatively small. Consequently, by making the wall thickness of the front wall section larger than those of the side wall sections, accuracy of positioning the coolant introduction tube and the coolant discharge tube can be increased without increasing the frame in size and weight, whereby the power conversion apparatus can be effectively mounted on a mounting portion.

As a third aspect of the embodiment, a power conversion apparatus includes: electronic components configuring a power conversion circuit; a cooler for cooling at least part of the electronic components; and a case housing the electronic components and the cooler; wherein the at least part of the electronic components and the cooler are fixed to and integrated in a frame as an internal unit, the internal unit is fixed within the case through the frame, the frame has such a shape that the at least part of the electronic components configuring the internal unit is surrounded by the frame from four sides, and includes a front wall section and a rear wall section, and a pair of side wall sections joining the front wall section and rear wall section at both ends thereof, the cooler is formed so that a coolant introduction tube and a coolant discharge tube are supported by the front wall section and projects outward from the front wall section, or so that one of the coolant introduction tube and the coolant discharge tube is supported by the front wall section and projects outward from the front wall section, and the other of the coolant introduction tube and the coolant discharge tube is supported by the rear wall section and projects outward from the rear wall section, the coolant introduction tube introducing coolant into the cooler, and the coolant discharge tube discharging the coolant from the cooler, and the thickness of one of the front wall section and the rear wall section, which supports at least one of the coolant introduction tube and the coolant discharge tube, is larger than the thicknesses of the side wall sections.

The power conversion apparatus is also capable of reducing an external force applied to its electronic components while improving the rigidity of its case, and is excellent in maintainability, can be effectively mounted, and can be manufactured at low cost. Furthermore, since the frame includes the rear wall section, the rigidity of the frame can be reliably improved.

As described above, a power conversion apparatus can be provided which is capable of reducing an external force applied to its electronic components while improving the rigidity of its case, and which is excellent in maintainability, can be effectively mounted, and can be manufactured at low cost.

The power conversion apparatus according to the embodiment is installed in an electric vehicle, a hybrid vehicle or the like, and is used to convert source power into driving power for a drive motor.

In the second aspect of the embodiment, the front wall section is preferably provided with a pair of concave portions in which the coolant introduction tube and the coolant discharge tube are respectively disposed.

In this case, accuracy of positioning the coolant introduction tube and the coolant discharge tube can be further improved.

Preferably, the front wall section contacts a front surface of the cooler at a central portion between the pair of concave portions, and a forming area of the front surface of the cooler falls within a forming area of the central portion in the height direction which is perpendicular to the direction in which the concave portions are arranged and the direction in which the coolant introduction tube and the coolant discharge tube project.

In this case, the front surface of the cooler can contact the front wall section in a state where the front surface does not protrude over the central portion of the front wall section in the height direction. Accordingly, deformation of the cooler can be prevented, thereby ensuring cooling efficiency of the semiconductor modules by the cooler. That is, if the front surface of the cooler protrudes over the central portion of the front wall section in the height direction, the cooler can be deformed at the end of the front wall section positioned in the height direction. To solve this problem, by making the forming area of the front surface of the cooler fall within the forming area of the central portion, deformation of the cooler can be prevented, thereby preventing the cooling efficiency of the semiconductor modules from being lowered.

Preferably, the coolant introduction tube and the coolant discharge tube are held by clamping members with respect to the front wall section, the front wall section has lateral adjacent portions at positions adjacent to the concave portions and at the sides of the side wall sections, and end faces of the lateral adjacent portions closer to the opening sides of the concave portions are recessed with respect to the central portion.

In this case, by fixing the clamping members to the lateral adjacent portions, the amount of protrusion of the clamping members from the front wall section in the height direction can be restricted. Consequently, the clamping members are prevented from interfering with other components, thereby facilitating miniaturization of the power conversion apparatus.

Preferably, the coolant introduction tube and the coolant discharge tube are held by damping members with respect to the front wall section, and the front wall section includes threaded holes, into which fixing screws for fixing the clamping members are respectively screwed, and engaged portions in which engaging portions for stopping turn of the clamping members are respectively engaged.

In this case, the coolant introduction tube and the coolant discharge tube can be stably fastened to the front wall section. Consequently, when the internal unit is installed in the case, displacement of the coolant introduction tube and the coolant discharge tube from the frame can be prevented.

Preferably, the frame includes a rear wall section which joins the pair of side wall sections at rear ends thereof, and surrounds the at least part of the electronic components from four sides.

In this case, the rigidity of the frame can be reliably improved.

Preferably, the internal unit includes semiconductor modules, which incorporate switching elements, as the electronic components, the cooler includes cooling tubes each having a coolant passage, the internal unit incorporates a stacked body in which the cooling tubes and the semiconductor modules are stacked alternately, the internal unit includes a pressure member for pressing the stacked body in the stacking direction, and the pressure member is interposed between the rear wall section and a rear end of the stacked body whose front end is supported by the front wall section.

In this case, the reaction force of the pressure member can be supported by the frame. Accordingly, the case is not required to have rigidity large enough to bear the reaction force of the pressure member, to increase the thickness thereof, or to include ribs. This makes it possible to make the case light in weight and less expensive.

Preferably, the rear wall section includes a rear contact surfaces which the pressure member contacts, the front wall section includes a front contact surface which the front end of the stacked body contacts, and the rear contact surface and the front contact surface are parallel to each other.

In this case, since the stacked body can be pressed straight in the stacking direction, the semiconductor modules and the cooling tubes contact each other with pressure in a state where the surfaces thereof contact each other with high parallelism. Thereby, cooling efficiency of the semiconductor modules can be improved.

The front contact surface preferably projects from the inner surface of the front wall section around thereof to the stacked body.

In this case, the frame and the stacked body can be prevented from being interfering with each other at portions other than a portion at which the stacked body and the front wall section contact each other.

The front wall section preferably includes a front outer side surface parallel to the front contact surface at the outer side surface thereof.

In this case, when the pressure member is incorporated while the stacked body in the frame is pressed to the front wall section, the front outer side surfaces can be utilized as surfaces for supporting the frame from the side opposed to the direction in which the stacked body is pressed. Since the front outer side surfaces are parallel to the front contact surface, the front outer side surfaces can receive the pressing force directly.

Preferably, the frame includes component fixing sections, which are for fixing part of the electronic components configuring the power conversion circuit, at both sides of the frame with reference to the height direction perpendicular to both the longitudinal directions of the front wall section and the rear wall section and the longitudinal directions of the side wall sections, and at least one of the component fixing sections is disposed at each of the sides of the front wall section with reference to the height direction.

In this case, more electronic components can be incorporated into the internal unit without protruding in the direction orthogonal to the height direction of the frame. In addition, since the component fixing sections are disposed at both sides of the thick front wall section with reference to the height direction, providing the component fixing sections can prevent the frame from increasing in size.

At least one of the component fixing sections is preferably disposed at each of the sides of the rear wall section with reference to the height direction.

In this case, the electronic components can be fixed to the frame within the area defined by the component fixing sections disposed on the front wall section and the component fixing sections disposed on the rear wall section. Thereby, the rigidity of the frame can be improved, and the frame can be prevented from being deformed.

The coolant introduction tube and the coolant discharge tube are provided so as to project from the case, annular packing is disposed between both the coolant introduction tube and the coolant discharge tube and the case, the annular packing sealing clearances between both the coolant introduction tube and the coolant discharge tube and the case, and the outer side surface of the front wall section has recessed surfaces, which are recessed backward, at positions opposed to the annular packing.

In this case, durability of the annular packing can be increased, while the annular packing can be accurately and easily disposed at desired positions. That is, from the viewpoint of the miniaturization of the power conversion apparatus, it is preferable that the clearance between the case and the frame is as small as possible. In this case, when the annular packing is fixed to the coolant introduction tube and the coolant discharge tube, the annular packing is pushed to the positions in the vicinity of the frame. However, if the annular packing is brought into contact with the frame, the annular packing is easily worn due to the interference with the frame. In addition, if the annular packing is brought into contact with the frame, the positions of the annular packing can be displaced due to the elastic force of the annular packing. The above problems can be solved by providing the recessed surfaces at the outer side surface of the front wall section.

Preferably, at least part of the front wall section forms an H-shaped wall section having a substantially H-shaped cross section, the H-shaped wall section being configured with a pair of longitudinal plate sections perpendicular to the stacking direction, and a connecting section connecting the pair of longitudinal plate sections together at the center of the pair of longitudinal plate sections, and the H-shaped wall section includes ribs which are orthogonal to the longitudinal plate sections and the connecting section and are partially provided between the pair of longitudinal plate sections and the connecting section.

In this case, the frame can be made light in weight, while ensuring the high rigidity of the front wall section.

The internal unit preferably includes the semiconductor modules, which incorporate switching elements, as the electronic components. In this case, an external force applied to the semiconductor modules incorporating the switching elements, which are liable to be affected by the external force, can be reduced. Hence, durability of the power conversion apparatus can be effectively improved.

Preferably, the cooler includes cooling tubes each having therein a coolant passage, and the internal unit incorporates therein a stacked body in which the cooling tubes and the semiconductor modules are stacked alternately. Since this makes it possible to assemble the stacked body outside the case, the power conversion apparatus can be assembled more easily.

The stacked body is preferably configured with the cooling tubes and the semiconductor modules stacked alternately. In this case, the semiconductor modules can be cooled efficiently, and the stacked body can be made compact in size.

The internal unit preferably includes a pressure member for pressing the stacked body in the stacking direction. The pressure member is preferably interposed between a part of the frame and one end of the stacked body in the stacking direction. The stacked body is preferably supported by another part of the frame at the other end thereof in the stacking direction. In this case, the reaction force of the pressure member can be supported by the frame. Accordingly, the case is not required to have rigidity large enough to bear the reaction force of the pressure member, to increase the thickness thereof, or to include ribs. This makes it possible to make the case light in weight and less expensive.

The frame preferably includes unit fixing sections for fixing the internal unit to the case. At least one unit fixing section is preferably located on the outside of each of a pair of support sections in the stacking direction at which the frame is applied with the reaction force toward the outside in the stacking direction applied from the stacked body and the pressure member. In this case, the frame can resist the reaction force of the stacked body and the pressure member with the aid of the case. This is because the case reinforces the frame, to thereby effectively prevent the frame from being deformed.

The frame preferably includes a front wall section and a rear wall section located on both sides of the stacked body in the stacking direction, and a pair of side wall sections joining the front and rear wall sections at both ends thereof. In this case, the stacked body can be held stably within the frame.

Thicknesses of the front wall section and the rear wall section are preferably larger than those of the side wall sections. In this case, it is possible to improve the rigidities of the front and rear wall sections receiving the reaction force of the pressure member, while reducing the weight of the side wall sections not directly receiving the reaction force of the pressure member. This makes it possible to make the frame light in weight effectively, while ensuring the frame to have rigidity large enough to resist the reaction force of the pressure member, At least part of the front wall section and the rear wall section preferably forms an H-shaped wall section having a substantially H-shaped cross section, the H-shaped wall section being configured with a pair of longitudinal plate sections perpendicular to the stacking direction, and a connecting section connecting the pair of longitudinal plate sections together at the center of the pair of longitudinal plate sections. In this case, the frame can be made light in weight, while ensuring the high rigidity of the front and rear wall sections.

Preferably, the cooling tubes have long-length shapes, and are connected to each other in the vicinity of both ends in the longitudinal directions thereof. Preferably, the semiconductor modules stacked together with the cooling tubes have the structure in which the main electrode terminals performing input/output of controlled electric power and the control terminals performing input of a control current for controlling the switching elements project toward the opposite sides and project in the height direction orthogonal to the stacking direction and the longitudinal directions of the cooling tubes. The frame is preferably open to both sides in the height direction. In this case, the bus bars, the control circuit board and the like can be easily fixed to the semiconductor modules.

The internal unit preferably includes a control circuit board on which a control circuit for controlling the switching elements is formed. In this case, since it is not necessary to fix the control circuit board directly to the case, the assembling work of the control circuit board can be facilitated, and external force applied to the control circuit boar can be reduced.

Preferably, the frame includes unit fixing sections for fixing the internal unit to the case, and the unit fixing sections are located more outward than the outer edge of the control circuit board. In this case, the internal unit can be easily fixed to the case. This is because if the is unit fixing sections are located inward of the outer edge of the control circuit board, the internal unit assembled with the control circuit board cannot be easily fixed to the case. In this case, to fix the internal unit to the case, it is necessary to drill holes penetrating the wall of the case through which bolts or the like are inserted in, for example. However, in this case, not only the workability is lowered, but also more sealing members have to be used to ensure the water tightness of the case. By locating the unit fixing sections outward of the outer edge of the control circuit board, such a problem can be removed.

Preferably, the frame is provided with board fixing sections for fixing the control circuit board to the internal unit, and the board fixing sections are located more inward than the unit fixing sections. This facilitates connecting the control circuit board to the frame, and connecting the internal unit to the case.

The internal unit preferably includes a capacitor as the electronic component.

In this case, it is possible to reduce external force applied to the capacitor. Further, it is possible to suppress vibration of the capacitor being transmitted to the outside through the case. This makes it possible to suppress unpleasant vibration noise from occurring in the vehicle cabin incorporating the power conversion apparatus due to vibration of the capacitor.

Preferably, the frame includes the unit fixing sections for fixing the internal unit to the case and the capacitor fixing sections for fixing the capacitor to the internal unit. The capacitor fixing sections are preferably located more inward than the unit fixing sections. In this case, the capacitor can be easily fixed to the frame, and the internal unit can be easily fixed to the case.

The internal unit preferably includes a terminal block on which input/output terminals for input and output of controlled electric power are mounted for making connection between the input/output terminals and terminals of external devices. In this case, since the terminal block can be fixed to the internal unit outside the case, the terminal block can be easily fixed.

Preferably, the power conversion apparatus includes bus bars provided with the input/output terminals at one ends thereof, and the frame includes the plurality of the bus bar fixing sections for fixing the bus bars. In this case, the bus bars can be stably fixed to the frame.

The power conversion apparatus preferably includes a plurality of bus bars at least two of which configures an integrated bus bar assembly by being partially molded with resin. At least two of the bus bar fixing sections, which fix the bus bar assembly to the frame, are preferably located at the position closer to the terminal block than to the center of the frame. In this case, the bus bar assembly can be stably fixed to the frame, and the input/output terminals can be stably disposed on the terminal block. As a result, a stable connection between the input/output terminals and external terminals can be ensured.

The internal unit preferably includes all the electronic components configuring the power conversion circuit. In this case, all the electronic components configuring the power conversion circuit can be protected from an external force, and the power conversion apparatus easy to manufacture and excellent in maintainability can be provided.

The frame preferably includes a wire holding section for holding a conductive wire whose at least one end is disposed within the case. In this case, the conductive wire can be laid along the frame. Accordingly, the internal unit can be prevented from being caught by the conductive wire when it is put in or taken out of the case.

It will be appreciated that the present invention is not limited to the configurations described above, but any and all modifications, variations or equivalents, which may occur to those who are skilled in the art, should be considered to fail within the scope of the present invention.

What is claimed is:

1. A power conversion apparatus comprising:
electronic components that form at least part of a power conversion circuit;
a cooler for cooling at least part of the electronic components;
a case that surrounds and encloses the electronic components and the cooler; and
a frame that is attached to an interior of the case
wherein
the at least part of the electronic components and the cooler are fixed to and integrated with the frame to form an internal unit,
the frame is formed so as to surround the at least part of the electronic components that form at least part of the internal unit, and includes at least a front wall section, and a pair of side wall sections that extend backward from both ends of the front wall section,
the cooler includes a coolant introduction tube introducing coolant into the cooler and a coolant discharge tube discharging the coolant from the cooler, the coolant introduction tube and the coolant discharge tube projecting outward from the frame while being supported by the front wall section, and the thickness of the front wall section is larger than the thickness of the side wall section.

2. The power conversion apparatus according to claim 1, wherein the front wall section is provided with a pair of tube concave portions in which the coolant introduction tube and the coolant discharge tube are respectively disposed.

3. The power conversion apparatus according to claim 2, wherein the front wall section contacts a front surface of the cooler at a central portion between the pair of tube concave portions, and a forming area of the front surface of the cooler falls within a forming area of the central portion in the height direction which is perpendicular to the direction in which the pair of tube concave portions are arranged and the direction in which the coolant introduction tube and the coolant discharge tube project.

4. The power conversion apparatus according to claim 3, wherein
the coolant introduction tube and the coolant discharge tube are held by clamping members with respect to the front wall section,
the front wall section has lateral adjacent portions at positions adjacent to the pair of tube concave portions and at the sides of the side wall sections, and
end faces of the lateral adjacent portions closer to the opening sides of the tube concave portions are recessed with respect to the central portion.

5. The power conversion apparatus according to claim 1, wherein
the coolant introduction tube and the coolant discharge tube are held by clamping members with respect to the front wall section, and
the front wall section includes threaded holes, into which fixing screws for fixing the clamping members are screwed, and engaged portions in which engaging portions for stopping turn of the clamping members are engaged.

6. The power conversion apparatus according to claim 1, wherein the frame includes a rear wall section which joins the pair of side wall sections at rear ends thereof, and surrounds the at least part of the electronic components configuring the internal unit from four sides.

7. The power conversion apparatus according to claim 6, wherein
the internal unit includes semiconductor modules, which incorporate switching elements, as the electronic components,
the cooler includes cooling tubes each having therein a coolant passage,
the internal unit incorporates a stacked body in which the cooling tubes and the semiconductor modules are stacked alternately,
the internal unit includes a pressure member pressing the stacked body in the stacking direction, and
the pressure member is interposed between the rear wall section and a rear end in the stacked direction of the stacked body, and a front end in the stacked direction of the stacked body is supported by the front wall section.

8. The power conversion apparatus according to claim 7, wherein
the rear wall section includes a planar rear contact surface which the pressure member contacts,
the front wall section includes a planar front contact surface which the front end in the stacked direction of the stacked body contacts, and
the rear contact surface and the front contact surface are parallel to each other.

9. The power conversion apparatus according to claim 8, wherein the front contact surface projects from the inner surface of the front wall section around therearound to the stacked body.

10. The power conversion apparatus according to claim 8, wherein the front wall section includes a front outer side surface parallel to the front contact surface at the outer side surface thereof.

11. The power conversion apparatus according to claim 1, wherein
the frame is configured by providing component fixing sections, that fix part of the electronic components configuring the power conversion circuit, at both sides in the height direction perpendicular to both the longitudinal directions of the front wall section and the rear wall section and the longitudinal directions of the side wall sections, and
at least one of the component fixing sections is disposed at each of the sides in the height direction of the front wall section.

12. The power conversion apparatus according to claim 11, wherein at least one of the component fixing sections is disposed at each of the sides in the height direction of the rear wall section.

13. The power conversion apparatus according to claim 1, wherein
the coolant introduction tube and the coolant discharge tube are provided so as to project from the case,
annular packing is disposed between both the coolant introduction tube and the coolant discharge tube and the case, the annular packing sealing clearances between both the coolant introduction tube and the coolant discharge tube and the case, and
the outer side surface of the front wall section has recessed surfaces, which are recessed backward, at positions opposed to the annular packing.

14. The power conversion apparatus according to claim 1, wherein
at least part of the front wall section is formed by an H-shaped wall section having a substantially H-shaped cross section, the H-shaped wall section being configured with a pair of longitudinal plate sections perpendicular to the stacking direction, and a connecting section connecting the pair of longitudinal plate sections together at the center of the pair of longitudinal plate sections, and
the H-shaped wall section is configured by partially providing ribs which are orthogonal to the longitudinal plate sections and the connecting section, between the pair of longitudinal plate sections and the connecting section.

15. A power conversion apparatus comprising:
electronic components that form at least part of a power conversion circuit;
a cooler for cooling at least part of the electronic components; and
a case housing the electronic components and the cooler; wherein
the at least part of the electronic components and the cooler are fixed to and integrated in a frame to form one internal unit,
the internal unit is fixed within the case through the frame,
the frame is formed so as to surround the at least part of the electronic components that form at least part of the internal unit, and includes at least a front wall section, and a pair of side wall sections that extend backward from both ends of the front wall section, the cooler includes a coolant introduction tube introducing coolant into the cooler and a coolant discharge tube discharging the coolant from the cooler, the coolant introduction tube and the coolant discharge tube projecting outward from the frame while being supported by the front wall section, the thickness of the front wall section is larger than the thickness of the side wall section, and the front wall section is provided with a pair of tube concave portions in which the coolant introduction tube and the coolant discharge tube are respectively disposed.

16. The power conversion apparatus according to claim 15, wherein the front wall section contacts a front surface of the cooler at a central portion between the pair of tube concave portions, and a forming area of the front surface of the cooler falls within a forming area of the central portion in the height direction which is perpendicular to the direction in which the pair of tube concave portions are arranged and the direction in which the coolant introduction tube and the coolant discharge tube project.

17. The power conversion apparatus according to claim 16, wherein:

the coolant introduction tube and the coolant discharge tube are held by clamping members with respect to the front wall section, the front wall section has lateral adjacent portions at positions adjacent to the pair of tube concave portions and at the sides of the side wall sections, and end faces of the lateral adjacent portions closer to the opening sides of the tube concave portions are recessed with respect to the central portion.

18. A power conversion apparatus comprising:
electronic components that form at least part of a power conversion circuit;
a cooler for cooling at least part of the electronic components; and
a case housing the electronic components and the cooler; wherein
the at least part of the electronic components and the cooler are fixed to and integrated in a frame to form one internal unit,
the internal unit is fixed within the case through the frame,
the frame is formed so as to surround the at least part of the electronic components that form at least part of the internal unit, and includes at least a front wall section, and a pair of side wall sections that extend backward from both ends of the front wall section,
the cooler includes a coolant introduction tube introducing coolant into the cooler and a coolant discharge tube discharging the coolant from the cooler, the coolant introduction tube and the coolant discharge tube projecting outward from the frame while being supported by the front wall section,
the thickness of the front wall section is larger than the thickness of the side wall section,
the coolant introduction tube and the coolant discharge tube are held by clamping members with respect to the front wall section, and
the front wall section includes threaded holes, into which fixing screws for fixing the clamping members are screwed, and engaged portions in which engaging portions for stopping turn of the clamping members are engaged.

19. A power conversion apparatus comprising:
electronic components that form at least part of a power conversion circuit;
a cooler for cooling at least part of the electronic components; and
a case housing the electronic components and the cooler; wherein
the at least part of the electronic components and the cooler are fixed to and integrated in a frame to form one internal unit,
the internal unit is fixed within the case through the frame,
the frame is formed so as to surround the at least part of the electronic components that form at least part of the internal unit, and includes at least a front wall section, and a pair of side wall sections that extend backward from both ends of the front wall section,
the cooler includes a coolant introduction tube introducing coolant into the cooler and a coolant discharge tube discharging the coolant from the cooler, the coolant introduction tube and the coolant discharge tube projecting outward from the frame while being supported by the front wall section,
the thickness of the front wall section is larger than the thickness of the side wall section,
the frame includes a rear wall section which joins the pair of side wall sections at rear ends thereof, and surrounds the at least part of the electronic components configuring the internal unit from four sides,
the internal unit includes semiconductor modules, which incorporate switching elements, as the electronic components,
the cooler includes cooling tubes each having therein a coolant passage,
the internal unit incorporates a stacked body in which the cooling tubes and the semiconductor modules are stacked alternately,
the internal unit includes a pressure member pressing the stacked body in the stacking direction, and
the pressure member is interposed between the rear wall section and a rear end in the stacked direction of the stacked body, and a front end in the stacked direction of the stacked body is supported by the front wall section.

20. The power conversion apparatus according to claim 19, wherein
the rear wall section includes a planar rear contact surface which the pressure member contacts,
the front wall section includes a planar front contact surface which the front end in the stacked direction of the stacked body contacts, and
the rear contact surface and the front contact surface are parallel to each other.

21. The power conversion apparatus according to claim 20, wherein the front contact surface projects from the inner surface of the front wall section therearound to the stacked body.

22. The power conversion apparatus according to claim 20, wherein the front wall section includes a front outer side surface parallel to the front contact surface at the outer side surface thereof.

23. A power conversion apparatus comprising:
electronic components that form at least part of a power conversion circuit;
a cooler for cooling at least part of the electronic components; and
a case housing the electronic components and the cooler;

wherein
- the at least part of the electronic components and the cooler are fixed to and integrated in a frame to form one internal unit,
- the internal unit is fixed within the case through the frame,
- the frame is formed so as to surround the at least part of the electronic components that form at least part of the internal unit, and includes at least a front wall section, and a pair of side wall sections that extend backward from both ends of the front wall section,
- the cooler includes a coolant introduction tube introducing coolant into the cooler and a coolant discharge tube discharging the coolant from the cooler, the coolant introduction tube and the coolant discharge tube projecting outward from the frame while being supported by the front wall section,
- the thickness of the front wall section is larger than the thickness of the side wall section,
- at least part of the front wall section is formed by an H-shaped wall section having a substantially H-shaped cross section, the H-shaped wall section being configured with a pair of longitudinal plate sections perpendicular to the stacking direction, and a connecting section connecting the pair of longitudinal plate sections together at the center of the pair of longitudinal plate sections, and the H-shaped wall section is configured by partially providing ribs which are orthogonal to the longitudinal plate sections and the connecting section, between the pair of longitudinal plate sections and the connecting section.

\* \* \* \* \*